United States Patent
Son et al.

(10) Patent No.: US 11,404,429 B2
(45) Date of Patent: *Aug. 2, 2022

(54) THREE-DIMENSIONAL SEMICONDUCTOR MEMORY DEVICES

(71) Applicant: Samsung Electronics Co., Ltd., Suwon-si (KR)

(72) Inventors: Younghwan Son, Hwaseong-si (KR); Jeehoon Han, Hwaseong-si (KR)

(73) Assignee: Samsung Electronics Co., Ltd.

( * ) Notice: Subject to any disclaimer, the term of this patent is extended or adjusted under 35 U.S.C. 154(b) by 146 days.

This patent is subject to a terminal disclaimer.

(21) Appl. No.: 16/528,724

(22) Filed: Aug. 1, 2019

(65) Prior Publication Data

US 2020/0203370 A1  Jun. 25, 2020

(30) Foreign Application Priority Data

Dec. 21, 2018  (KR) ........................ 10-2018-0167569

(51) Int. Cl.
| | |
|---|---|
| *H01L 27/11582* | (2017.01) |
| *H01L 29/417* | (2006.01) |
| *H01L 27/11568* | (2017.01) |
| *H01L 27/11578* | (2017.01) |
| *H01L 27/11597* | (2017.01) |
| *H01L 27/11551* | (2017.01) |
| *H01L 29/423* | (2006.01) |
| *H01L 27/28* | (2006.01) |

(52) U.S. Cl.
CPC .. *H01L 27/11582* (2013.01); *H01L 27/11551* (2013.01); *H01L 27/11568* (2013.01); *H01L 27/11578* (2013.01); *H01L 27/11597* (2013.01); *H01L 29/41741* (2013.01); *H01L 29/42344* (2013.01); *H01L 27/281* (2013.01)

(58) Field of Classification Search
CPC ......... H01L 27/11521; H01L 27/11556; H01L 27/11565; H01L 27/1157; H01L 27/11578; H01L 27/1158; H01L 27/11582; H01L 29/41741; H01L 29/42344; H01L 29/42352
See application file for complete search history.

(56) References Cited

U.S. PATENT DOCUMENTS

| | | | |
|---|---|---|---|
| 9,362,306 B2 | 6/2016 | Park et al. | |
| 9,576,967 B1 | 2/2017 | Kimura et al. | |
| 9,634,024 B2 * | 4/2017 | Kanamori | ......... H01L 27/11582 |
| 9,679,906 B2 * | 6/2017 | Lu | ...................... H01L 27/11582 |
| 9,728,547 B1 * | 8/2017 | Ohsaki | .................... H01L 28/00 |
| 9,786,673 B1 * | 10/2017 | Cho | .................. H01L 27/11582 |
| 9,786,676 B2 | 10/2017 | Yun et al. | |
| 9,859,363 B2 * | 1/2018 | Lu | ...................... H01L 27/11556 |

(Continued)

*Primary Examiner* — Maliheh Malek
(74) *Attorney, Agent, or Firm* — Myers Bigel, P.A.

(57) ABSTRACT

Three-dimensional (3D) semiconductor memory devices are provided. A 3D semiconductor memory device includes an electrode structure on a substrate. The electrode structure includes gate electrodes stacked on the substrate. The gate electrodes include electrode pad regions. The 3D semiconductor memory device includes a dummy vertical structure penetrating one of the electrode pad regions. The dummy vertical structure includes a dummy vertical semiconductor pattern and a contact pattern extending from a portion of the dummy vertical semiconductor pattern toward the substrate.

20 Claims, 45 Drawing Sheets

(56) References Cited

U.S. PATENT DOCUMENTS

| | | | |
|---|---|---|---|
| 9,917,093 B2* | 3/2018 | Chu | H01L 27/11575 |
| 9,978,766 B1 | 5/2018 | Hosoda et al. | |
| 9,985,098 B2 | 5/2018 | Matsumoto et al. | |
| 10,062,707 B2 | 8/2018 | Lee | |
| 10,347,654 B1* | 7/2019 | Iwai | H01L 27/11519 |
| 10,665,607 B1* | 5/2020 | Sugiura | H01L 23/5226 |
| 10,741,577 B2* | 8/2020 | Lee | H01L 27/11568 |
| 10,777,565 B2* | 9/2020 | Jung | H01L 27/11519 |
| 10,777,572 B2* | 9/2020 | Jung | H01L 27/11529 |
| 10,804,363 B2* | 10/2020 | Hwang | H01L 29/41741 |
| 10,818,687 B2* | 10/2020 | Kim | H01L 27/11526 |
| 10,903,230 B2* | 1/2021 | Kaminaga | H01L 23/5226 |
| 10,903,231 B2* | 1/2021 | Lee | H01L 27/11556 |
| 10,937,800 B2* | 3/2021 | Kim | H01L 21/76224 |
| 10,950,619 B2* | 3/2021 | Jung | H01L 27/11582 |
| 10,964,714 B2* | 3/2021 | Lim | H01L 27/11573 |
| 10,964,720 B2* | 3/2021 | Kim | H01L 27/1157 |
| 10,971,507 B2* | 4/2021 | Kaminaga | H01L 21/30608 |
| 11,063,057 B2* | 7/2021 | Jung | H01L 27/11582 |
| 11,069,707 B2* | 7/2021 | Tanabe | H01L 27/0207 |
| 11,164,886 B2* | 11/2021 | Baek | H01L 23/5283 |
| 2009/0242967 A1* | 10/2009 | Katsumata | H01L 27/11575 257/324 |
| 2010/0181610 A1* | 7/2010 | Kim | H01L 27/11582 257/314 |
| 2012/0001250 A1* | 1/2012 | Alsmeier | H01L 27/11551 257/319 |
| 2014/0339621 A1* | 11/2014 | Simsek-Ege | H01L 27/11556 257/316 |
| 2016/0086969 A1* | 3/2016 | Zhang | H01L 21/02365 257/314 |
| 2016/0163732 A1* | 6/2016 | Lim | H01L 23/528 257/314 |
| 2016/0218059 A1* | 7/2016 | Nakada | H01L 27/11582 |
| 2016/0276353 A1* | 9/2016 | Kobayashi | H01L 27/11582 |
| 2017/0047334 A1* | 2/2017 | Lu | H01L 27/11575 |
| 2017/0207226 A1* | 7/2017 | Lee | H01L 23/5283 |
| 2017/0236896 A1* | 8/2017 | Lu | H01L 27/11582 257/314 |
| 2017/0373078 A1* | 12/2017 | Chu | H01L 27/1157 |
| 2017/0373087 A1* | 12/2017 | Ito | H01L 27/11573 |
| 2017/0373089 A1* | 12/2017 | Kim | H01L 27/11582 |
| 2018/0006052 A1* | 1/2018 | Hwang | H01L 21/76843 |
| 2018/0076217 A1* | 3/2018 | Park | H01L 21/31144 |
| 2018/0151672 A1 | 5/2018 | Choi et al. | |
| 2018/0175050 A1 | 6/2018 | Son et al. | |
| 2018/0190668 A1 | 7/2018 | Kim et al. | |
| 2018/0197876 A1 | 7/2018 | Ge et al. | |
| 2018/0261616 A1* | 9/2018 | Cho | H01L 27/11578 |
| 2019/0035807 A1* | 1/2019 | Kim | H01L 27/11548 |
| 2019/0057898 A1* | 2/2019 | Shim | H01L 27/11529 |
| 2019/0244970 A1* | 8/2019 | Jung | H01L 27/11573 |
| 2019/0326315 A1* | 10/2019 | Lee | H01L 27/11575 |
| 2019/0326317 A1* | 10/2019 | Jung | H01L 27/11565 |
| 2019/0333922 A1* | 10/2019 | Jung | H01L 27/11524 |
| 2019/0333931 A1* | 10/2019 | Jung | H01L 27/11524 |
| 2019/0355741 A1* | 11/2019 | Lee | H01L 27/1157 |
| 2019/0393238 A1* | 12/2019 | Lim | H01L 27/11582 |
| 2020/0144380 A1* | 5/2020 | Hwang | H01L 27/11565 |
| 2020/0203370 A1* | 6/2020 | Son | H01L 27/11582 |
| 2020/0328227 A1* | 10/2020 | Kang | H01L 29/42364 |
| 2020/0350330 A1* | 11/2020 | Ahn | H01L 27/11556 |
| 2020/0365560 A1* | 11/2020 | Kanamori | H01L 24/80 |
| 2020/0365616 A1* | 11/2020 | Baek | H01L 23/5283 |
| 2020/0388634 A1* | 12/2020 | Jung | H01L 23/53271 |
| 2021/0005627 A1* | 1/2021 | Hinoue | H01L 27/11519 |
| 2021/0036010 A1* | 2/2021 | Sim | H01L 27/11565 |
| 2021/0066344 A1* | 3/2021 | Son | H01L 23/5226 |
| 2021/0066345 A1* | 3/2021 | Son | H01L 27/11582 |
| 2021/0074719 A1* | 3/2021 | Lee | H01L 27/11556 |
| 2021/0074720 A1* | 3/2021 | Son | H01L 27/11582 |
| 2021/0074724 A1* | 3/2021 | Kim | H01L 27/11556 |
| 2021/0098483 A1* | 4/2021 | Kang | H01L 27/11575 |
| 2021/0118903 A1* | 4/2021 | Yun | H01L 27/11565 |
| 2021/0118907 A1* | 4/2021 | Lee | H01L 29/42344 |
| 2021/0126008 A1* | 4/2021 | Tanabe | H01L 27/0207 |
| 2021/0143160 A1* | 5/2021 | Ryu | H01L 27/11582 |
| 2021/0143176 A1* | 5/2021 | Yun | H01L 27/11556 |
| 2021/0151460 A1* | 5/2021 | Kim | H01L 27/11526 |
| 2021/0159242 A1* | 5/2021 | Jang | H01L 21/76805 |
| 2021/0193672 A1* | 6/2021 | Kim | H01L 27/11548 |
| 2021/0217765 A1* | 7/2021 | Kim | G11C 8/08 |
| 2021/0233928 A1* | 7/2021 | Lee | H01L 27/11573 |
| 2021/0242237 A1* | 8/2021 | Lim | H01L 23/5226 |
| 2021/0313341 A1* | 10/2021 | Kang | H01L 23/528 |
| 2021/0327892 A1* | 10/2021 | Jung | H01L 27/11524 |
| 2021/0335810 A1* | 10/2021 | Sanghoon | H01L 27/11565 |
| 2021/0358935 A1* | 11/2021 | Jung | G11C 7/18 |

\* cited by examiner

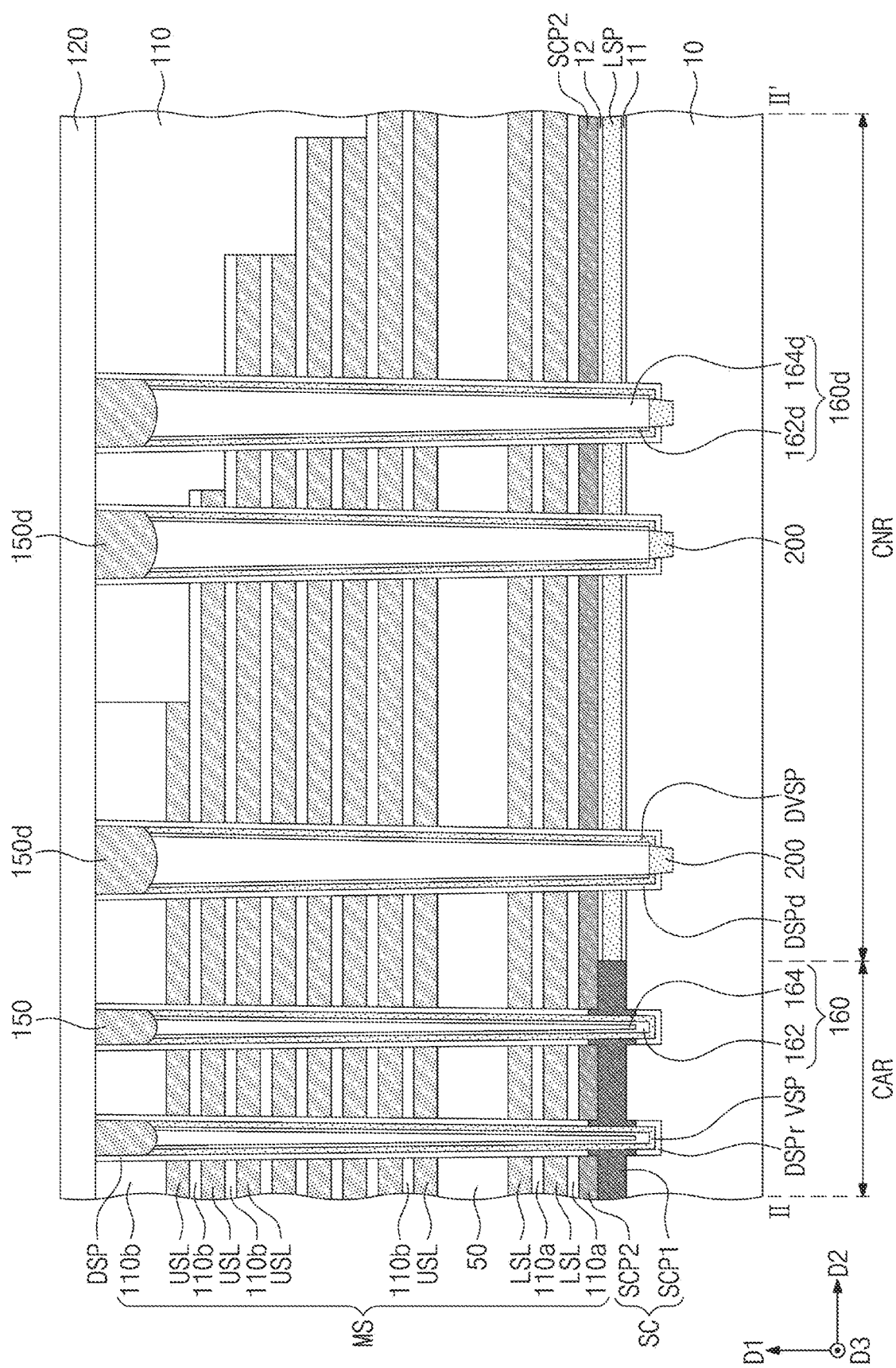

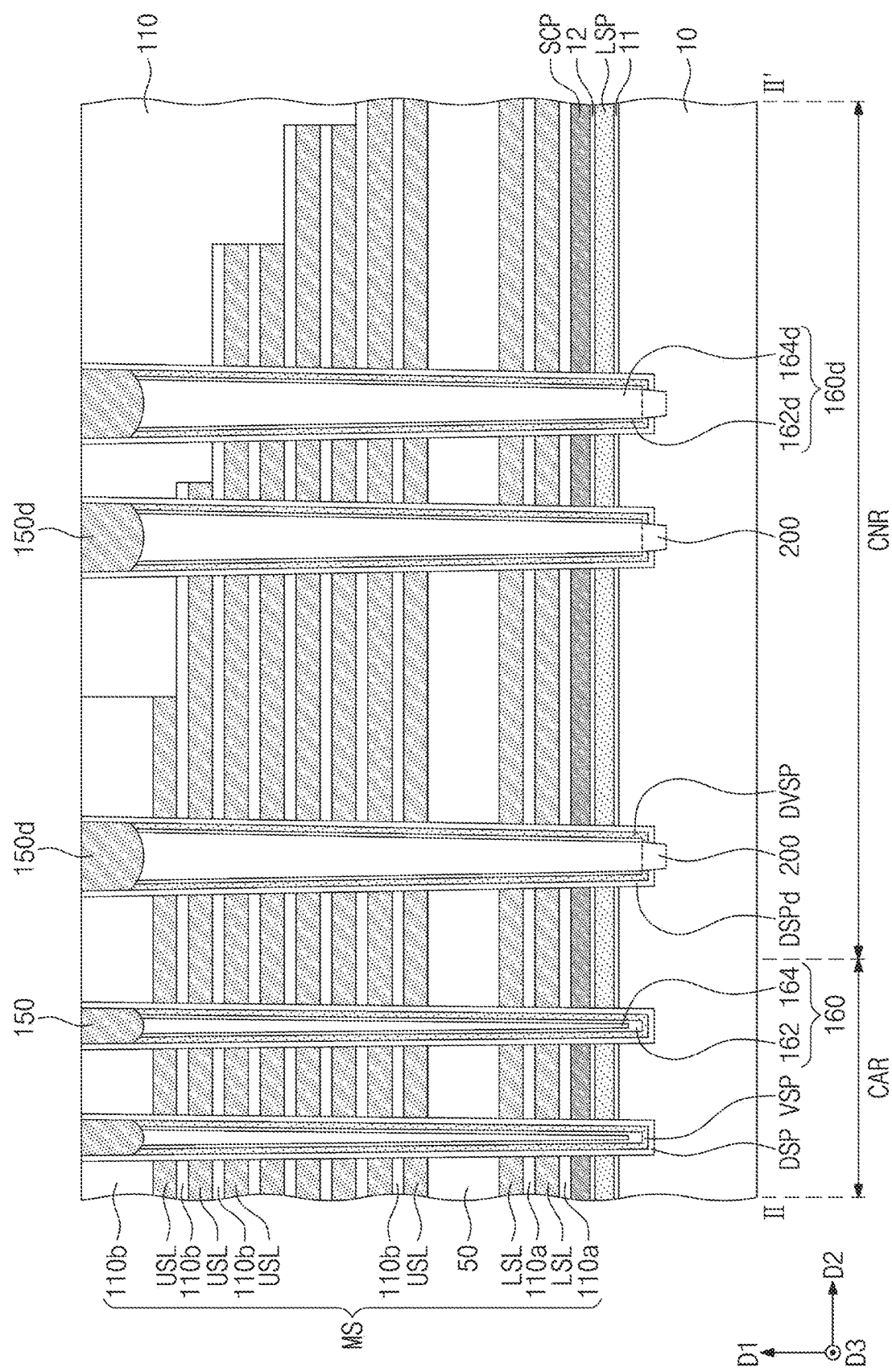

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2018-0167569, filed on Dec. 21, 2018, in the Korean Intellectual Property Office, the disclosure of which is hereby incorporated by reference in its entirety.

BACKGROUND

Embodiments of the inventive concepts relate to semiconductor memory devices and, more particularly, to three-dimensional (3D) semiconductor memory devices having three-dimensionally arranged memory cells.

Semiconductor devices have been highly integrated to provide excellent performance and low manufacturing costs. The integration density of semiconductor devices directly affects the costs of the semiconductor devices, thereby resulting in demand for highly integrated semiconductor devices. The integration density of typical two-dimensional (2D) or planar semiconductor devices may be mainly determined by an area where a unit memory cell occupies. Therefore, the integration density of the typical 2D or planar semiconductor devices may be greatly affected by a technique of forming fine patterns. However, since extremely high-priced apparatuses are needed to form fine patterns, the integration density of 2D semiconductor devices continues to increase but is still limited. Three-dimensional (3D) semiconductor devices including three-dimensionally arranged memory cells have been developed to overcome these limitations.

SUMMARY

Embodiments of the inventive concepts may provide three-dimensional (3D) semiconductor memory devices capable of improving a pattern profile.

Embodiments of the inventive concepts may also provide 3D semiconductor memory devices capable of improving reliability.

In some embodiments, a 3D semiconductor memory device may include a substrate, and an electrode structure on the substrate. The electrode structure may include gate electrodes stacked in a direction vertical to a top surface of the substrate. The gate electrodes may include electrode pad regions. Moreover, the 3D semiconductor memory device may include a dummy vertical structure penetrating one of the electrode pad regions. The dummy vertical structure may include: a dummy vertical semiconductor pattern extending substantially in the direction; and a contact pattern extending from a portion of the dummy vertical semiconductor pattern toward the substrate.

In some embodiments, a 3D semiconductor memory device may include a substrate including a cell array region and a connection region. The 3D semiconductor memory device may include an electrode structure on the substrate. The electrode structure may include gate electrodes stacked in a direction vertical to a top surface of the substrate. The gate electrodes may include electrode pad regions on the connection region. The 3D semiconductor memory device may include a vertical semiconductor pattern penetrating the electrode structure on the cell array region. The 3D semiconductor memory device may include a dummy vertical semiconductor pattern penetrating one of the electrode pad regions on the connection region. Moreover, the 3D semiconductor memory device may include a contact pattern extending from a portion of the dummy vertical semiconductor pattern into the substrate.

In some embodiments, a 3D semiconductor memory device may include a substrate, and an electrode structure on the substrate. The electrode structure may include gate electrodes stacked in a direction vertical to a top surface of the substrate. The gate electrodes may include electrode pad regions. The 3D semiconductor memory device may include a source conductive pattern between the substrate and the electrode structure. The 3D semiconductor memory device may include a dummy vertical semiconductor pattern that penetrates one of the electrode pad regions, penetrates the source conductive pattern under the one of the electrode pad regions, and extends into the substrate. The 3D semiconductor memory device may include a dummy data storage pattern between the dummy vertical semiconductor pattern and the substrate. Moreover, the 3D semiconductor memory device may include a contact pattern penetrating a bottom portion of the dummy data storage pattern to electrically connect to the substrate.

BRIEF DESCRIPTION OF THE DRAWINGS

The inventive concepts will become more apparent in view of the attached drawings and accompanying detailed description.

FIGS. 10B, 11B, 12B, 13B, 14B, 15B, 16B, 17B, 18B, 19B, 20B, 21B, 22B, 23B, and 24B are cross-sectional views corresponding to the line II-II' of FIG. 2 to illustrate a method of manufacturing a 3D semiconductor memory device, according to some embodiments of the inventive concepts.

FIG. 25 is a cross-sectional view corresponding to the line II-II' of FIG. 2 to illustrate a method of manufacturing a 3D semiconductor memory device, according to some embodiments of the inventive concepts.

DETAILED DESCRIPTION

Hereinafter, embodiments of the inventive concepts will be described in detail with reference to the accompanying drawings.

Figure 1:
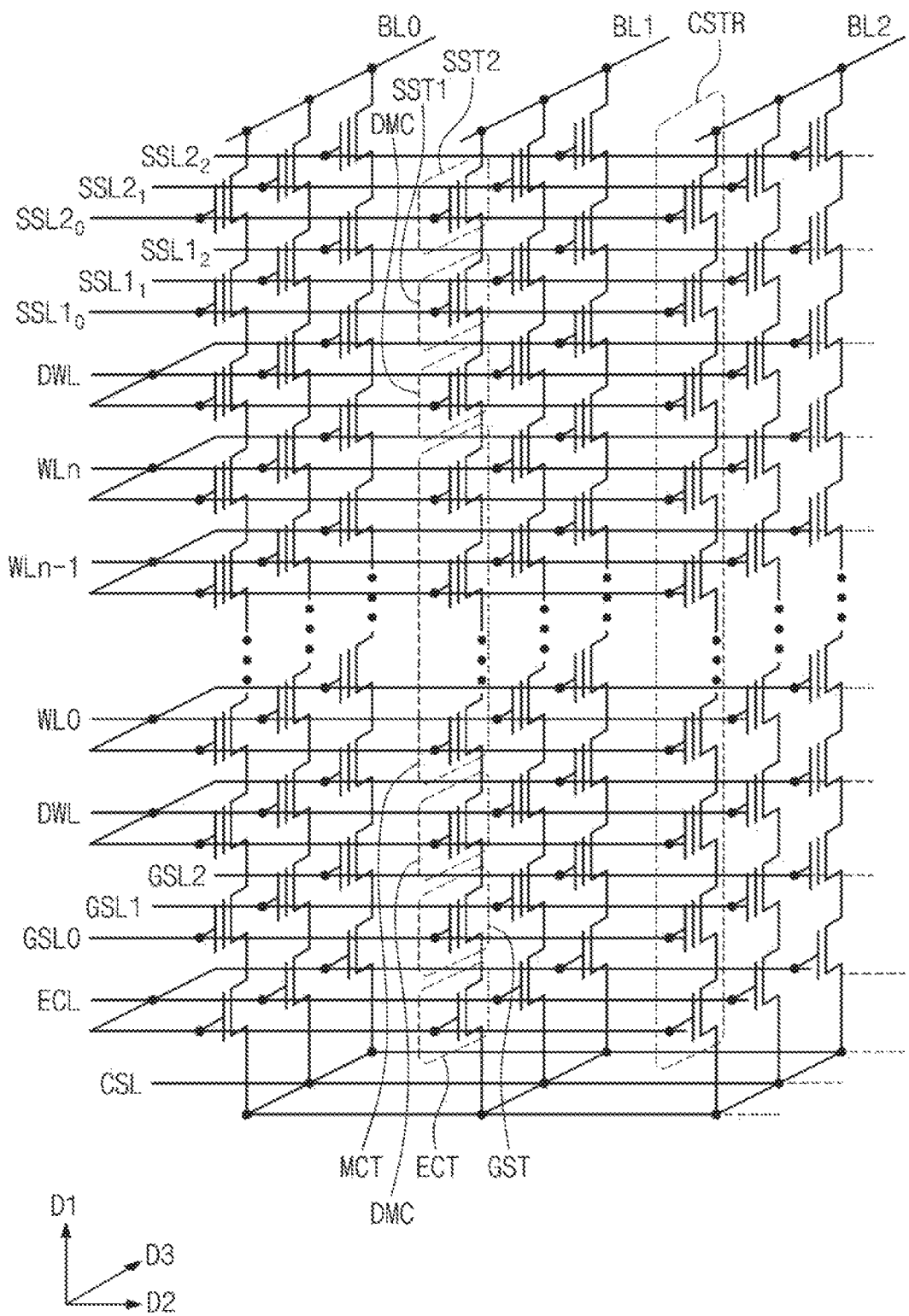
FIG. 1 is a schematic circuit diagram illustrating a cell array of a three-dimensional (3D) semiconductor memory device according to some embodiments of the inventive concepts.

FIG. 1 is a schematic circuit diagram illustrating a cell array of a three-dimensional (3D) semiconductor memory device according to some embodiments of the inventive concepts.

Referring to FIG. 1, a cell array of a 3D semiconductor memory device according to some embodiments may include a common source line CSL, a plurality of bit lines BL0 to BL2, and a plurality of cell strings CSTR connected between the common source line CSL and the bit lines BL0 to BL2. A plurality of the cell strings CSTR may be connected in parallel to each of the bit lines BL0 to BL2. The cell strings CSTR may be connected in common to the common source line CSL. Each of the cell strings CSTR may include string selection transistors SST1 and SST2, memory cell transistors MCT, a ground selection transistor GST, and an erase control transistor ECT, which are connected in series to each other. Each of the memory cell transistors MCT may include a data storage element. In some embodiments, each of the cell strings CSTR may include first and second string selection transistors SST1 and SST2 connected in series to each other, and the second string selection transistor SST2 may be connected to a corresponding one of the bit lines BL0 to BL2. Alternatively, each of the cell strings CSTR may include a single string selection transistor.

The memory cell transistors MCT may be connected in series between the first string selection transistor SST1 and the ground selection transistor GST. The erase control transistor ECT of each of the cell strings CSTR may be connected between the ground selection transistor GST and the common source line CSL. In some embodiments, each of the cell strings CSTR may further include dummy cells DMC which are connected between the first string selection transistor SST1 and an uppermost one of the memory cell transistors MCT and between the ground selection transistor GST and a lowermost one of the memory cell transistors MCT, respectively. The first string selection transistor SST1 may be controlled by a first string selection line SSL1 (e.g., $SSL1_0$), and the second string selection transistor SST2 may be controlled by a second string selection line SSL2 (e.g., $SSL2_0$). The memory cell transistors MCT may be controlled by word lines WL0 to WLn, respectively, and the dummy cells DMC may be controlled by dummy word lines DWL, respectively. In addition, the ground selection transistor GST may be controlled by a ground selection line GSL (e.g., GSL0, GSL1, or GSL2), and the erase control transistor ECT may be controlled by an erase control line ECL. The common source line CSL may be connected in common to sources of the erase control transistors ECT. The erase control transistors ECT of the cell strings CSTR different from each other may be controlled in common by the erase control line ECL. The erase control transistors ECT may generate a gate induced drain leakage (GIDL) in an erase operation of the cell array.

Figure 2:
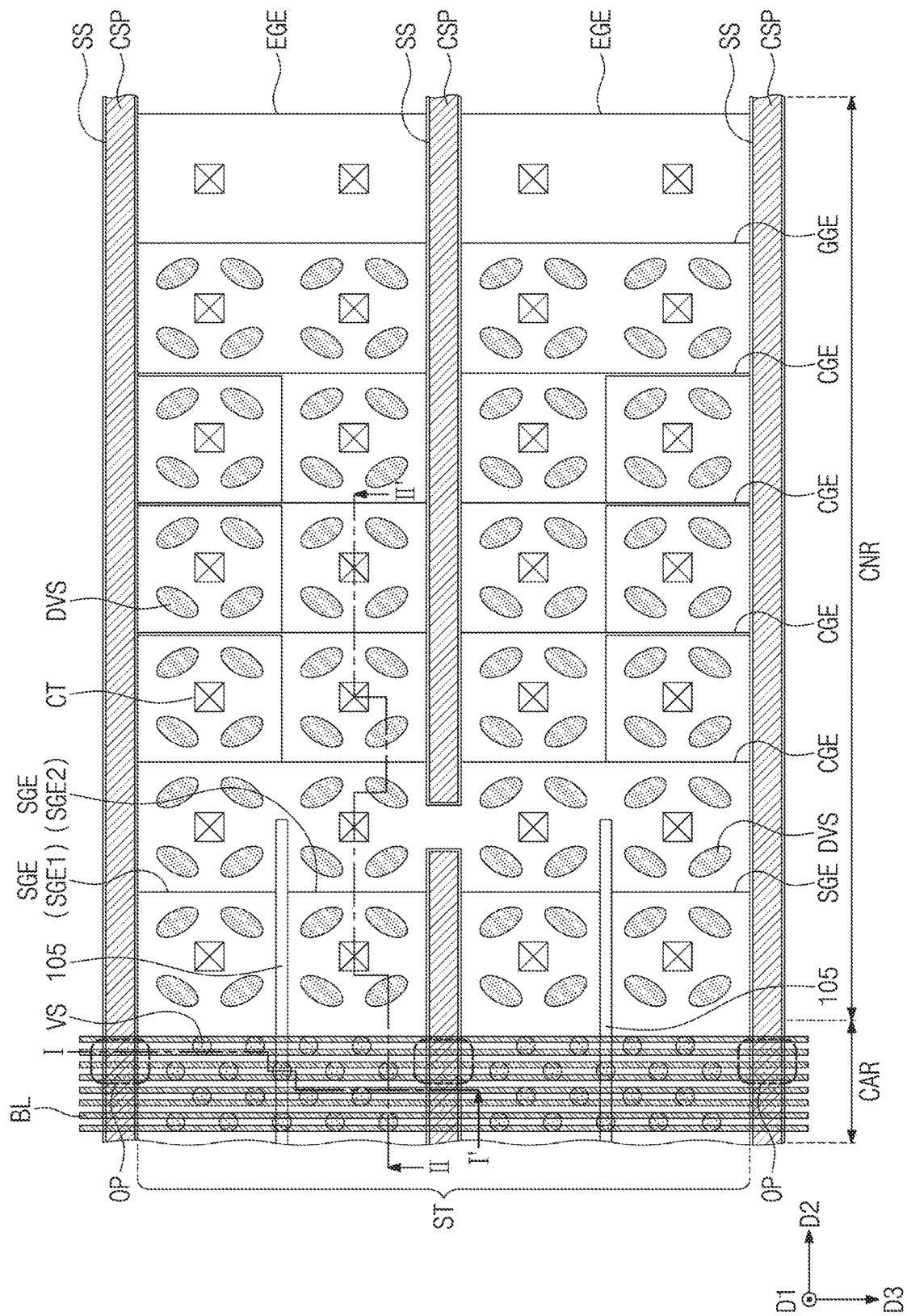
FIG. 2 is a plan view illustrating a 3D semiconductor memory device according to some embodiments of the inventive concepts.
Figure 3:
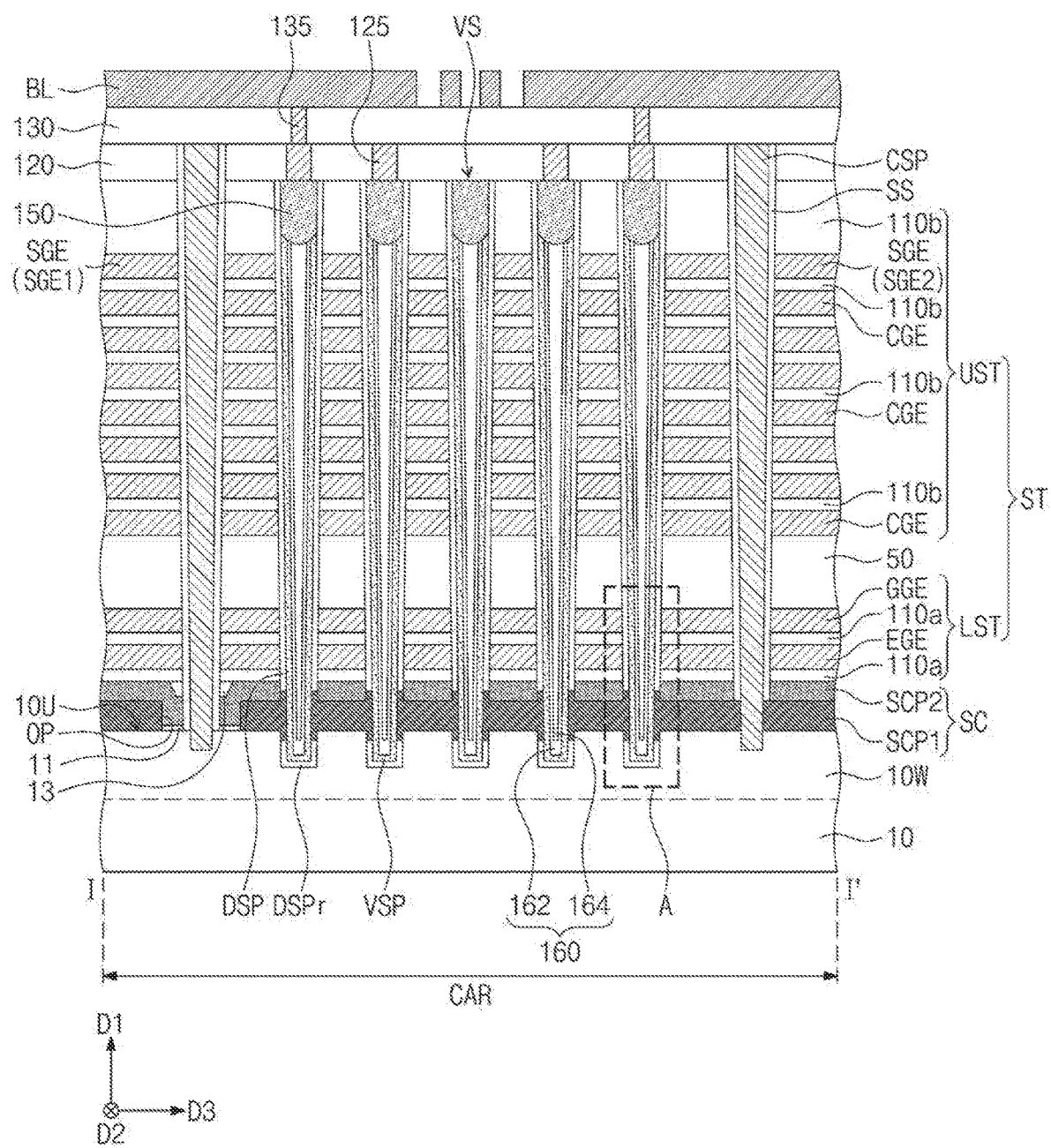
FIGS. 3 and 4 are cross-sectional views taken along lines I-I' and II-II' of FIG. 2, respectively.
Figure 4:
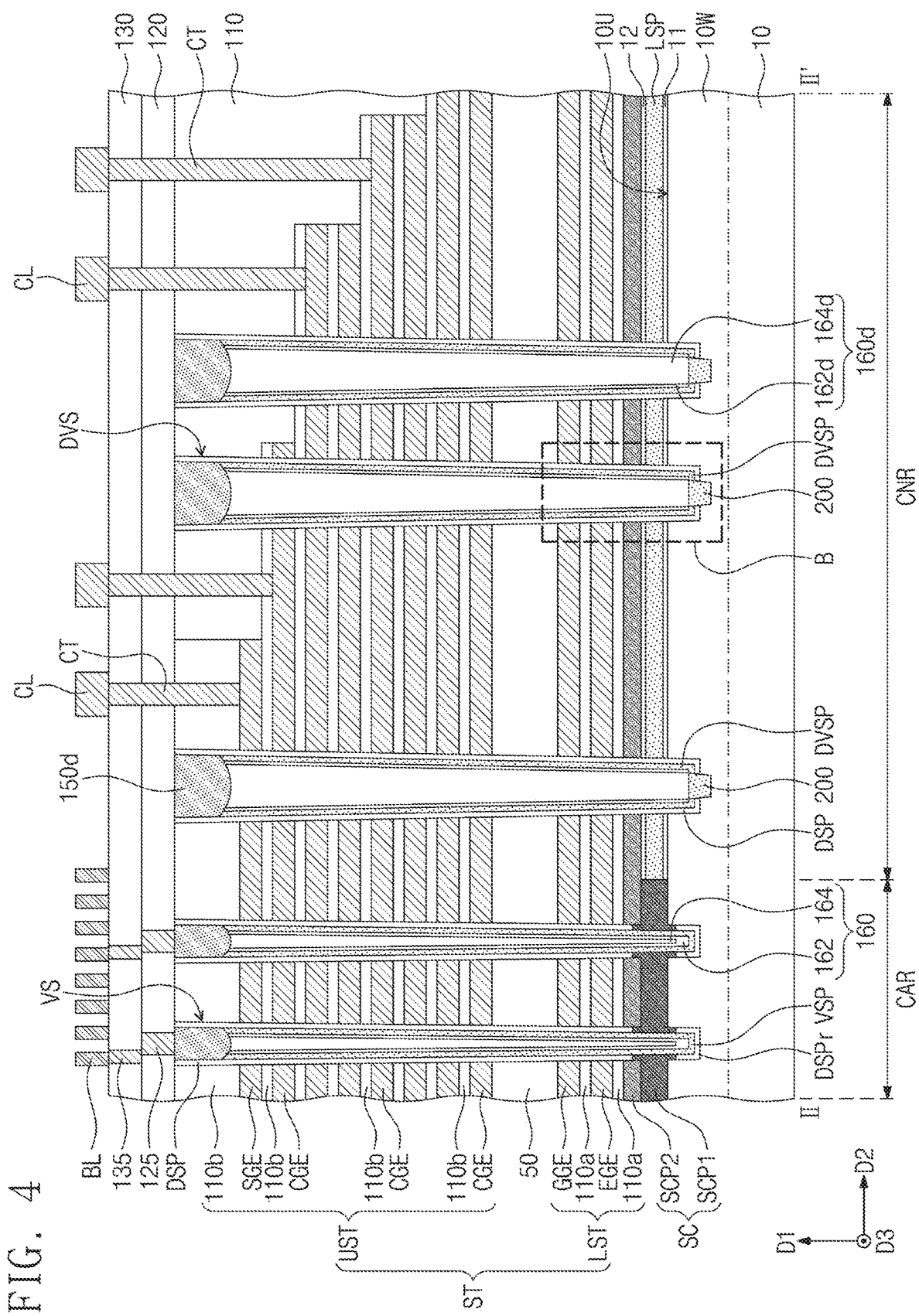
Figure 5:
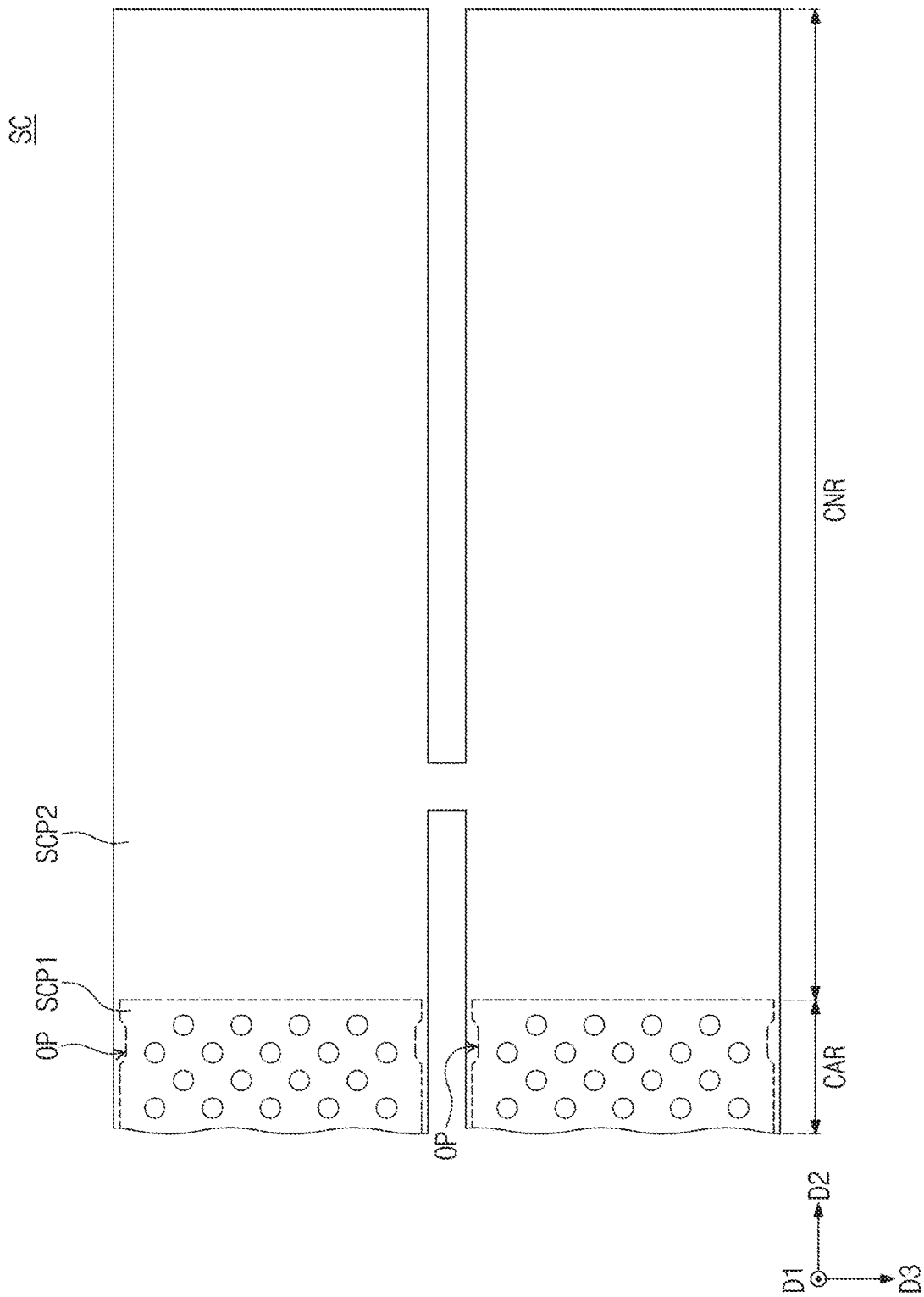
FIGS. 5, 6 and 7 are plan views illustrating a source structure and gate electrodes of FIGS. 3 and 4.
Figure 6:
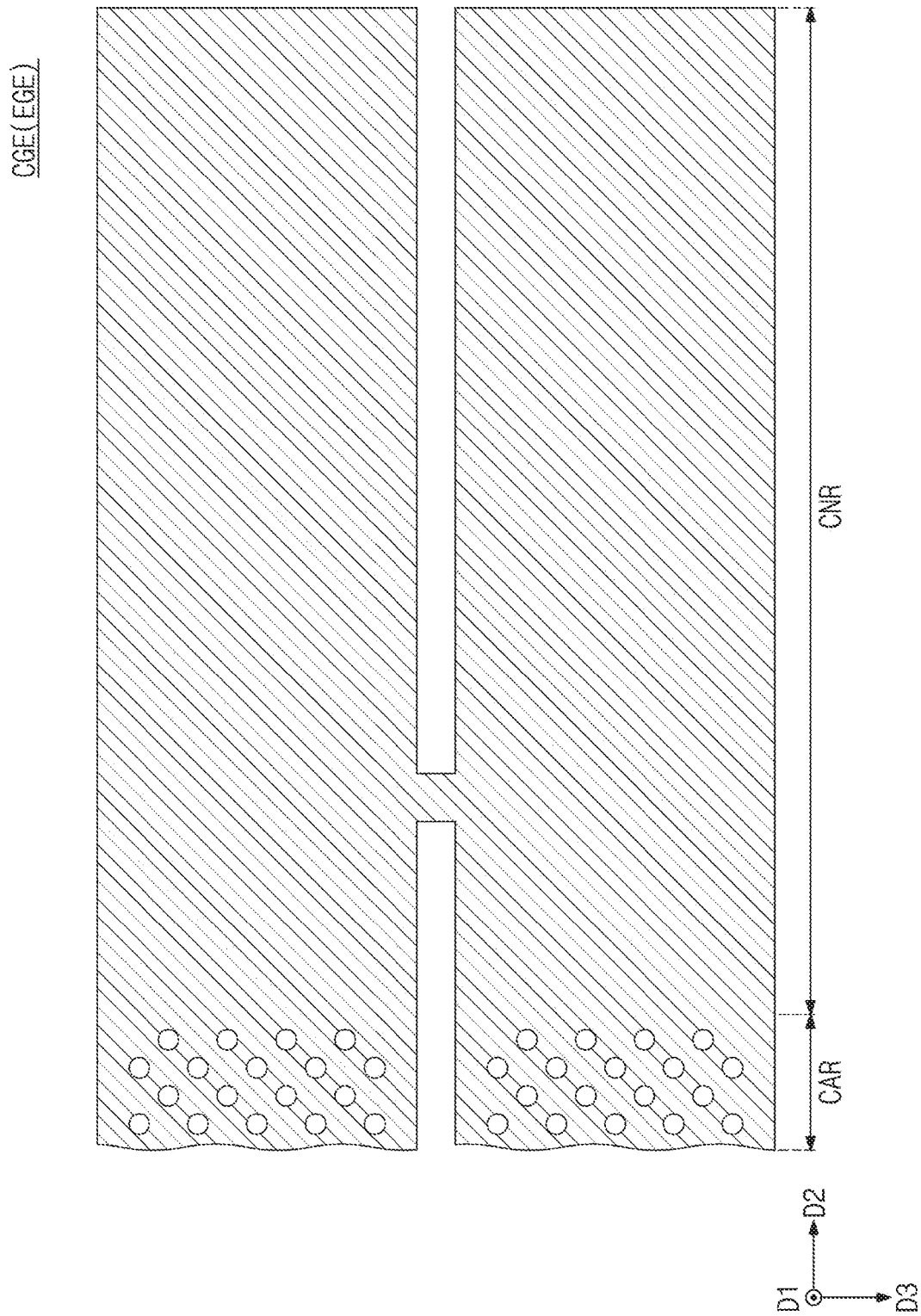
Figure 7:
Figure 8:
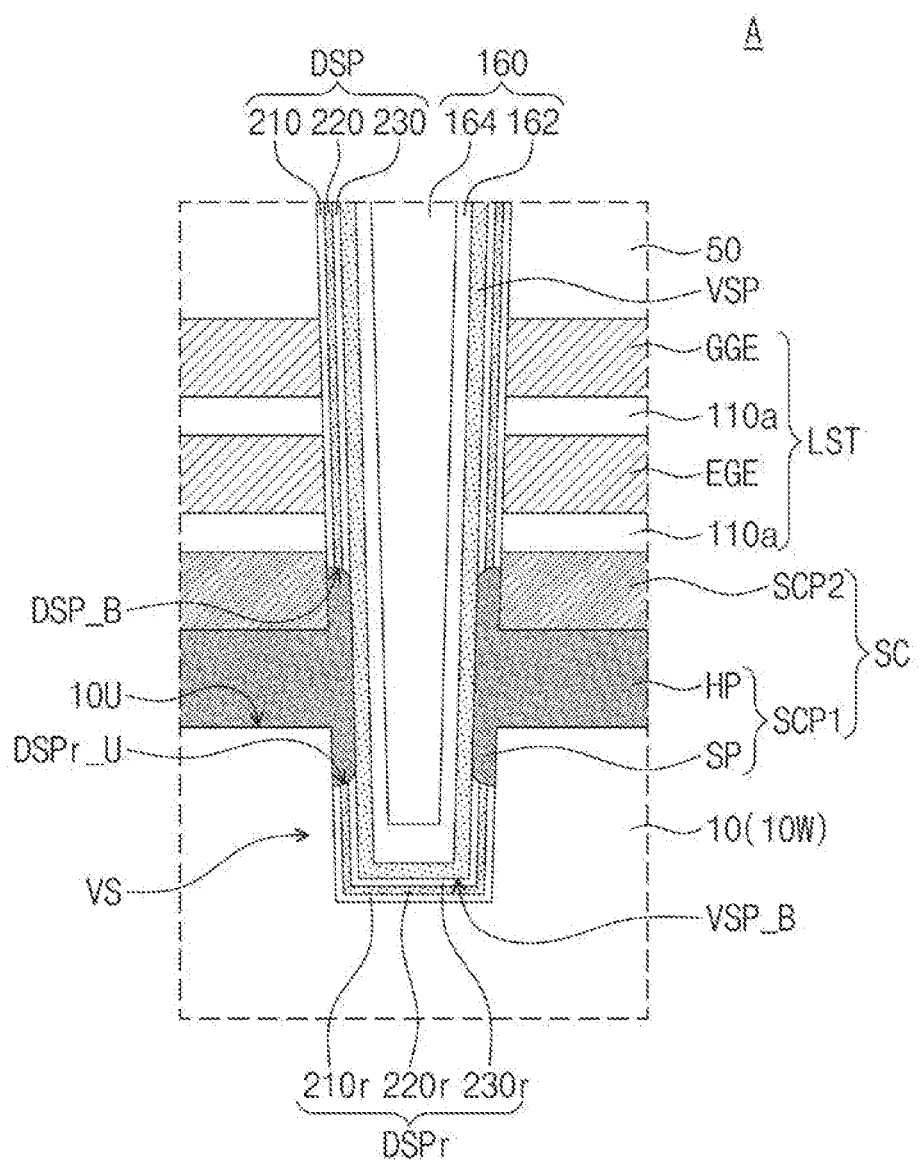
FIG. 8 is an enlarged view of a portion 'A' of FIG. 3.
Figure 9A:
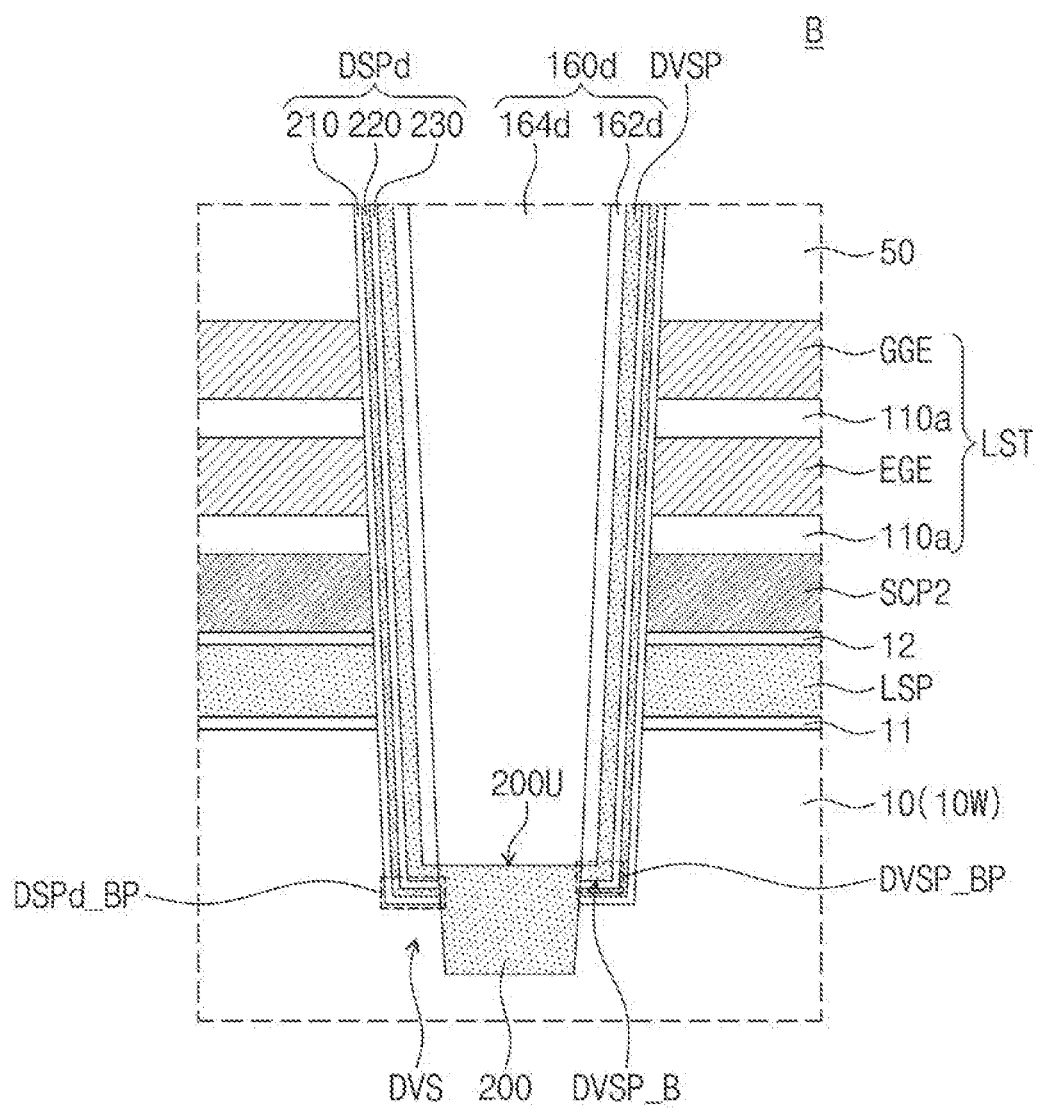
FIGS. 9A, 9B, 9C, and 9D are enlarged views corresponding to a portion 'B' of FIG. 4 to illustrate portions of 3D semiconductor memory devices according to various embodiments of the inventive concepts.

FIG. 2 is a plan view illustrating a 3D semiconductor memory device according to some embodiments of the inventive concepts. FIGS. 3 and 4 are cross-sectional views taken along lines I-I' and II-II' of FIG. 2, respectively. FIG. 5 is a plan view illustrating a source structure SC, and FIG. 6 is a plan view illustrating an erase gate electrode EGE and cell gate electrodes CGE. FIG. 7 is a plan view illustrating ground gate electrodes GGE. FIG. 8 is an enlarged view of a portion 'A' of FIG. 3, and FIG. 9A is an enlarged view of a portion 'B' of FIG. 4.

Referring to FIGS. 2 to 4, a substrate 10 may include a cell array region CAR and a connection region CNR. The substrate 10 may be a semiconductor substrate (e.g., a silicon substrate, a germanium substrate, or a silicon-germanium substrate). A well region 10W may be provided in the substrate 10. The substrate 10 may have a first conductivity type, and the well region 10W may include dopants having a second conductivity type different from the first conductivity type. For example, the first conductivity type may be a P-type, and the second conductivity type may be an N-type. In some embodiments, the well region 10W may be omitted.

A source structure SC and an electrode structure ST may be sequentially stacked on the substrate 10. The source structure SC may be disposed between the substrate 10 and the electrode structure ST and may be provided on the well region 10W. The source structure SC and the electrode structure ST may be sequentially stacked in a first direction D1 vertical (e.g., perpendicular) to a top surface 10U of the substrate 10. The electrode structure ST may extend from the cell array region CAR into/onto the connection region CNR in a second direction D2 parallel to the top surface 10U of the substrate 10. The source structure SC may extend in the second direction D2 under the electrode structure ST. The source structure SC may include a first source conductive pattern SCP1 and a second source conductive pattern SCP2 which are sequentially stacked on the substrate 10. The first source conductive pattern SCP1 may be in direct contact with the well region 10W. In some embodiments, an insulating layer may be provided between the first source conductive pattern SCP1 and the well region 10W. The first and second source conductive patterns SCP1 and SCP2 may include a semiconductor material doped with dopants having the second conductivity type. A concentration of the dopants in the first source conductive pattern SCP1 may be greater than a concentration of the dopants in the second source conductive pattern SCP2. For example, the first and second source conductive patterns SCP1 and SCP2 may include poly-silicon doped with N-type dopants (e.g., phosphorus (P) or arsenic (As)), and a concentration of the N-type dopants may be greater in the first source conductive pattern SCP1 than in the second source conductive pattern SCP2.

Referring to FIGS. 3 to 5, the first source conductive pattern SCP1 may have recessed sidewalls OP. Each of the recessed sidewalls OP may be concave toward the inside of the first source conductive pattern SCP1. The first source conductive pattern SCP1 may have at least a pair of the recessed sidewalls OP opposite to each other in a third direction D3 which is parallel to the top surface 10U of the substrate 10 and intersects the second direction D2. The second source conductive pattern SCP2 may cover a top surface of the first source conductive pattern SCP1 and may extend onto the recessed sidewalls OP of the first source conductive pattern SCP1. Portions of the second source conductive pattern SCP2 may cover the recessed sidewalls OP of the first source conductive pattern SCP1 and may be in contact with the substrate 10 or an insulating layer 11 on the well region 10W. In some embodiments, the insulating layer 11 may be omitted, and in this case, the portions of the second source conductive pattern SCP2 may be in direct contact with the substrate 10 or the well region 10W.

In some embodiments, the first source conductive pattern SCP1 may be locally provided on the cell array region CAR, and the second source conductive pattern SCP2 may extend from the cell array region CAR into/onto the connection region CNR in the second direction D2. In this case, a lower sacrificial pattern LSP may be provided on the connection region CNR of the substrate 10 and may be disposed between the second source conductive pattern SCP2 and the substrate 10. The insulating layer 11 may be provided on the connection region CNR of the substrate 10 so as to be disposed between the lower sacrificial pattern LSP and the substrate 10, and a buffer insulating layer 12 may be provided on the connection region CNR of the substrate 10 so as to be disposed between the lower sacrificial pattern LSP and the second source conductive pattern SCP2. For example, the lower sacrificial pattern LSP may include at least one of silicon nitride, silicon oxynitride, silicon carbide, or silicon-germanium. For example, each of the insulating layer 11 and the buffer insulating layer 12 may include a silicon oxide layer. The first source conductive pattern SCP1 may extend in the second direction D2 so as to be in contact with sidewalls of the lower sacrificial pattern LSP, the insulating layer 11 and the buffer insulating layer 12.

Referring again to FIGS. 2 to 4, the electrode structure ST may include a lower electrode structure LST, an upper electrode structure UST, and a planarization insulating layer 50 provided between the lower electrode structure LST and the upper electrode structure UST. The lower electrode structure LST may include lower gate electrodes EGE and GGE and lower insulating layers 110a, which are alternately stacked on the source structure SC along the first direction D1. The upper electrode structure UST may include upper gate electrodes CGE and SGE and upper insulating layers 110b, which are alternately stacked on the planarization insulating layer 50 along the first direction D1. The planarization insulating layer 50 may be disposed between an uppermost one GGE of the lower gate electrodes EGE and GGE and a lowermost one CGE of the upper gate electrodes CGE and SGE. The lower insulating layers 110a, the upper insulating layers 110b and the planarization insulating layer 50 may have thicknesses in the first direction D1, respectively. The thickness of the planarization insulating layer 50 may be greater than those of the lower and upper insulating layers 110a and 110b. An uppermost one 110b of the lower and upper insulating layers 110a and 110b may be thicker than the others of the lower and upper insulating layers 110a and 110b. For example, the lower gate electrodes EGE and GGE and the upper gate electrodes CGE and SGE may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). Each of the lower insulating layers 110a, the upper insulating layers 110b and the planarization insulating layer 50 may include a silicon oxide layer and/or a low-k dielectric layer.

Referring to FIGS. 3, 4, 6 and 7, the lower gate electrodes EGE and GGE may include an erase control gate electrode EGE, and a ground selection gate electrode GGE on the erase control gate electrode EGE. The erase control gate electrode EGE may be adjacent to the source structure SC. A lowermost one of the lower insulating layers 110a may be disposed between the erase control gate electrode EGE and the source structure SC. The erase control gate electrode EGE may be used as a gate electrode of the erase control transistor ECT for controlling an erase operation of the cell array (i.e., a memory cell array) of FIG. 1. The erase control gate electrode EGE may include line portions extending in the second direction D2 and a connecting portion connecting the line portions, as illustrated in FIG. 6. The ground selection gate electrode GGE may have a line shape extending in the second direction D2, as illustrated in FIG. 7. The ground selection gate electrode GGE may be spaced apart from a neighboring ground selection gate electrode GGE in the third direction D3. The ground selection gate electrodes GGE may be disposed on the line portions of the erase control gate electrode EGE, respectively. The ground selection gate electrode GGE may be used as a gate electrode of the ground selection transistor GST of FIG. 1.

The upper gate electrodes CGE and SGE may include cell gate electrodes CGE and a string selection gate electrode SGE. The cell gate electrodes CGE may be provided between the ground selection gate electrode GGE and the string selection gate electrode SGE and may be disposed at different heights (or levels) from the top surface 10U of the substrate 10. The cell gate electrodes CGE may be used as gate electrodes of the memory cell transistors MCT of FIG. 1. Each of the cell gate electrodes CGE may include line portions extending in the second direction D2 and a connecting portion connecting the line portions, as illustrated in FIG. 6. The ground selection gate electrodes GGE may be disposed under the line portions of the lowermost one of the cell gate electrodes CGE, respectively.

Referring again to FIGS. 2 to 4, the string selection gate electrode SGE may include a pair of string selection gate electrodes SGE1 and SGE2 laterally spaced apart from each other. The pair of string selection gate electrodes SGE1 and SGE2 may be spaced apart from each other in the third direction D3. The pair of string selection gate electrodes SGE1 and SGE2 may be isolated from each other by an isolation insulating pattern 105 interposed therebetween. The isolation insulating pattern 105 may have a line shape extending in the second direction D2. The isolation insulating pattern 105 may include an insulating material (e.g., silicon oxide). The string selection gate electrode SGE (e.g. SGE1 or SGE2) may be used as a gate electrode of the string selection transistor SST2 of FIG. 1. In some embodiments, an additional string selection gate electrode SGE may be provided between the string selection gate electrode SGE and an uppermost one of the cell gate electrodes CGE. In this case, the additional string selection gate electrode SGE may include a pair of additional string selection gate electrodes SGE1 and SGE2 spaced apart from each other in the third direction D3, and the additional string selection gate electrode SGE (e.g. SGE1 or SGE2) may be used as a gate electrode of the string selection transistor SST1 of FIG. 1. Lengths (i.e., lengths in the second direction D2) of the gate electrodes EGE, GGE, CGE and SGE of the electrode structure ST may decrease sequentially as a vertical distance from the substrate 10 increases. The gate electrodes EGE, GGE, CGE and SGE of the electrode structure ST may include electrode pads (i.e., pad regions of the gate electrodes) which constitute (i.e., provide) a stair structure on the connection region CNR.

Vertical structures VS may be disposed on the cell array region CAR of the substrate 10, and dummy vertical structures DVS may be disposed on the connection region CNR of the substrate 10. Each of the vertical structures VS may extend in the first direction D1 to penetrate the electrode structure ST and the source structure SC. For example, the vertical structures VS constituting two rows adjacent to each other may be arranged in a zigzag form along the second direction D2 when viewed in a plan view. Each of the dummy vertical structures DVS may penetrate a corresponding one of the electrode pads, and the electrode structure ST and the source structure SC under the corresponding electrode pad. In some embodiments, each of the dummy vertical structures DVS may penetrate the second source conductive pattern SCP2, the lower sacrificial pattern LSP, the insulating layer 11, and the buffer insulating layer 12. Each of the vertical structures VS and the dummy vertical structures DVS may have a width in a direction parallel to the top surface 10U of the substrate 10, and the widths of the dummy vertical structures DVS may be greater than the widths of the vertical structures VS.

Referring to FIGS. 2, 3 and 8, each of the vertical structures VS may include a vertical semiconductor pattern VSP. The vertical semiconductor pattern VSP may extend in the first direction D1 to penetrate the electrode structure ST and the source structure SC. The vertical semiconductor pattern VSP may extend into the substrate 10. A bottom surface VSP_B of the vertical semiconductor pattern VSP may be provided in the substrate 10 or the well region 10W. The vertical semiconductor pattern VSP may have a pipe shape of which a bottom end is closed. The vertical semiconductor pattern VSP may include a semiconductor material such as silicon (Si), germanium (Ge), or a compound thereof. In addition, the vertical semiconductor pattern VSP may include a semiconductor material doped with dopants or an intrinsic semiconductor material not doped with dopants. The vertical semiconductor pattern VSP may be used as channel regions of the erase control, string selection, ground selection and memory cell transistors ECT, SST, GST and MCT described with reference to FIG. 1.

A sidewall of a lower portion of the vertical semiconductor pattern VSP may be in contact with the first source conductive pattern SCP1. The first source conductive pattern SCP1 may include a horizontal portion HP extending substantially in parallel to the top surface 10U of the substrate 10 under the second source conductive pattern SCP2, and a vertical portion SP vertically protruding from the horizontal portion HP. The vertical portion SP may be in contact with a portion of a sidewall of the vertical semiconductor pattern VSP and may surround the portion of the sidewall of the vertical semiconductor pattern VSP. The horizontal portion HP of the first source conductive pattern SCP1 may be disposed between the top surface 10U of the substrate 10 and the second source conductive pattern SCP2. The horizontal portion HP of the first source conductive pattern SCP1 may be in contact with the substrate 10 or the well region 10W. The vertical portion SP of the first source conductive pattern SCP1 may extend between the sidewall of the vertical semiconductor pattern VSP and a sidewall of the substrate 10 (e.g., the well region 10W) and between the sidewall of the vertical semiconductor pattern VSP and a sidewall of the second source conductive pattern SCP2.

Each of the vertical structures VS may include a data storage pattern DSP disposed between the vertical semiconductor pattern VSP and the electrode structure ST. The data storage pattern DSP may extend in the first direction D1 and may surround the sidewall of the vertical semiconductor pattern VSP. The data storage pattern DSP may have a pipe shape of which top and bottom ends are opened. A bottom surface DSP_B of the data storage pattern DSP may be in contact with the first source conductive pattern SCP1. The data storage pattern DSP may include a data storage layer of an NAND flash memory device. The data storage pattern DSP may include a charge storage layer 220 between the vertical semiconductor pattern VSP and the electrode structure ST, a blocking insulating layer 210 between the electrode structure ST and the charge storage layer 220, and a tunnel insulating layer 230 between the vertical semiconductor pattern VSP and the charge storage layer 220. For example, the charge storage layer 220 may include at least one of a silicon nitride layer, a silicon oxynitride layer, a silicon-rich nitride layer, a nano-crystalline silicon layer, or a laminated trap layer. The blocking insulating layer 210 may include a material of which an energy band gap is greater than that of the charge storage layer 220. For example, the blocking insulating layer 210 may include a high-k dielectric layer such as an aluminum oxide layer and/or a hafnium oxide layer. The tunnel insulating layer 230 may include a material of which an energy band gap is greater than that of the charge storage layer 220. For example, the tunnel insulating layer 230 may include a silicon oxide layer.

Each of the vertical structures VS may include a residual data storage pattern DSPr disposed between the vertical semiconductor pattern VSP and the substrate 10 (or the well region 10W). The residual data storage pattern DSPr may be provided in the substrate 10 or the well region 10W, and the vertical semiconductor pattern VSP may be spaced apart from the substrate 10 or the well region 10W by the residual data storage pattern DSPr. The vertical semiconductor pattern VSP may be electrically isolated from the substrate 10 or the well region 10W by the residual data storage pattern DSPr. The residual data storage pattern DSPr may be disposed between a bottom surface VSP_B of the vertical semiconductor pattern VSP and the substrate 10 (or the well region 10W) and may extend onto the sidewall of the vertical semiconductor pattern VSP. The residual data storage pattern DSPr may have a U-shape when viewed in a cross-sectional view. The data storage pattern DSP may be vertically spaced apart from the residual data storage pattern DSPr.

A topmost surface DSPr_U of the residual data storage pattern DSPr may be disposed at a lower height (or level) than the top surface 10U of the substrate 10. The residual data storage pattern DSPr may be vertically spaced apart from the data storage pattern DSP with the vertical portion SP of the first source conductive pattern SCP1 interposed therebetween. The topmost surface DSPr_U of the residual data storage pattern DSPr may be in contact with the vertical portion SP of the first source conductive pattern SCP1. The residual data storage pattern DSPr may have substantially the same layer structure as the data storage pattern DSP. For example, the residual data storage pattern DSPr may include a residual charge storage layer 220r between the vertical semiconductor pattern VSP and the substrate 10 (or the well region 10W), a residual blocking insulating layer 210r between the substrate 10 (or the well region 10W) and the residual charge storage layer 220r, and a residual tunnel insulating layer 230r between the vertical semiconductor pattern VSP and the residual charge storage layer 220r. The residual charge storage layer 220r, the residual blocking insulating layer 210r and the residual tunnel insulating layer 230r may include the same materials as the charge storage layer 220, the blocking insulating layer 210 and the tunnel insulating layer 230, respectively.

Each of the vertical structures VS may include an insulating pattern 160 on an inner sidewall (e.g., filling an inside) of the vertical semiconductor pattern VSP. The insulating pattern 160 may include a first insulating pattern 162 and a second insulating pattern 164, and the first insulating pattern 162 may be disposed between the second insulating pattern 164 and the vertical semiconductor pattern VSP. The first and second insulating patterns 162 and 164 may include, for example, silicon oxide. Each of the vertical structures VS may include a conductive pad 150 disposed on the vertical semiconductor pattern VSP. The conductive pad 150 may cover a top surface of the insulating pattern 160 and a topmost surface of the vertical semiconductor pattern VSP. The conductive pad 150 may include a semiconductor material doped with dopants, and/or a conductive material. The data storage pattern DSP may extend from the sidewall of the vertical semiconductor pattern VSP onto a sidewall of the conductive pad 150. The data storage pattern DSP may surround the sidewall of the conductive pad 150, and a topmost surface of the data storage pattern DSP may be substantially coplanar with a top surface of the conductive pad 150.

Referring to FIGS. 2, 4 and 9A, each of the dummy vertical structures DVS may include a dummy vertical semiconductor pattern DVSP. The dummy vertical semiconductor pattern DVSP may extend substantially in the first direction D1 to penetrate a corresponding one of the electrode pads, and the electrode structure ST and the source structure SC under the corresponding electrode pad. As used herein with respect to extending in the first direction D1, the term "substantially" means that an element (e.g., the dummy vertical semiconductor pattern DVSP) may extend at a slight or moderate angle (e.g., 45 degrees or smaller) with respect to the first direction D1 rather than extending exactly vertically. The dummy vertical semiconductor pattern DVSP may penetrate the lower sacrificial pattern LSP, the insulating layer 11 and the buffer insulating layer 12 under the corresponding electrode pad. The dummy vertical semiconductor pattern DVSP may extend into the substrate 10. A bottom surface DVSP_B of the dummy vertical semiconductor pattern DVSP may be provided in the substrate 10 or the well region 10W. The dummy vertical semiconductor pattern DVSP may have a pipe shape of which a bottom end is opened. The dummy vertical semiconductor pattern DVSP may include the same material as the vertical semiconductor pattern VSP.

Each of the dummy vertical structures DVS may include a contact pattern 200 which extends from a bottom portion DVSP_BP of the dummy vertical semiconductor pattern DVSP into the substrate 10 (or the well region 10W). In some embodiments, the contact pattern 200 may include a conductive material. For example, the contact pattern 200 may include the same material as the dummy vertical semiconductor pattern DVSP. The contact pattern 200 may be in contact with the bottom portion DVSP_BP of the dummy vertical semiconductor pattern DVSP, and the dummy vertical semiconductor pattern DVSP may be electrically connected to the substrate 10 or the well region 10W through the contact pattern 200. The contact pattern 200 may have, for example, a pillar shape extending in the first direction D1.

Each of the dummy vertical structures DVS may include a dummy data storage pattern DSPd disposed between the dummy vertical semiconductor pattern DVSP and the substrate 10 (or the well region 10W). The dummy data storage pattern DSPd may be provided in the substrate 10 or the well region 10W, and the dummy vertical semiconductor pattern DVSP may be spaced apart from the substrate 10 or the well region 10W by the dummy data storage pattern DSPd. A bottom portion DSPd_BP of the dummy data storage pattern DSPd may be disposed between the bottom surface DVSP_B of the dummy vertical semiconductor pattern DVSP and the substrate 10 (or the well region 10W). The dummy data storage pattern DSPd may extend between a sidewall of the dummy vertical semiconductor pattern DVSP and the substrate 10 (or the well region 10W). The contact pattern 200 may penetrate the bottom portion DSPd_BP of the dummy data storage pattern DSPd so as to be connected to the substrate 10 (or the well region 10W).

The dummy data storage pattern DSPd may extend substantially in the first direction D1 and may surround the sidewall of the dummy vertical semiconductor pattern DVSP. The dummy data storage pattern DSPd may have a pipe shape of which top and bottom ends are opened. The dummy data storage pattern DSPd may extend between the electrode structure ST and the dummy vertical semiconductor pattern DVSP and between the source structure SC and the dummy vertical semiconductor pattern DVSP. In some embodiments, the dummy data storage pattern DSPd may be disposed between the dummy vertical semiconductor pattern DVSP and each of the second source conductive pattern SCP2, the lower sacrificial pattern LSP, the insulating layer 11 and the buffer insulating layer 12. The dummy data storage pattern DSPd may have substantially the same layer structure as the data storage pattern DSP. The dummy data storage pattern DSPd may include the charge storage layer 220 between the dummy vertical semiconductor pattern DVSP and the electrode structure ST, the blocking insulating layer 210 between the electrode structure ST and the charge storage layer 220, and the tunnel insulating layer 230 between the dummy vertical semiconductor pattern DVSP and the charge storage layer 220.

Each of the dummy vertical structures DVS may include a dummy insulating pattern 160d on an inner sidewall (e.g., filling an inside) of the dummy vertical semiconductor pattern DVSP. The dummy insulating pattern 160d may be disposed on the contact pattern 200 and may cover a top surface 200U of the contact pattern 200. The dummy insulating pattern 160d may have substantially the same layer structure as the insulating pattern 160. The dummy insulating pattern 160d may include a first dummy insulating pattern 162d and a second dummy insulating pattern 164d, and the first dummy insulating pattern 162d may be disposed between the second dummy insulating pattern 164d and the dummy vertical semiconductor pattern DVSP. The first dummy insulating pattern 162d may conformally cover an inner sidewall of the dummy vertical semiconductor pattern DVSP and may expose the top surface 200U of the contact pattern 200. The second dummy insulating pattern 164d may cover the top surface 200U of the contact pattern 200. The first dummy insulating pattern 162d and the second dummy insulating pattern 164d may include the same materials as the first insulating pattern 162 and the second insulating pattern 164, respectively. The first and second dummy insulating patterns 162d and 164d may include, for example, silicon oxide. In some embodiments, the contact pattern 200 may include a different material from that of the dummy insulating pattern 160d, and the dummy insulating pattern 160d may be in contact with the top surface 200U of the contact pattern 200.

Each of the dummy vertical structures DVS may include a dummy conductive pad 150d disposed on the dummy vertical semiconductor pattern DVSP. The dummy conductive pad 150d may cover a top surface of the dummy insulating pattern 160d and a topmost surface of the dummy vertical semiconductor pattern DVSP. The dummy conductive pad 150d may include the same material as the conductive pad 150. The dummy data storage pattern DSPd may extend from the sidewall of the dummy vertical semiconductor pattern DVSP onto a sidewall of the dummy conductive pad 150d. The dummy data storage pattern DSPd may surround the sidewall of the dummy conductive pad 150d, and a topmost surface of the dummy data storage pattern DSPd may be substantially coplanar with a top surface of the dummy conductive pad 150d.

Referring again to FIGS. 2 to 4, common source plugs CSP may be provided at both sides of the electrode structure ST, respectively, and may be connected to the substrate 10 or the well region 10W. The common source plugs CSP may extend in the second direction D2 and may be spaced apart from each other in the third direction D3 with the electrode structure ST interposed therebetween. The common source plugs CSP may be disposed at both sides of the source structure SC, respectively, and may be spaced apart from each other in the third direction D3 with the source structure SC interposed therebetween. Sidewall insulating spacers SS may be provided on both sidewalls of the electrode structure ST, respectively. Each of the sidewall insulating spacers SS may be disposed between the electrode structure ST and each of the common source plugs CSP. Each of the sidewall insulating spacers SS may extend between the source structure SC and each of the common source plugs CSP and may be in contact with the substrate 10 or the well region 10W. The common source plugs CSP may include a conductive material, and the sidewall insulating spacers SS may include, for example, silicon nitride.

A first capping insulating layer 110 may be disposed on the connection region CNR of the substrate 10 to cover the electrode pads constituting the stair structure. A second capping insulating layer 120 may cover a top surface of the electrode structure ST, the top surface of the conductive pad 150, the top surface of the dummy conductive pad 150d, and a top surface of the first capping insulating layer 110. A top surface of the second capping insulating layer 120 may be located at substantially the same height as top surfaces of the common source plugs CSP. An interlayer insulating layer 130 may be provided on the second capping insulating layer 120 to cover the top surfaces of the common source plugs CSP. The first and second capping insulating layers 110 and 120 and the interlayer insulating layer 130 may include an insulating material (e.g., silicon oxide). A first contact 125 may be provided on the conductive pad 150. The first contact 125 may penetrate the second capping insulating layer 120 so as to be connected to the conductive pad 150. A second contact 135 may penetrate the interlayer insulating layer 130 so as to be connected to the first contact 125. The first and second contacts 125 and 135 may include a conductive material. Bit lines BL may be provided on the interlayer insulating layer 130. The bit lines BL may extend in the third direction D3 and may be spaced apart from each other in the second direction D2. At least one of the vertical structures VS may be a cell dummy vertical structure which includes a cell dummy vertical semiconductor pattern not connected to the first contact 125 or the second contact 135. Except for the cell dummy vertical structure, the vertical semiconductor pattern VSP of each of the vertical structures VS may be electrically connected to a corresponding one of the bit lines BL through the first contact 125 and the second contact 135. The bit lines BL may include a conductive material. Conductive contacts CT and conductive lines CL may be connected to the electrode pads of the gate electrodes EGE, GGE, CGE and SGE. In an erase operation of the memory cell array of FIG. 1, an erase voltage may be applied to the source structure SC, and thus a gate induced drain leakage (GIDL) current may be generated in the erase control transistor ECT of FIG. 1. As a result, the erase operation may be performed on the memory cells of FIG. 1.

Figure 9B:
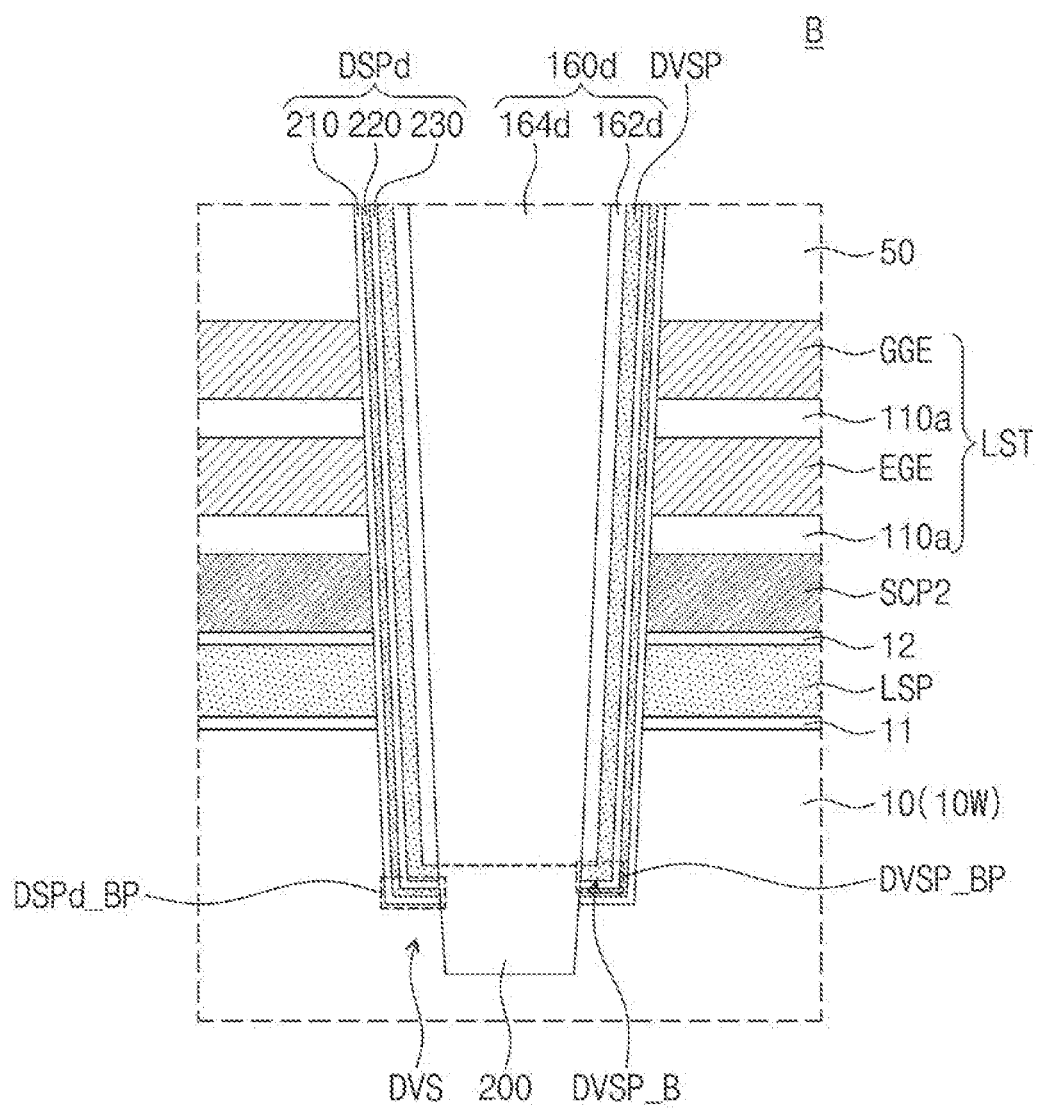

FIG. 9B is an enlarged view corresponding to the portion 'B' of FIG. 4 to illustrate a portion of a 3D semiconductor memory device according to some embodiments of the inventive concepts. Hereinafter, differences between FIG. 9B and the above embodiments described with reference to FIGS. 1 to 8 and 9A will be mainly mentioned for the purpose of ease and convenience in explanation.

Referring to FIG. 9B, each of the dummy vertical structures DVS may include a contact pattern 200 which extends from the bottom portion DVSP_BP of the dummy vertical semiconductor pattern DVSP into the substrate 10 (or the well region 10W). According to some embodiments, the contact pattern 200 may include an insulating material. The contact pattern 200 (e.g., a sidewall thereof) may be in contact with the bottom portion DVSP_BP of the dummy vertical semiconductor pattern DVSP and may penetrate the bottom portion DSPd_BP of the dummy data storage pattern DSPd so as to be connected to the substrate 10 (or the well region 10W). The contact pattern 200 may have a pillar shape extending in the first direction D1. The dummy insulating pattern 160d may be disposed on the contact pattern 200. The contact pattern 200 may include the same material as the dummy insulating pattern 160d, and the contact pattern 200 and the dummy insulating pattern 160d may be in contact with each other to constitute (i.e., provide) a single unitary body. For example, the contact pattern 200 may include the same material as the second dummy insulating pattern 164d of the dummy insulating pattern 160d, and the contact pattern 200 and the second dummy insulating pattern 164d may be in contact with each other to constitute a single unitary body.

Figure 9C:
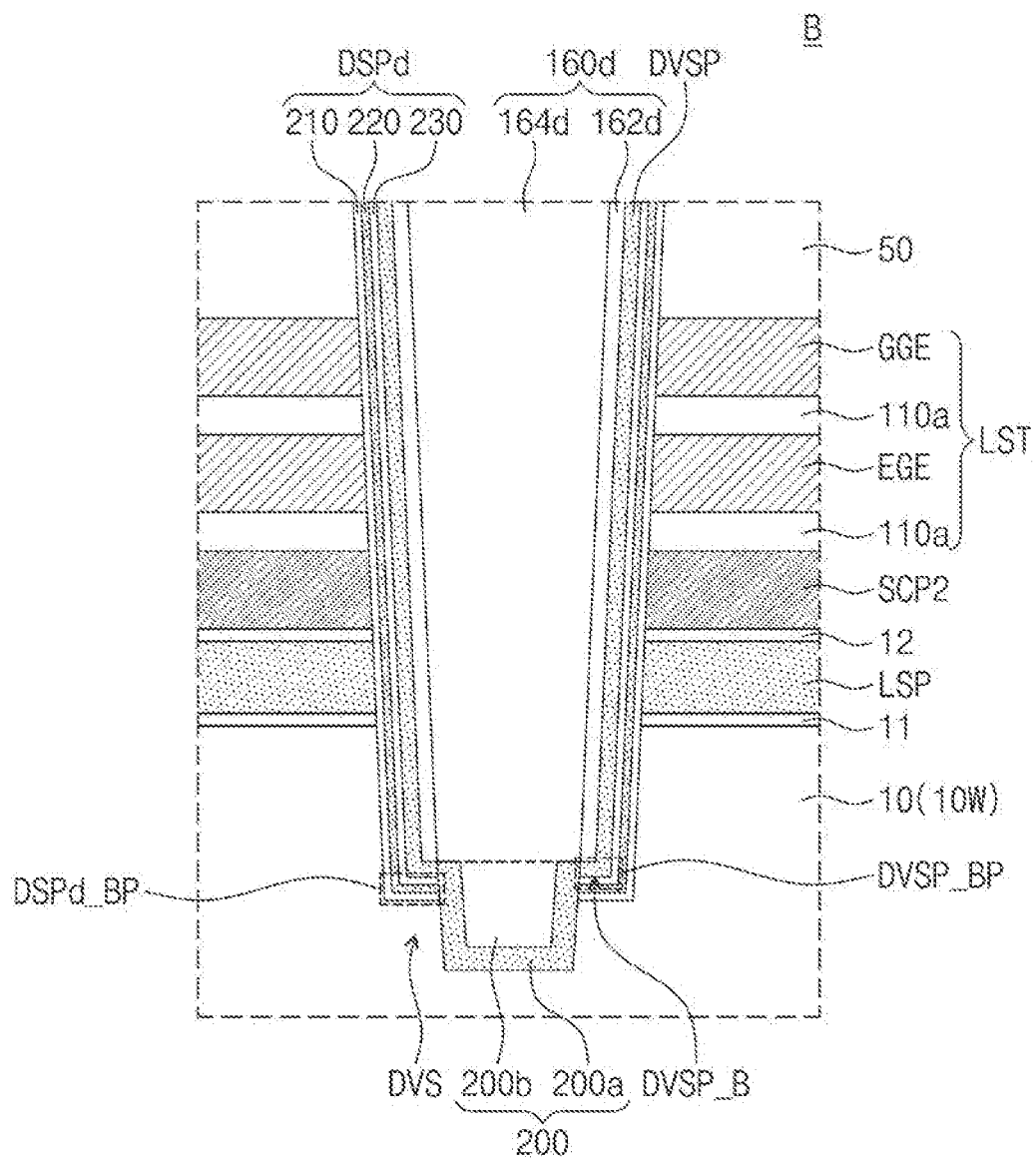

FIG. 9C is an enlarged view corresponding to the portion 'B' of FIG. 4 to illustrate a portion of a 3D semiconductor memory device according to some embodiments of the inventive concepts. Hereinafter, differences between FIG. 9C and the above embodiments described with reference to FIGS. 1 to 8 and 9A will be mainly mentioned for the purpose of ease and convenience in explanation.

Referring to FIG. 9C, each of the dummy vertical structures DVS may include a contact pattern 200 which extends from the bottom portion DVSP_BP of the dummy vertical semiconductor pattern DVSP into the substrate 10 (or the well region 10W). The contact pattern 200 may be in contact with the bottom portion DVSP_BP of the dummy vertical semiconductor pattern DVSP and may penetrate the bottom portion DSPd_BP of the dummy data storage pattern DSPd so as to be connected to the substrate 10 (or the well region 10W). According to some embodiments, the contact pattern 200 may include a first portion 200a being in contact with the bottom portion DVSP_BP of the dummy vertical semiconductor pattern DVSP, and a second portion 200b spaced apart from the dummy vertical semiconductor pattern DVSP with the first portion 200a interposed therebetween. The first portion 200a may extend between the bottom portion DSPd_BP of the dummy data storage pattern DSPd and the second portion 200b and between the substrate 10 (or the well region 10W) and the second portion 200b. The first portion 200a may have a U-shape when viewed in a cross-sectional view. The second portion 200b may have a pillar shape extending in the first direction D1, and the first portion 200a may cover a bottom surface and a sidewall of the second portion 200b.

The dummy insulating pattern 160d may be disposed on the contact pattern 200. The first portion 200a of the contact pattern 200 may include a different material from that of the dummy insulating pattern 160d. The first portion 200a of the contact pattern 200 may include a conductive material. For example, the first portion 200a of the contact pattern 200 may include the same material as the dummy vertical semiconductor pattern DVSP. The dummy vertical semiconductor pattern DVSP may be electrically connected to the substrate 10 or the well region 10W through the first portion 200a of the contact pattern 200. The second portion 200b of the contact pattern 200 may include an insulating material. The second portion 200b of the contact pattern 200 may include the same material as the dummy insulating pattern 160d, and the second portion 200b and the dummy insulating pattern 160d may be in contact with each other to constitute a single unitary body. For example, the second portion 200b of the contact pattern 200 may include the same material as the second dummy insulating pattern 164d of the dummy insulating pattern 160d, and the second portion 200b and the second dummy insulating pattern 164d may be in contact with each other to constitute (i.e., provide) a single unitary body.

Figure 9D:
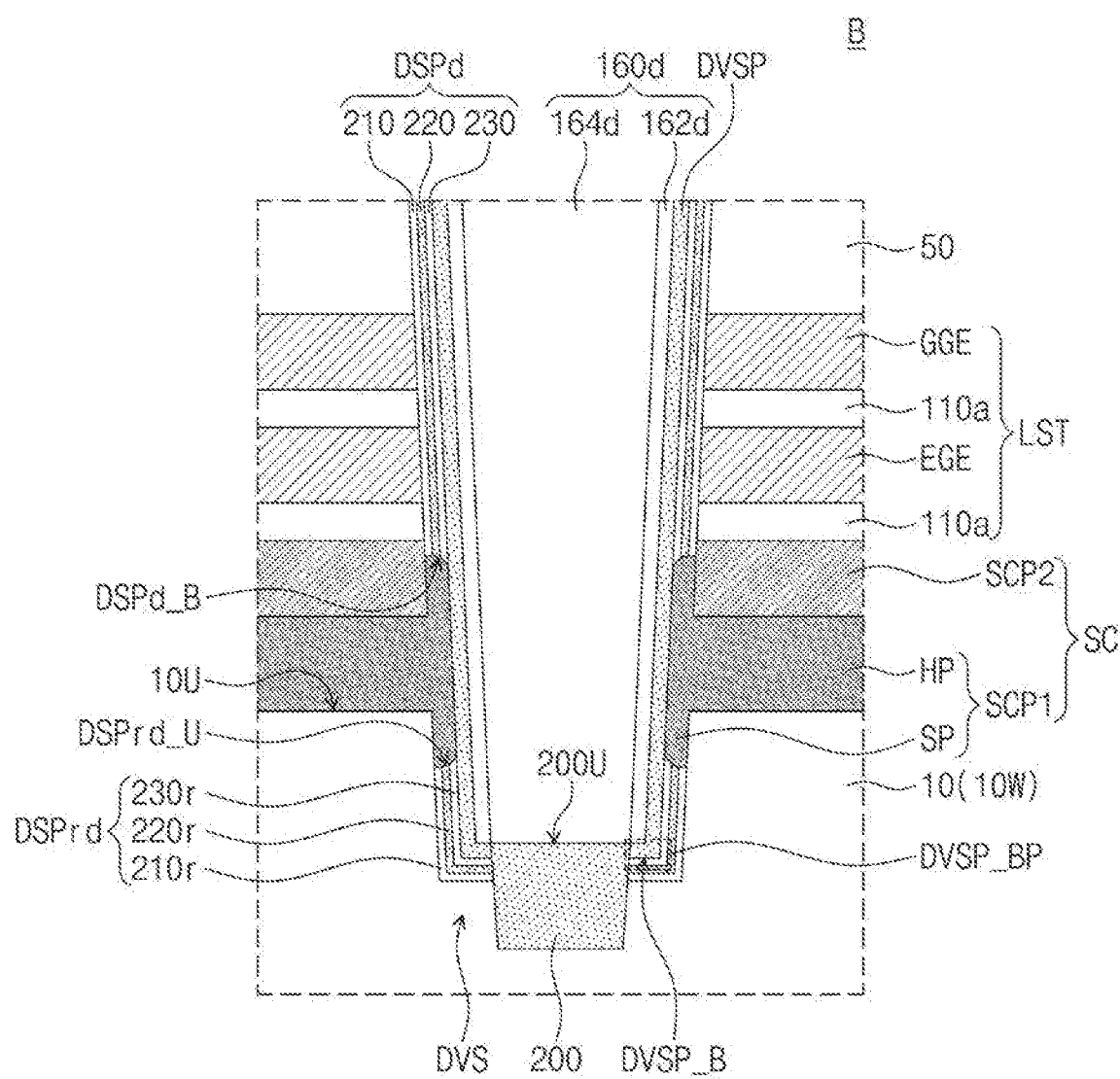

FIG. 9D is an enlarged view corresponding to the portion 'B' of FIG. 4 to illustrate a portion of a 3D semiconductor memory device according to some embodiments of the inventive concepts. Hereinafter, differences between FIG. 9D and the above embodiments described with reference to FIGS. 1 to 8 and 9A will be mainly mentioned for the purpose of ease and convenience in explanation.

Referring to FIG. 9D, according to some embodiments, the lower sacrificial pattern LSP, the insulating layer 11 and the buffer insulating layer 12 on the connection region CNR illustrated in FIG. 4 may be replaced with the first source conductive pattern SCP1. In this case, the first source conductive pattern SCP1 may extend in the second direction D2 from the cell array region CAR into/onto the connection region CNR and may be disposed between the second source conductive pattern SCP2 and the substrate 10 on the connection region CNR of the substrate 10. Each of the dummy vertical structures DVS may penetrate the first and second source conductive patterns SCP1 and SCP2.

Each of the dummy vertical structures DVS may include the dummy vertical semiconductor pattern DVSP, and a sidewall of a lower portion of the dummy vertical semiconductor pattern DVSP may be in contact with the first source conductive pattern SCP1. The vertical portion SP of the first source conductive pattern SCP1 may be in contact with a portion of a sidewall of the dummy vertical semiconductor pattern DVSP and may surround the portion of the sidewall of the dummy vertical semiconductor pattern DVSP. The horizontal portion HP of the first source conductive pattern SCP1 may be disposed between the top surface 10U of the substrate 10 and the second source conductive pattern SCP2. The horizontal portion HP of the first source conductive pattern SCP1 may be in contact with the substrate 10 or the well region 10W. The vertical portion SP of the first source conductive pattern SCP1 may extend between the sidewall of the dummy vertical semiconductor pattern DVSP and a sidewall of the substrate 10 (e.g., the well region 10W) and between the sidewall of the dummy vertical semiconductor pattern DVSP and a sidewall of the second source conductive pattern SCP2. Each of the dummy vertical structures DVS may include the contact pattern 200 which extends from the bottom portion DVSP_BP of the dummy vertical semiconductor pattern DVSP into the substrate 10 (or the well region 10W).

Each of the dummy vertical structures DVS may include a dummy data storage pattern DSPd disposed between the dummy vertical semiconductor pattern DVSP and the electrode structure ST. The dummy data storage pattern DSPd may extend in the first direction D1 and may surround the sidewall of the dummy vertical semiconductor pattern DVSP. The dummy data storage pattern DSPd may have a pipe shape of which top and bottom ends are opened. A bottom surface DSPd_B of the dummy data storage pattern DSPd may be in contact with the first source conductive pattern SCP1. The dummy data storage pattern DSPd may have substantially the same layer structure as the data storage pattern DSP.

Each of the dummy vertical structures DVS may include a dummy residual data storage pattern DSPrd disposed between the dummy vertical semiconductor pattern DVSP and the substrate 10 (or the well region 10W). The dummy residual data storage pattern DSPrd may be provided in the substrate 10 or the well region 10W, and the dummy vertical semiconductor pattern DVSP may be spaced apart from the substrate 10 or the well region 10W by the dummy residual data storage pattern DSPrd. The dummy residual data storage pattern DSPrd may be disposed between the bottom surface DVSP_B of the dummy vertical semiconductor pattern DVSP and the substrate 10 (or the well region 10W) and may extend onto the sidewall of the dummy vertical semiconductor pattern DVSP. The dummy data storage pattern DSPd may be vertically spaced apart from the dummy residual data storage pattern DSPrd.

A topmost surface DSPrd_U of the dummy residual data storage pattern DSPrd may be disposed at a lower height (or level) than the top surface 10U of the substrate 10. The dummy residual data storage pattern DSPrd may be vertically spaced apart from the dummy data storage pattern DSPd with the vertical portion SP of the first source conductive pattern SCP1 interposed therebetween. The topmost surface DSPrd_U of the dummy residual data storage pattern DSPrd may be in contact with the vertical portion SP of the first source conductive pattern SCP1. The dummy residual data storage pattern DSPrd may have substantially the same layer structure as the residual data storage pattern DSPr. The contact pattern 200 may penetrate a bottom portion of the dummy residual data storage pattern DSPrd so as to be connected to the substrate 10 (or the well region 10W).

According to some embodiments of the inventive concepts, each of the dummy vertical structures DVS may include the contact pattern 200 which extends from the bottom portion DVSP_BP of the dummy vertical semiconductor pattern DVSP into the substrate 10 (or the well region 10W). The contact pattern 200 may be in contact with the bottom portion DVSP_BP of the dummy vertical semiconductor pattern DVSP and may be connected (e.g., electrically connected) to the substrate 10 (or the well region 10W). The contact pattern 200 may be used as a path through which charges in the dummy vertical semiconductor pattern DVSP are discharged. In this case, it is possible to minimize/reduce defects (e.g., a poor profile of adjacent patterns (e.g., trenches)) which may be caused by the charges in the dummy vertical semiconductor pattern DVSP. Thus, the 3D semiconductor memory device with excellent reliability may be provided or realized.

FIGS. 10A, 11A, 12A, 13A, 14A, 15A, 16A, 17A, 18A, 19A, 20A, 21A, 22A, 23A, and 24A are cross-sectional views corresponding to the line I-I' of FIG. 2 to illustrate a method of manufacturing a 3D semiconductor memory device, according to some embodiments of the inventive concepts. FIGS. 10B, 11B, 12B, 13B, 14B, 15B, 16B, 17B, 18B, 19B, 20B, 21B, 22B, 23B, and 24B are cross-sectional views corresponding to the line II-II' of FIG. 2 to illustrate a method of manufacturing a 3D semiconductor memory device, according to some embodiments of the inventive concepts. Hereinafter, the descriptions to the same features as described with reference to FIGS. 1 to 8 and 9A to 9D may be omitted or mentioned briefly for the purpose of ease and convenience in explanation.

Figure 10A:
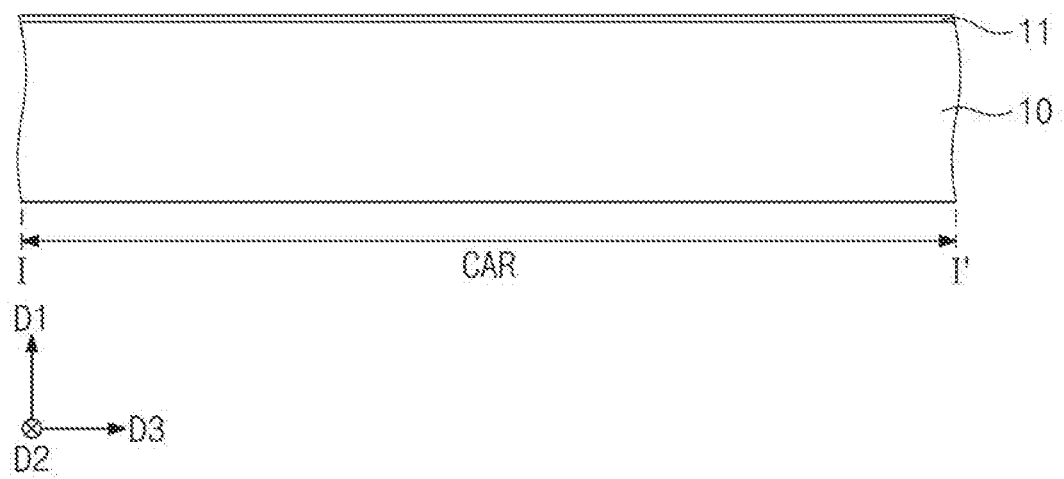
FIGS. 10A, 11A, 12A, 13A, 14A, 15A, 16A, 17A, 18A, 19A, 20A, 21A, 22A, 23A, and 24A are cross-sectional views corresponding to the line I-I' of FIG. 2 to illustrate a method of manufacturing a 3D semiconductor memory device, according to some embodiments of the inventive concepts.
Figure 10B:
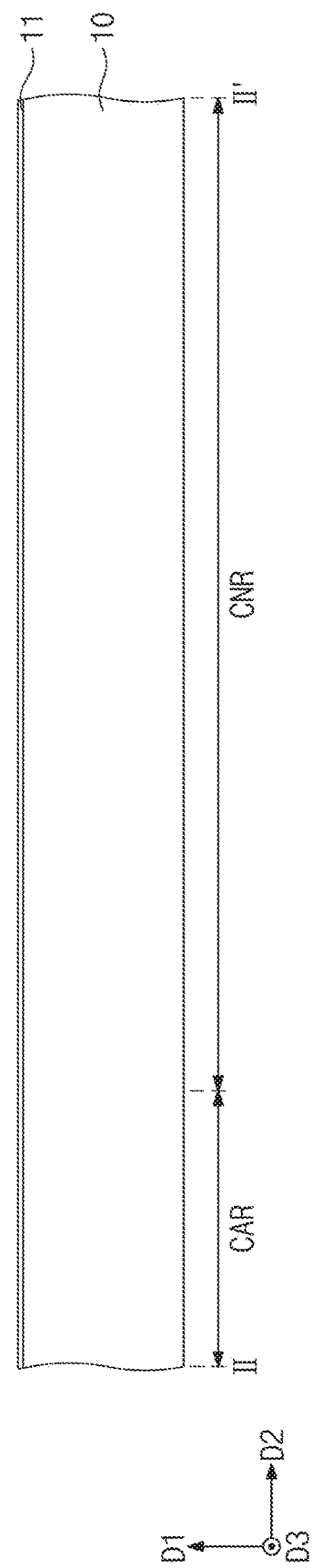

Referring to FIGS. 10A and 10B, an insulating layer 11 may be formed on a substrate 10. The insulating layer 11 may cover a cell array region CAR and a connection region CNR of the substrate 10. For example, the insulating layer 11 may include a silicon oxide layer.

Figure 11A:
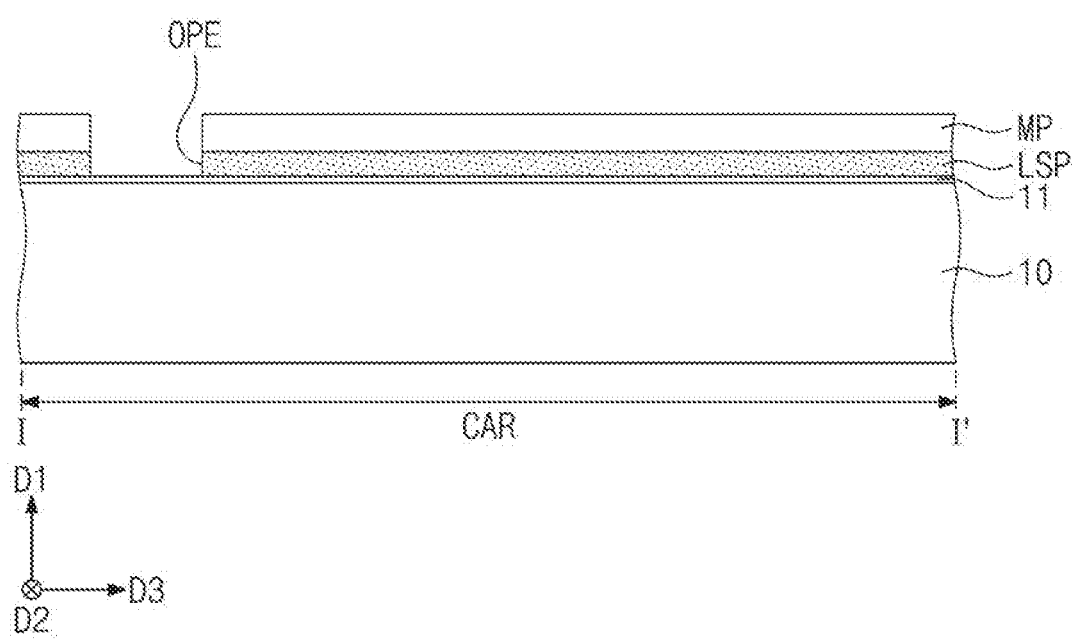
Figure 11B:
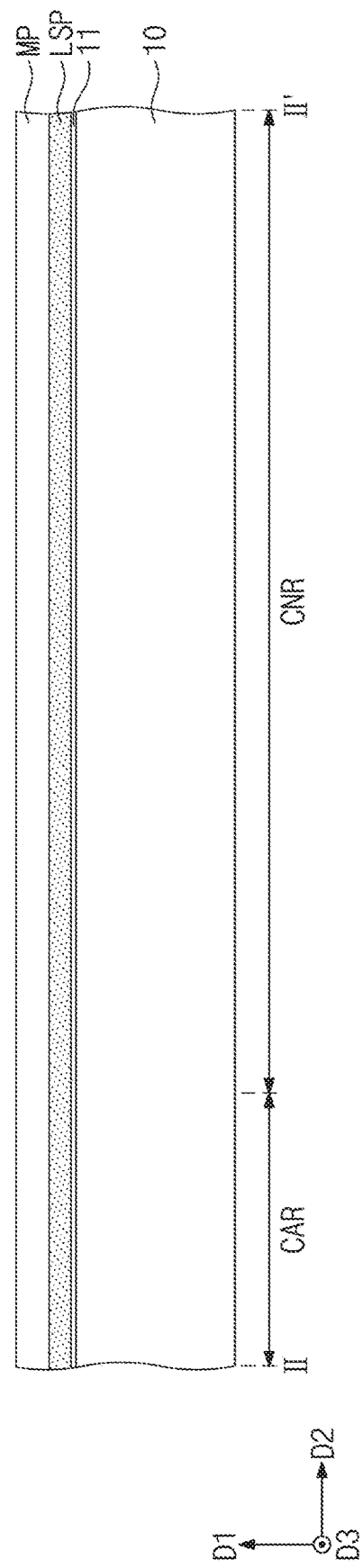

Referring to FIGS. 11A and 11B, a lower sacrificial pattern LSP and a mask pattern MP may be sequentially formed on the insulating layer 11. The formation of the lower sacrificial pattern LSP may include forming a lower sacrificial layer on the insulating layer 11, forming the mask pattern MP on the lower sacrificial layer, and etching the lower sacrificial layer using the mask pattern MP as an etch mask to expose the insulating layer 11. By the etching process, the lower sacrificial pattern LSP may include an opening OPE exposing the insulating layer 11. The lower sacrificial pattern LSP may include a material having an etch selectivity with respect to the insulating layer 11. For example, the lower sacrificial pattern LSP may include at least one of silicon nitride, silicon oxynitride, silicon carbide, or silicon-germanium.

Figure 12A:
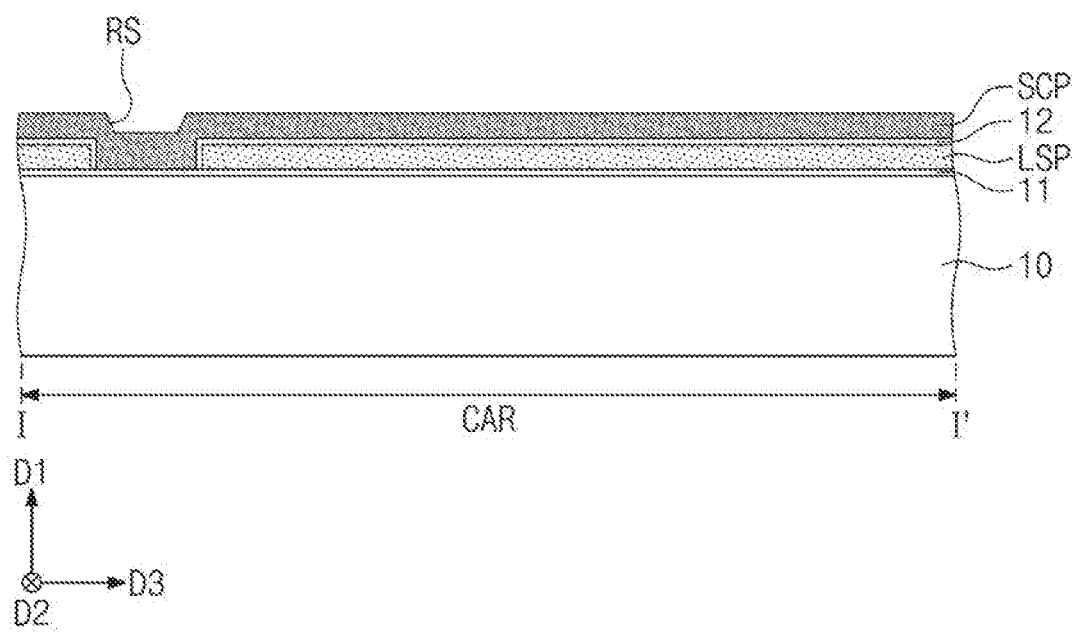
Figure 12B:
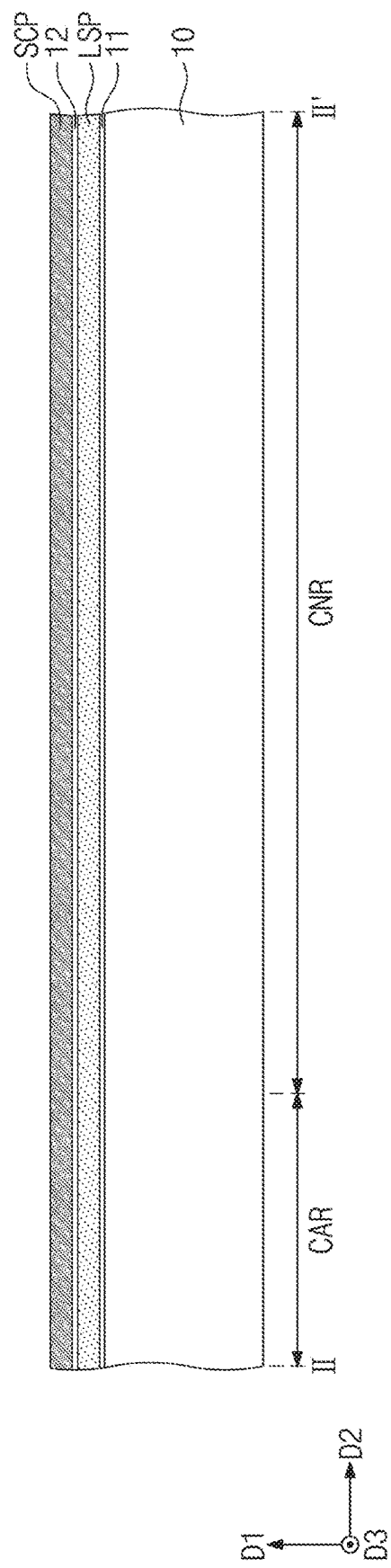

Referring to FIGS. 12A and 12B, the mask pattern MP may be removed after the formation of the lower sacrificial pattern LSP. Thereafter, a buffer insulating layer 12 and a source conductive layer SCP may be sequentially formed on the lower sacrificial pattern LSP. The buffer insulating layer 12 with a substantially uniform thickness may conformally cover a top surface of the lower sacrificial pattern LSP, and a sidewall of the lower sacrificial pattern LSP exposed by the opening OPE. The source conductive layer SCP with a substantially uniform thickness may conformally cover the top surface of the lower sacrificial pattern LSP and an inner surface of the opening OPE. Since the source conductive layer SCP with the substantially uniform thickness covers the inner surface of the opening OPE, a top surface of the source conductive layer SCP may include a surface RS recessed toward the opening OPE. For example, the buffer insulating layer 12 may include a silicon oxide layer. The source conductive layer SCP may include a poly-silicon layer doped with N-type dopants.

Figure 13A:
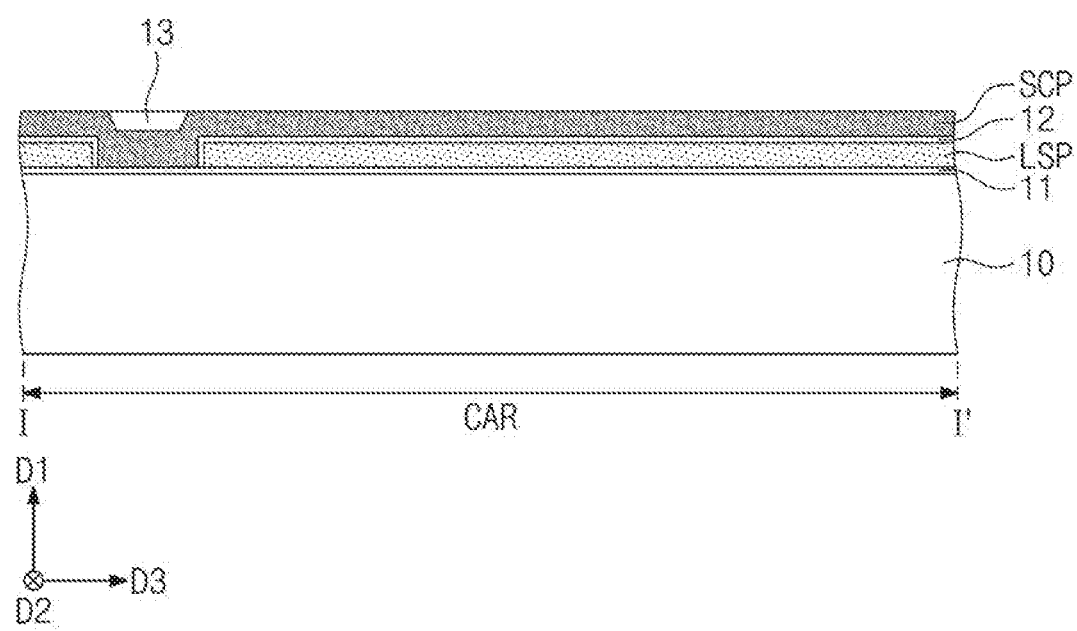
Figure 13B:
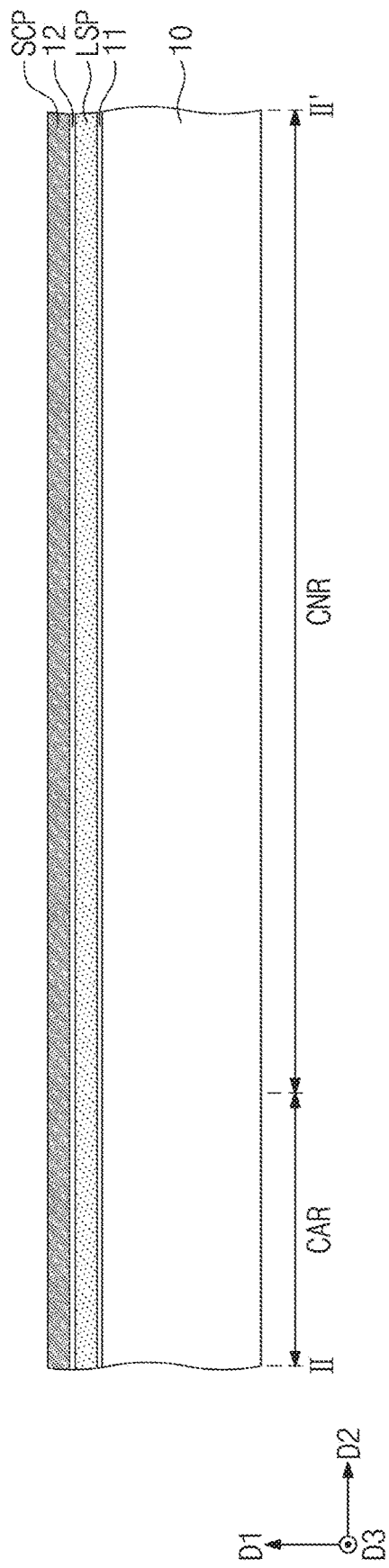

Referring to FIGS. 13A and 13B, a separation layer 13 may be formed to cover the recessed surface RS of the source conductive layer SCP. The formation of the separation layer 13 may include forming the separation layer 13 on the source conductive layer SCP, and planarizing the separation layer 13 to expose the top surface of the source conductive layer SCP. The separation layer 13 may include, for example, silicon oxide.

Figure 14A:
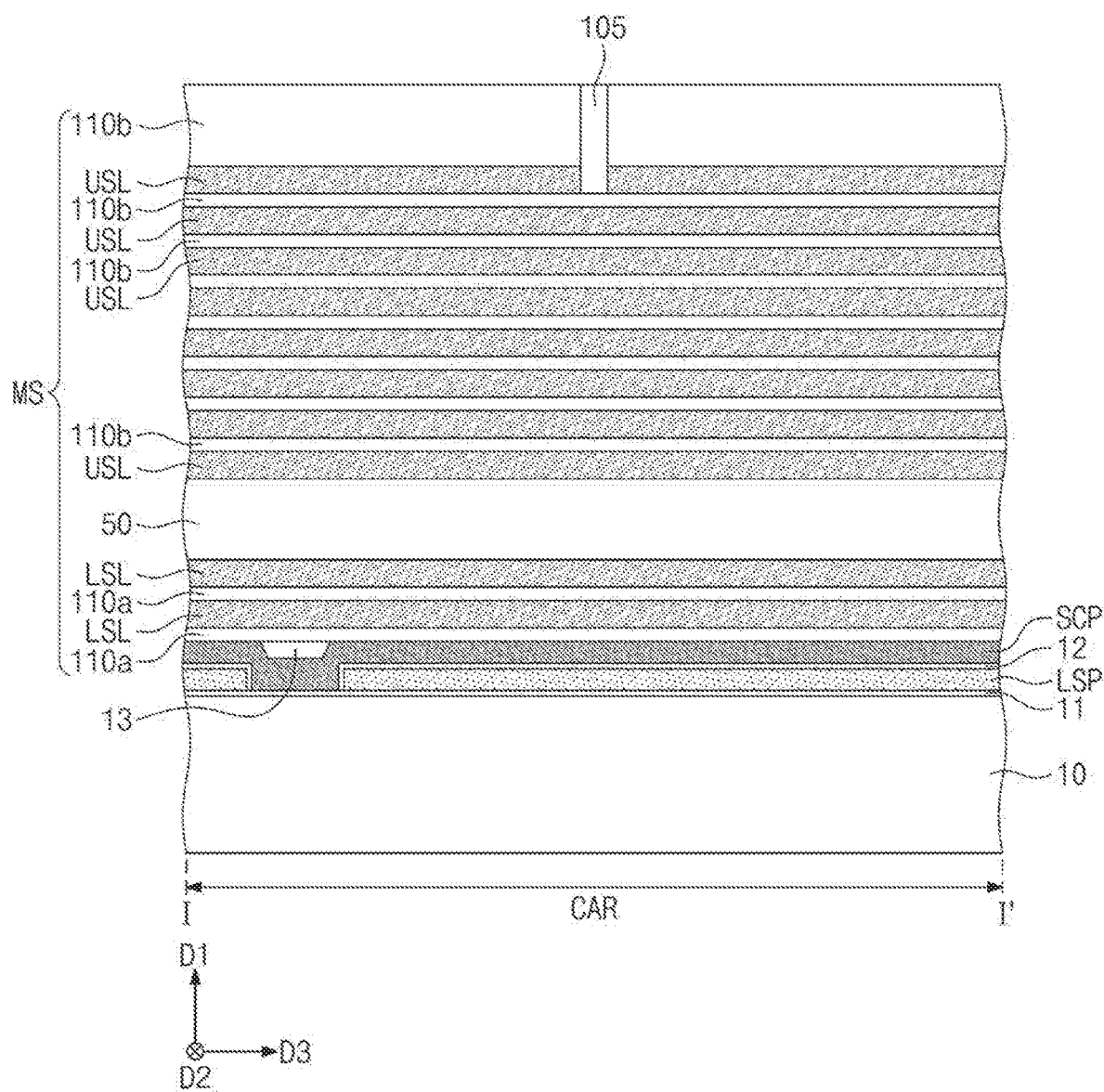
Figure 14B:
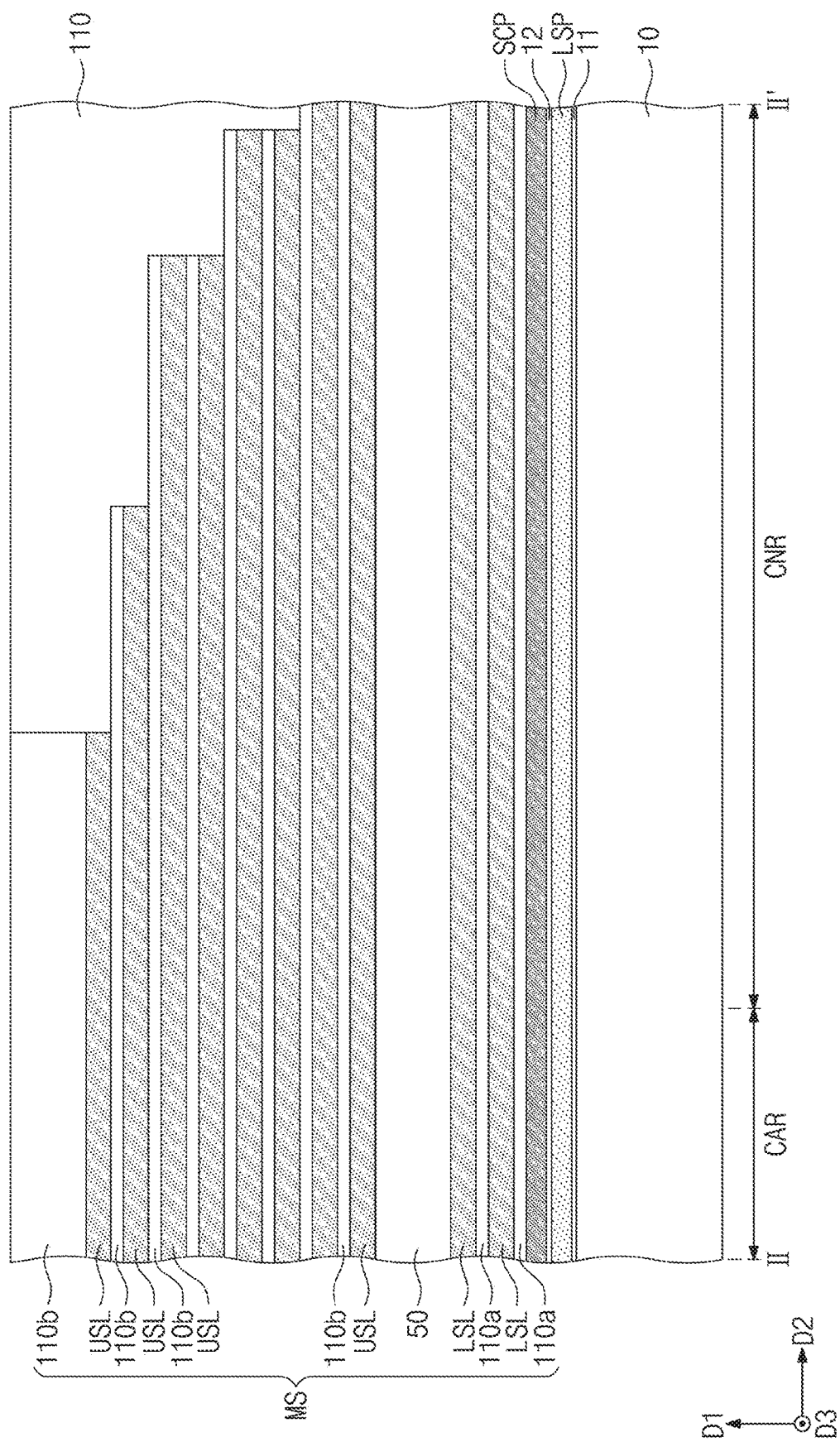

Referring to FIGS. 14A and 14B, lower insulating layers 110a and lower sacrificial layers LSL may be alternately stacked on the source conductive layer SCP. The lower sacrificial layers LSL may include a material having an etch selectivity with respect to the lower insulating layers 110a. A planarization insulating layer 50 may be formed on an uppermost one of the lower sacrificial layers LSL. The planarization insulating layer 50 may be thicker than the lower insulating layers 110a and may include, for example, a silicon oxide layer. Upper insulating layers 110b and upper sacrificial layers USL may be alternately stacked on the planarization insulating layer 50. The upper sacrificial layers USL may include a material having an etch selectivity with respect to the upper insulating layers 110b. In some embodiments, the upper sacrificial layers USL may include the same material as the lower sacrificial layers LSL and the lower sacrificial pattern LSP. For example, each of the upper and lower sacrificial layers USL and LSL may include a silicon nitride layer, and each of the upper and lower insulating layers 110b and 110a may include a silicon oxide layer. Hereinafter, the upper and lower sacrificial layers USL and LSL, the upper and lower insulating layers 110b and 110a and the planarization insulating layer 50 may be referred to as a mold structure MS.

The mold structure MS may extend from the cell array region CAR into/onto the connection region CNR of the substrate 10. The upper sacrificial layers USL and the upper insulating layers 110b may be patterned such that the mold structure MS has an end portion of a stair structure on the connection region CNR. A first capping insulating layer 110 may be formed to cover the stair-structural end portion of the mold structure MS. An isolation insulating pattern 105 may be formed to divide an uppermost one of the upper sacrificial layers USL. In other words, by the isolation insulating pattern 105, the uppermost upper sacrificial layer USL may be divided into a pair of upper sacrificial layers USL laterally spaced apart from each other.

Figure 15A:
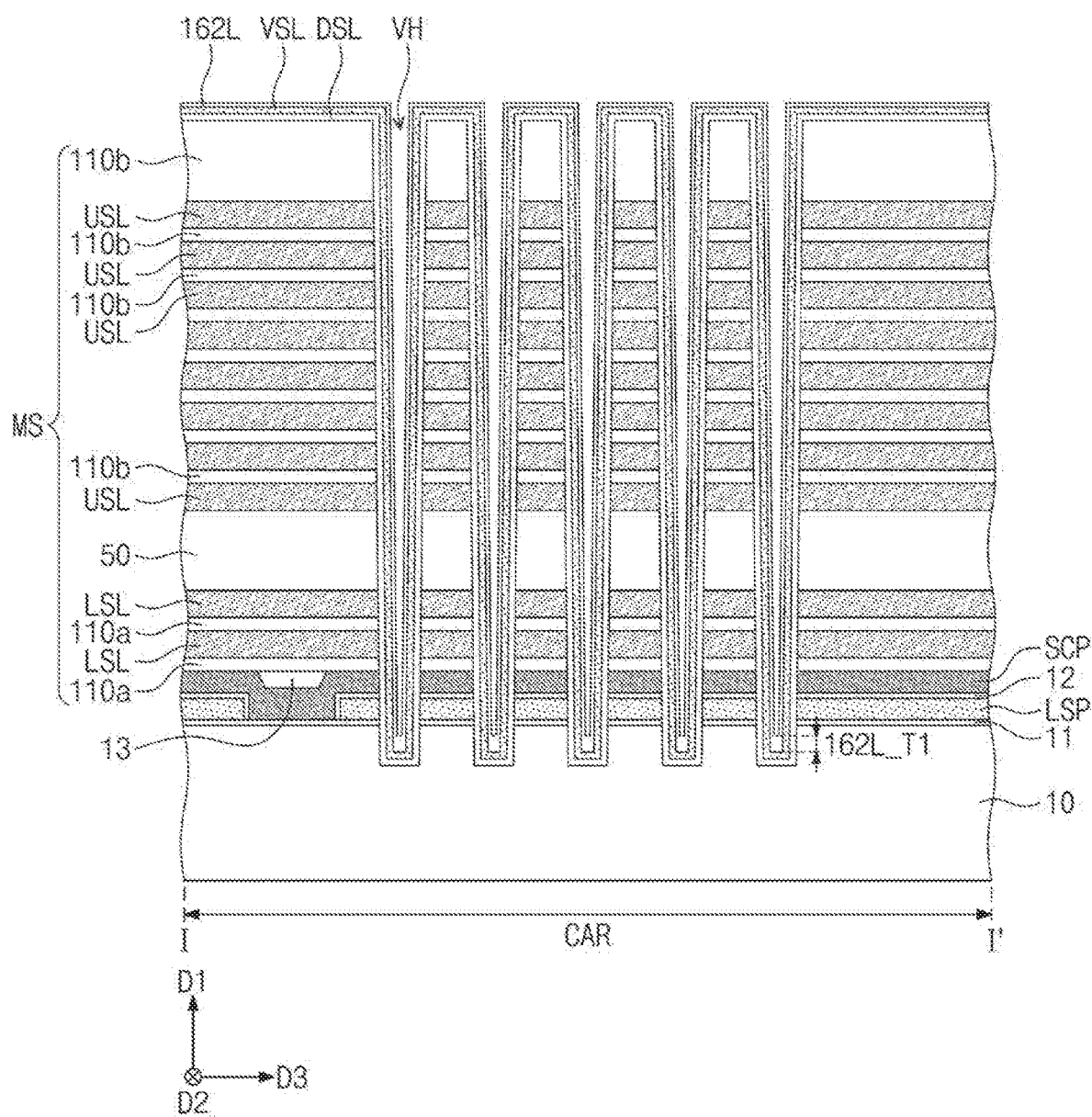
Figure 15B:
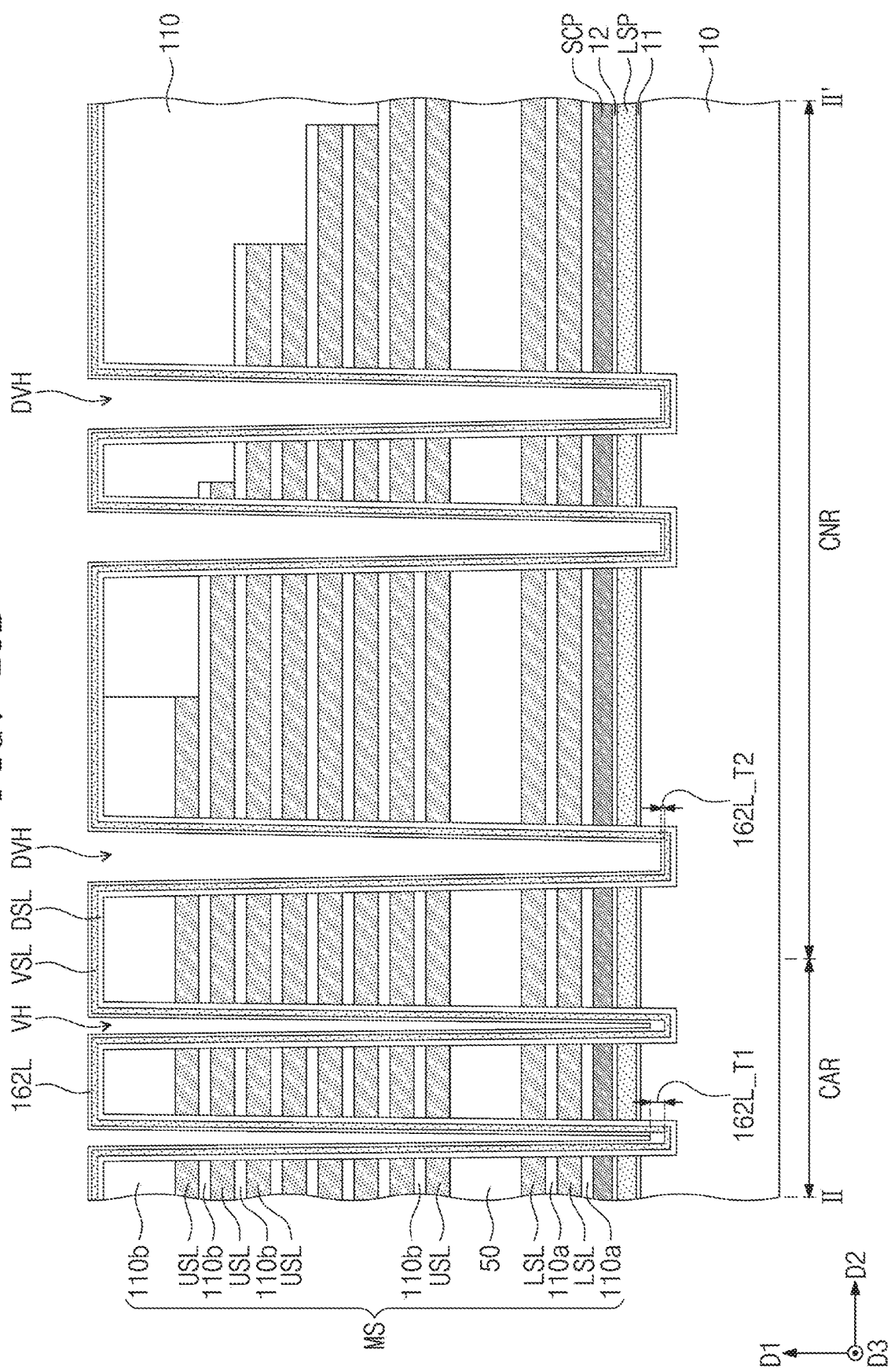

Referring to FIGS. 15A and 15B, vertical holes VH may be formed in the mold structure MS on the cell array region CAR, and dummy vertical holes DVH may be formed in the mold structure MS on the connection region CNR. Each of the vertical holes VH and the dummy vertical holes DVH may penetrate the mold structure MS, the source conductive layer SCP, the buffer insulating layer 12, the lower sacrificial pattern LSP, and the insulating layer 11 and may expose a portion of the substrate 10. Each of the vertical holes VH and the dummy vertical holes DVH may have a width in a direction parallel to a top surface 10U of the substrate 10, and the widths of the dummy vertical holes DVH may be greater than the widths of the vertical holes VH.

A data storage layer DSL, a vertical semiconductor layer VSL and a first insulating layer 162L may be sequentially formed on the mold structure MS. The data storage layer DSL, the vertical semiconductor layer VSL and the first insulating layer 162L may partially fill each of the vertical holes VH and the dummy vertical holes DVH and may cover an inner surface of each of the vertical holes VH and the dummy vertical holes DVH with substantially uniform thicknesses. In some embodiments, the first insulating layer 162L may fill the dummy vertical holes DVH having relatively great widths and the vertical holes VH having relatively small widths, with a substantially uniform thickness. In this case, a thickness 162L_T1 of the first insulating layer 162L filling a lower portion of each of the vertical holes VH may be greater than a thickness 162L_T2 of the first insulating layer 162L filling a lower portion of each of the dummy vertical holes DVH. However, embodiments of the inventive concepts are not limited thereto.

Figure 16A:
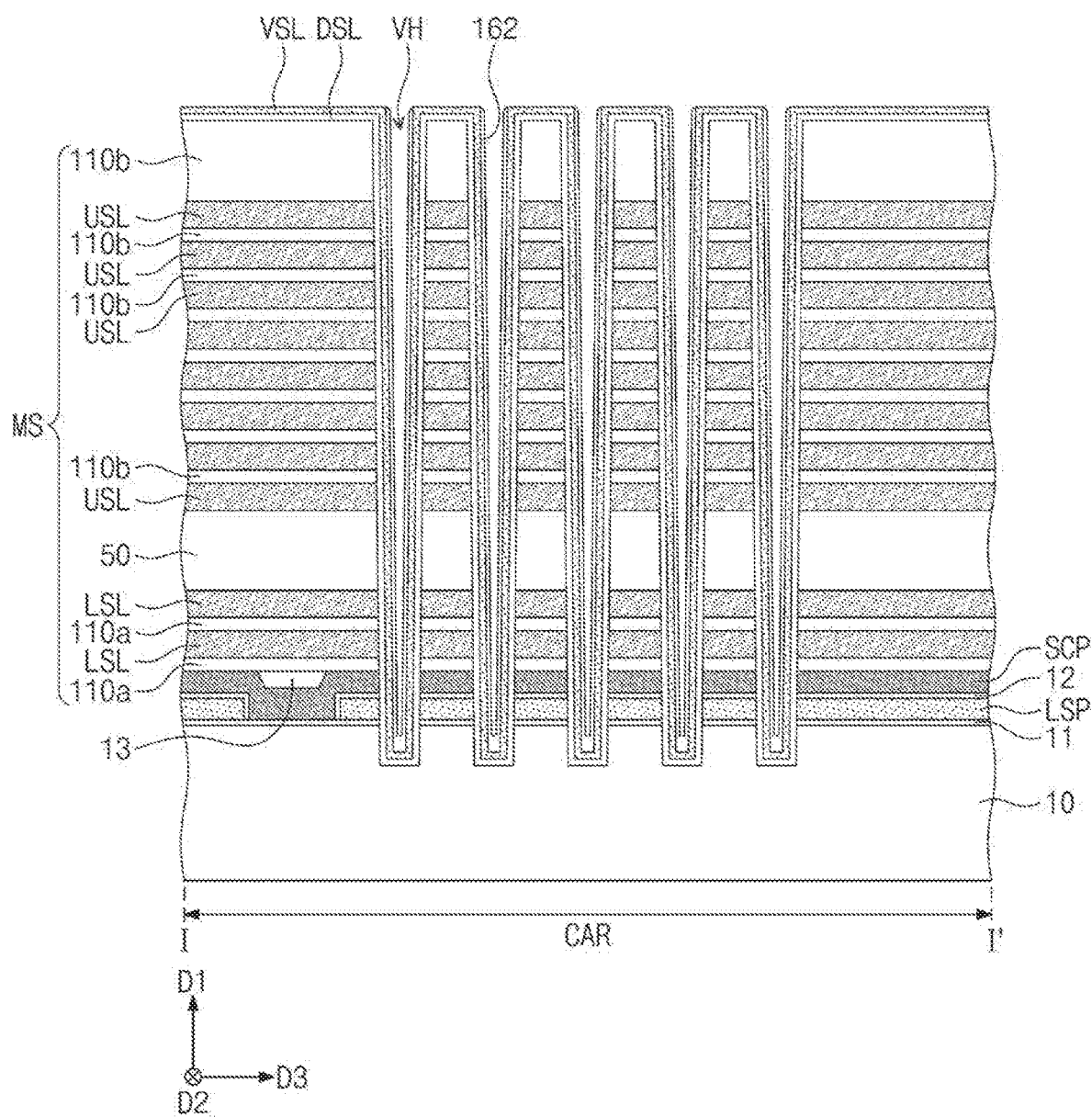
Figure 16B:
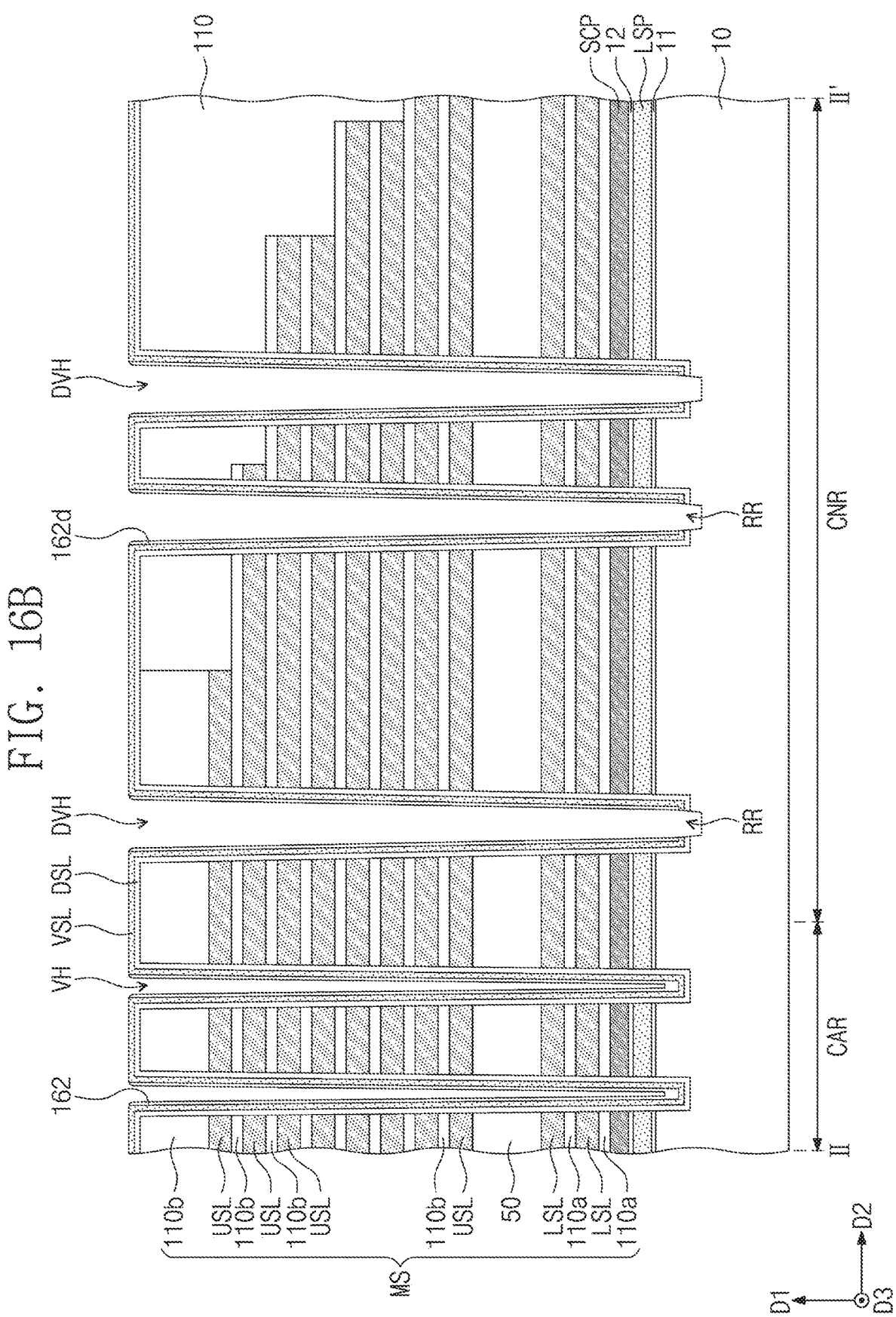

Referring to FIGS. 16A and 16B, a recess region RR may be formed in each of the dummy vertical holes DVH. The formation of the recess region RR may include anisotropically etching the first insulating layer 162L to form a first insulating pattern 162 in each of the vertical holes VH and a first dummy insulating pattern 162d in each of the dummy vertical holes DVH, and anisotropically etching the vertical semiconductor layer VSL and the data storage layer DSL by using the first insulating pattern 162 and the first dummy insulating pattern 162d as etch masks. In some embodiments, the first insulating pattern 162 may be formed to have a pipe shape having a closed bottom end, and the first dummy insulating pattern 162d may be formed to have a pipe shape having an opened bottom end. This may be because the thickness 162L_T1 of the first insulating layer 162L filling the lower portion of each of the vertical holes VH is greater than the thickness 162L_T2 of the first insulating layer 162L filling the lower portion of each of the dummy vertical holes DVH and/or because an etch rate of the first insulating layer 162L in the dummy vertical holes DVH having the relatively great widths is higher than an etch rate of the first insulating layer 162L in the vertical holes VH having the relatively small widths. During the anisotropic etching process of the vertical semiconductor layer VSL and the data storage layer DSL, the vertical semiconductor layer VSL and the data storage layer DSL in the vertical holes VH may be protected by the first insulating patterns 162 and thus may not be etched. The recess region RR may be formed by etching portions of the vertical semiconductor layer VSL and the data storage layer DSL which are not covered by the first dummy insulating pattern 162d in the dummy vertical hole DVH. The recess region RR may extend from each of the dummy vertical holes DVH into the substrate 10.

Figure 17A:
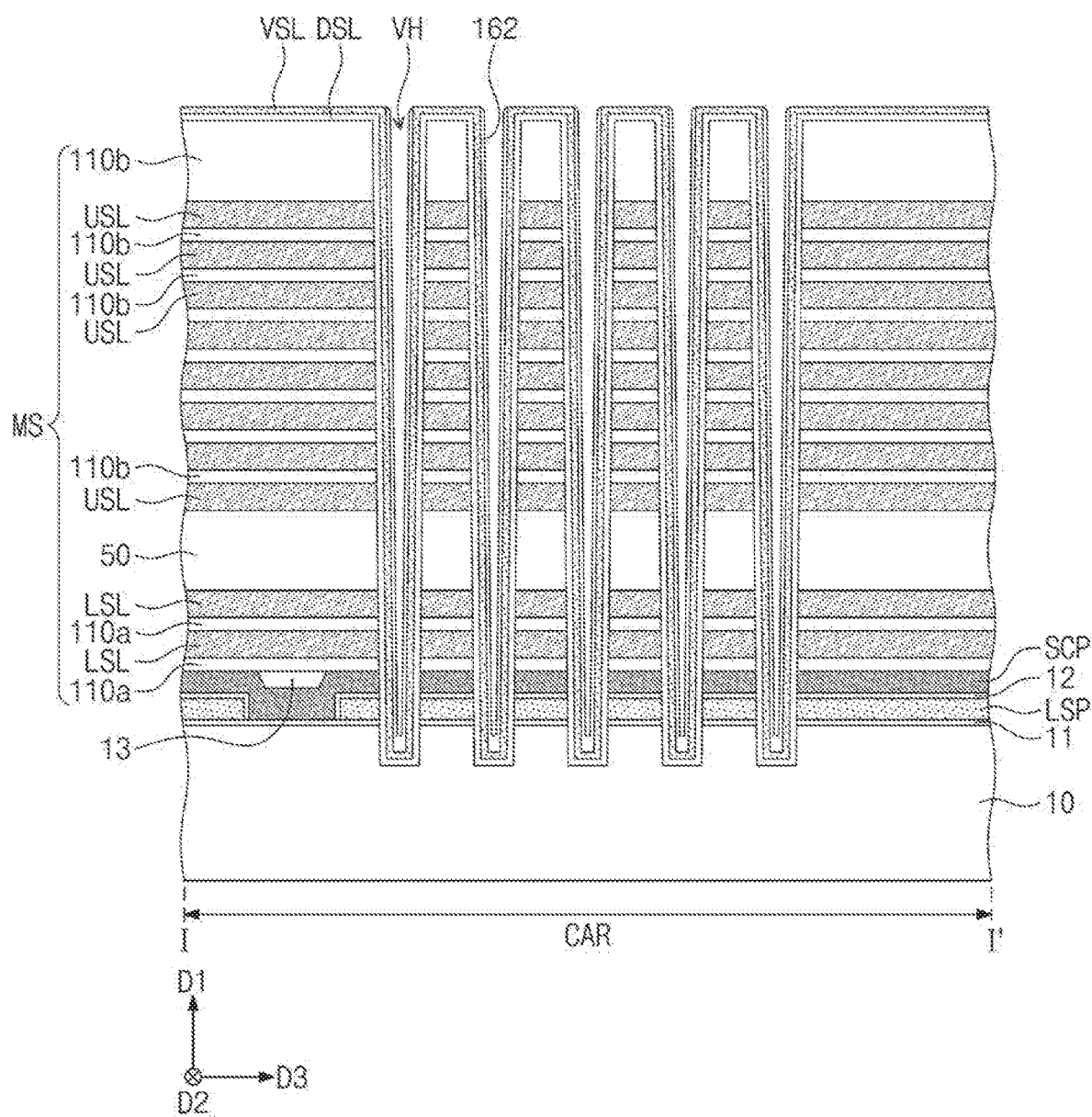
Figure 17B:
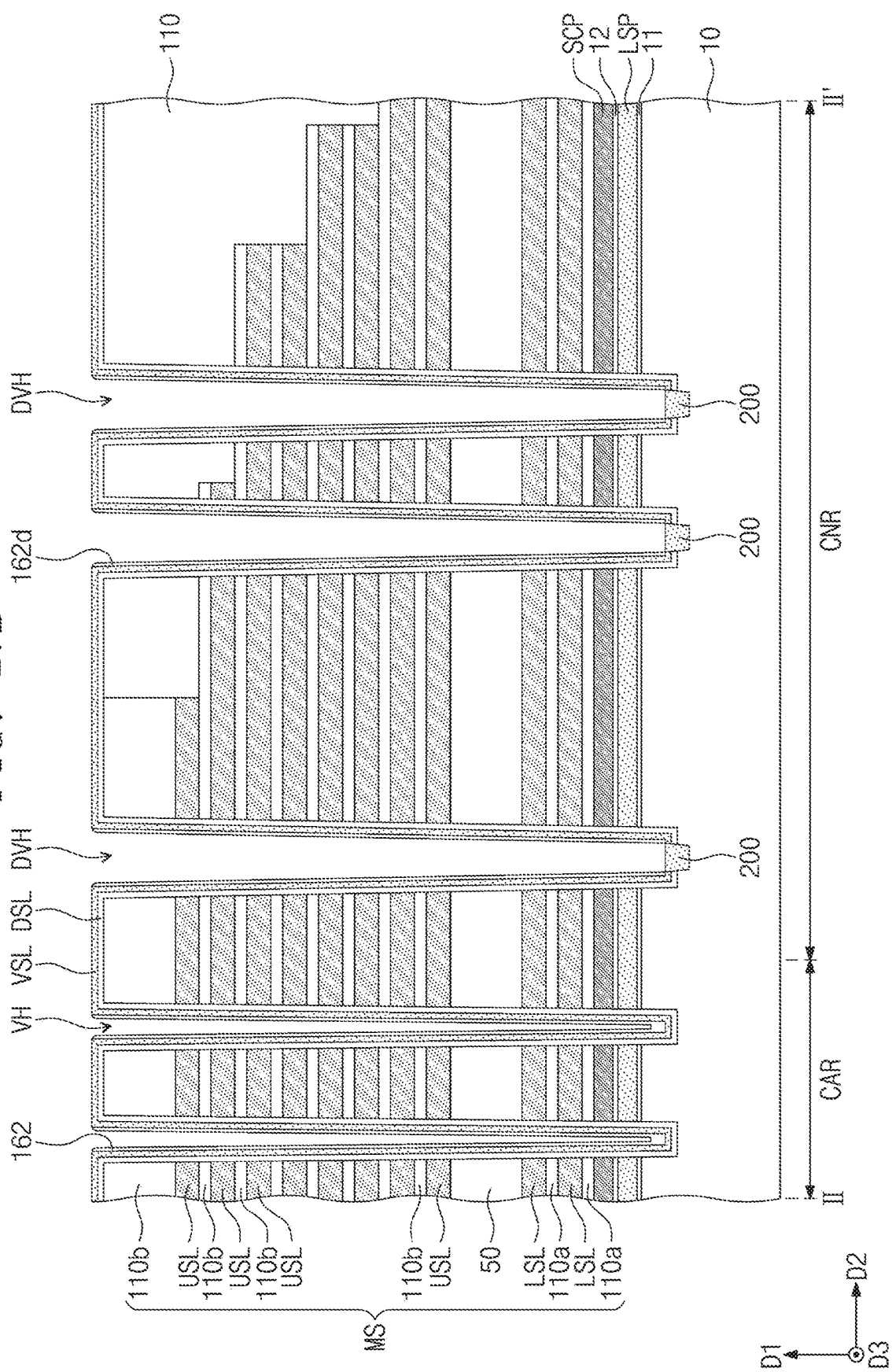

Referring to FIGS. 17A and 17B, a contact pattern 200 may be formed to fill the recess region RR. In some embodiments, the formation of the contact pattern 200 may include forming a conductive layer filling the recess region RR and a portion of each of the vertical holes VH and the dummy vertical holes DVH, and removing a portion of the conductive layer from each of the vertical holes VH and the dummy vertical holes DVH. The conductive layer may be removed by, for example, a wet etching process.

Figure 18A:
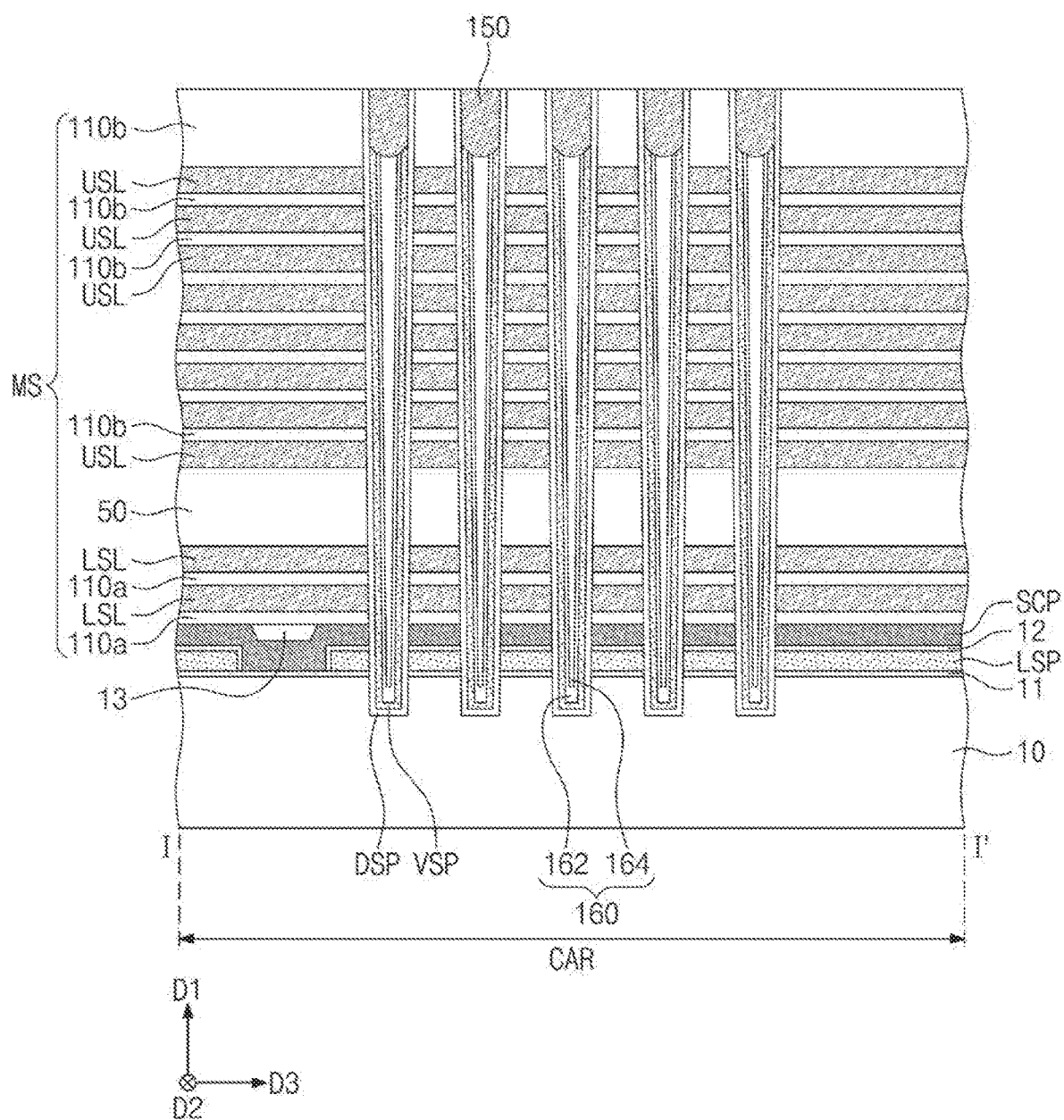
Figure 18B:
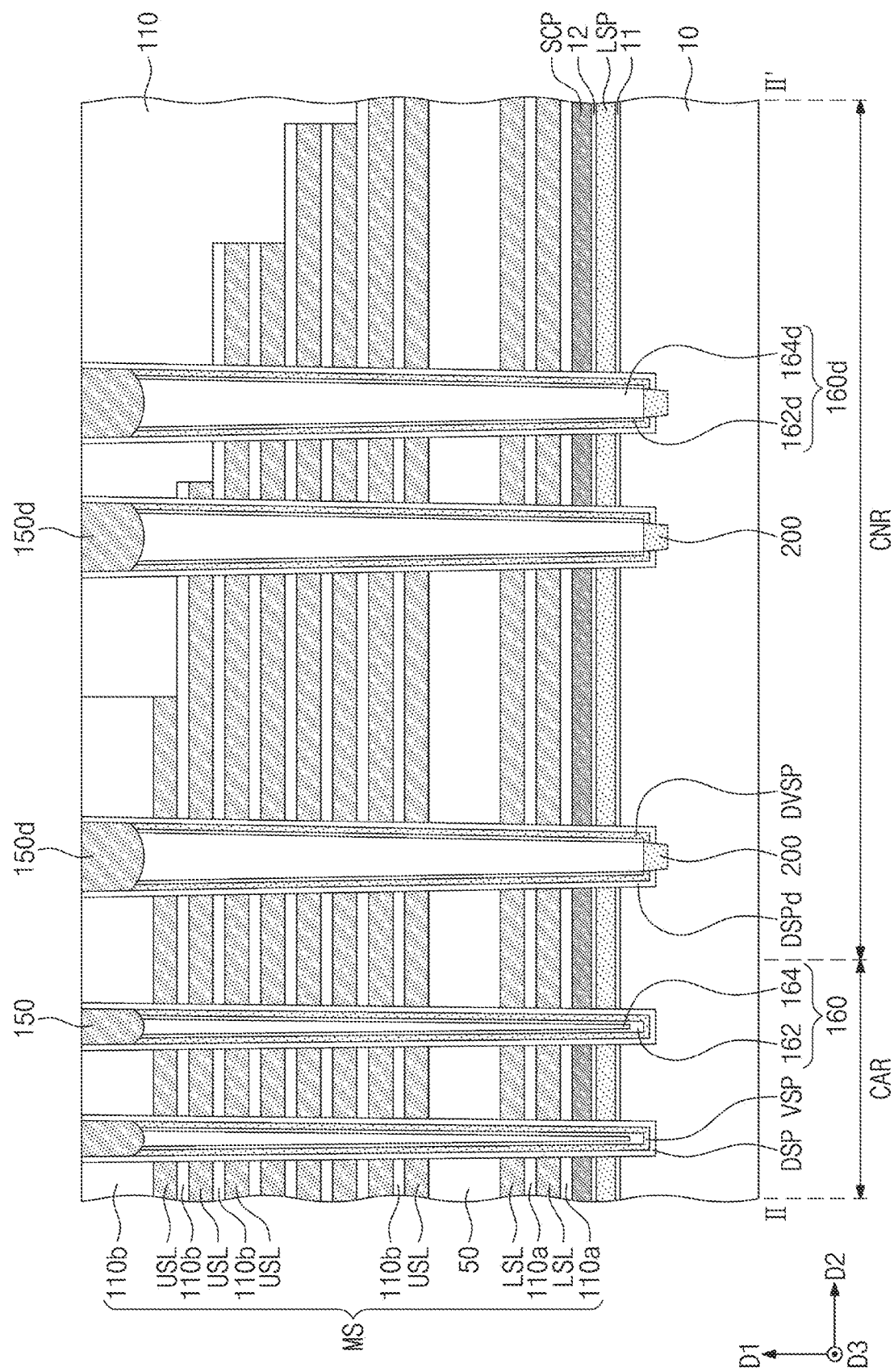

Referring to FIGS. 18A and 18B, a second insulating pattern 164 may be formed to fill a remaining portion of each of the vertical holes VH, and a second dummy insulating pattern 164d may be formed to fill a remaining portion of each of the dummy vertical holes DVH. The formation of the second insulating pattern 164 and the second dummy insulating pattern 164d may include forming a second insulating layer filling the remaining portions of the vertical holes VH and the dummy vertical holes DVH, and planarizing the second insulating layer, the vertical semiconductor layer VSL, and the data storage layer DSL until a top surface of the mold structure MS is exposed. Thus, a data storage pattern DSP, a vertical semiconductor pattern VSP and an insulating pattern 160 may be locally formed in each of the vertical holes VH. In addition, a dummy data storage pattern DSPd, a dummy vertical semiconductor pattern DVSP and a dummy insulating pattern 160d may be locally formed in each of the dummy vertical holes DVH. The insulating pattern 160 may include the first insulating pattern 162 and the second insulating pattern 164, and the dummy insulating pattern 160d may include the first dummy insulating pattern 162d and the second dummy insulating pattern 164d. A conductive pad 150 may be formed on the vertical semiconductor pattern VSP in each of the vertical holes VH, and a dummy conductive pad 150d may be formed on the dummy vertical semiconductor pattern DVSP in each of the dummy vertical holes DVH.

Figure 19A:
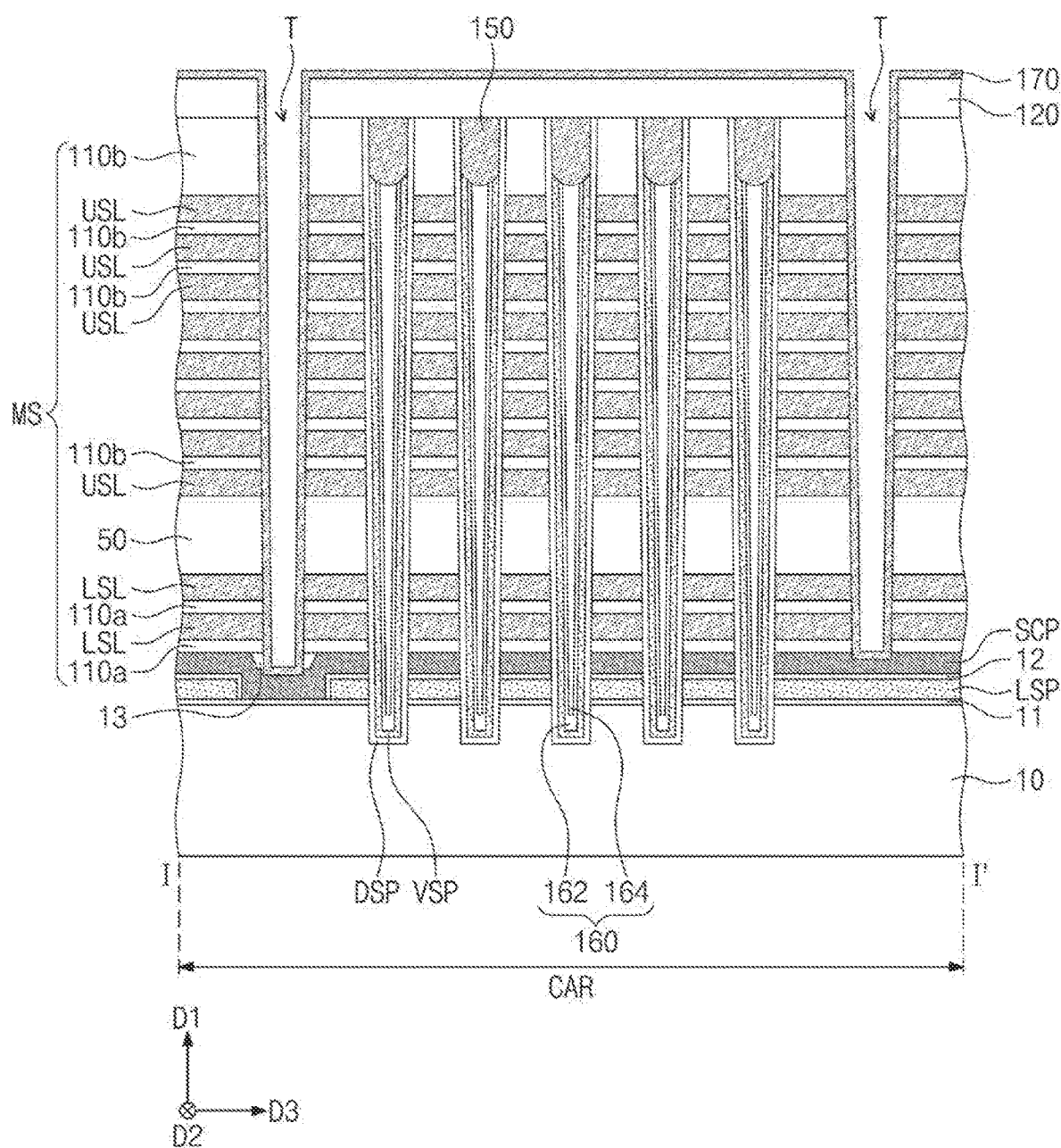
Figure 19B:
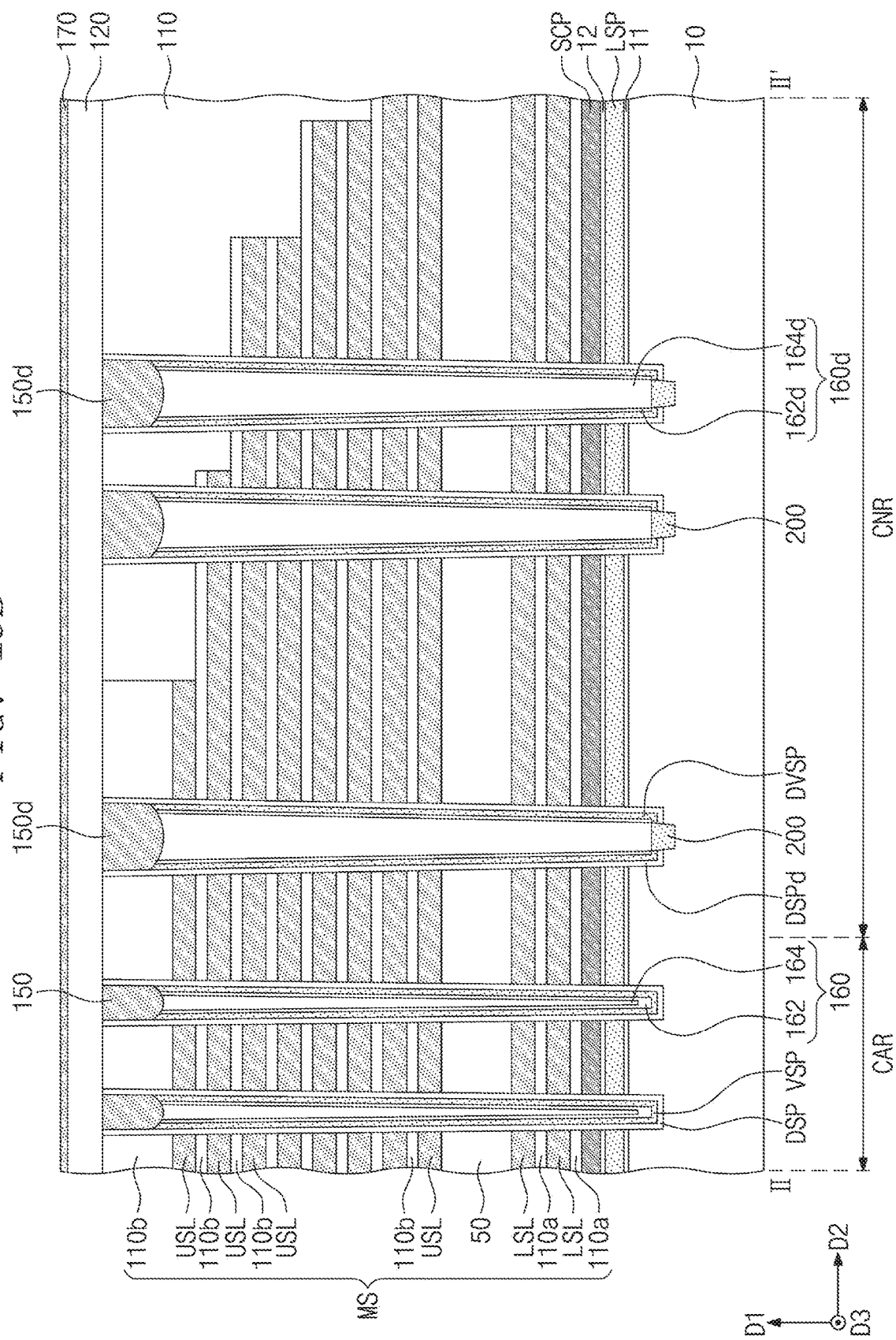

Referring to FIGS. 19A and 19B, a second capping insulating layer 120 may be formed on the mold structure MS and may cover top surfaces of the conductive pad 150 and the dummy conductive pad 150d. Trenches T may be formed to penetrate the second capping insulating layer 120 and the mold structure MS. The trenches T may expose portions of the source conductive layer SCP. The trenches T may extend in the second direction D2 and may be spaced apart from each other in the third direction D3. When the dummy vertical semiconductor pattern DVSP is charged with charges, poor profiles of the trenches T adjacent to the dummy vertical semiconductor pattern DVSP may occur during an etching process for forming the trenches T. However, according to some embodiments of the inventive concepts, the contact pattern 200 may be used as a path through which the charges in the dummy vertical semiconductor pattern DVSP are discharged, and thus it is possible to minimize/reduce the poor profiles of the trenches T adjacent to the dummy vertical semiconductor pattern DVSP. A sacrificial spacer layer 170 may be formed on inner surfaces of the trenches T. The sacrificial spacer layer 170 may partially fill each of the trenches T and may cover the inner surfaces of the trenches T with a substantially uniform thickness. The sacrificial spacer layer 170 may include a material having an etch selectivity with respect to the mold structure MS. For example, the sacrificial spacer layer 170 may include a poly-silicon layer.

Figure 20A:
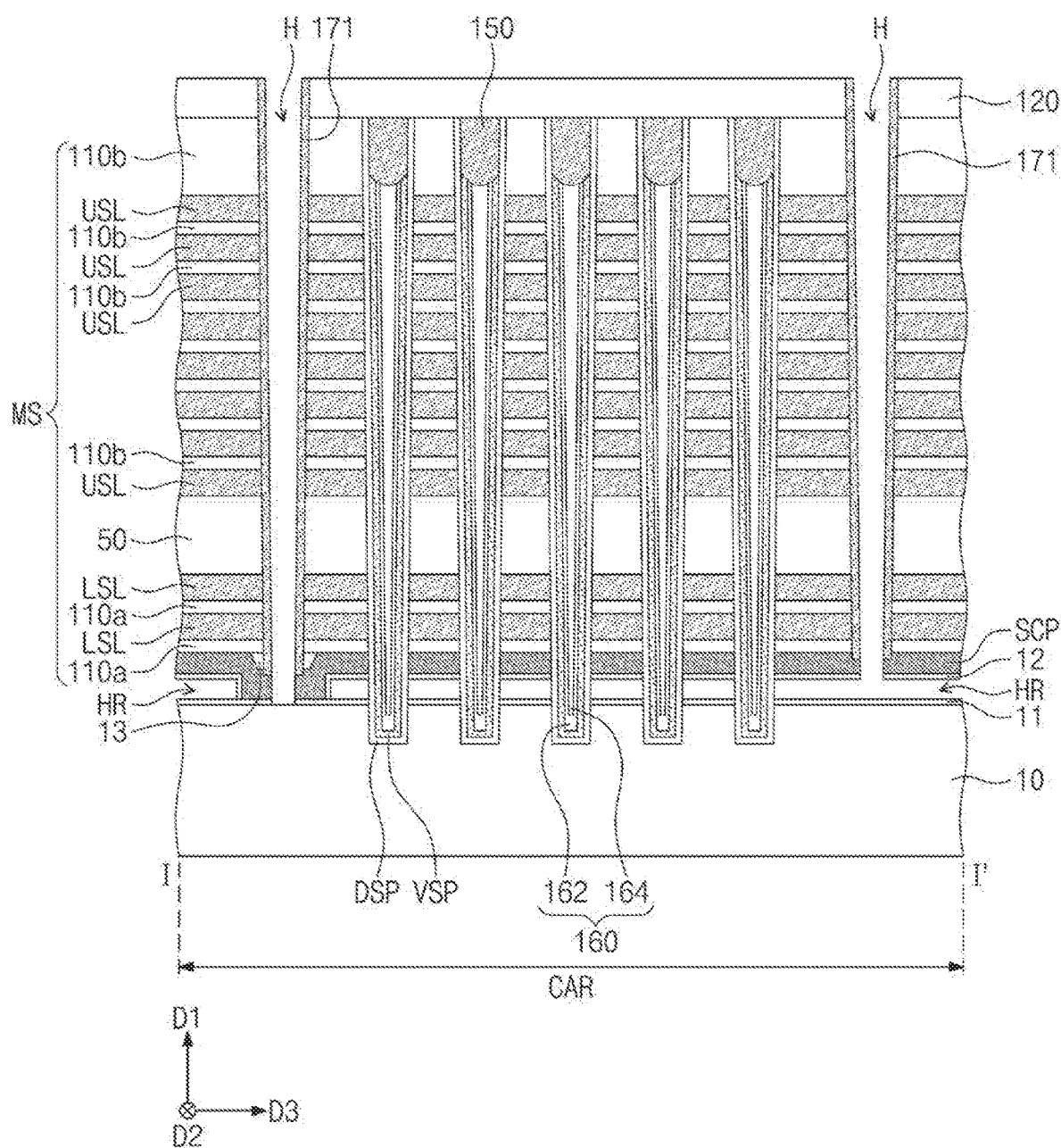
Figure 20B:
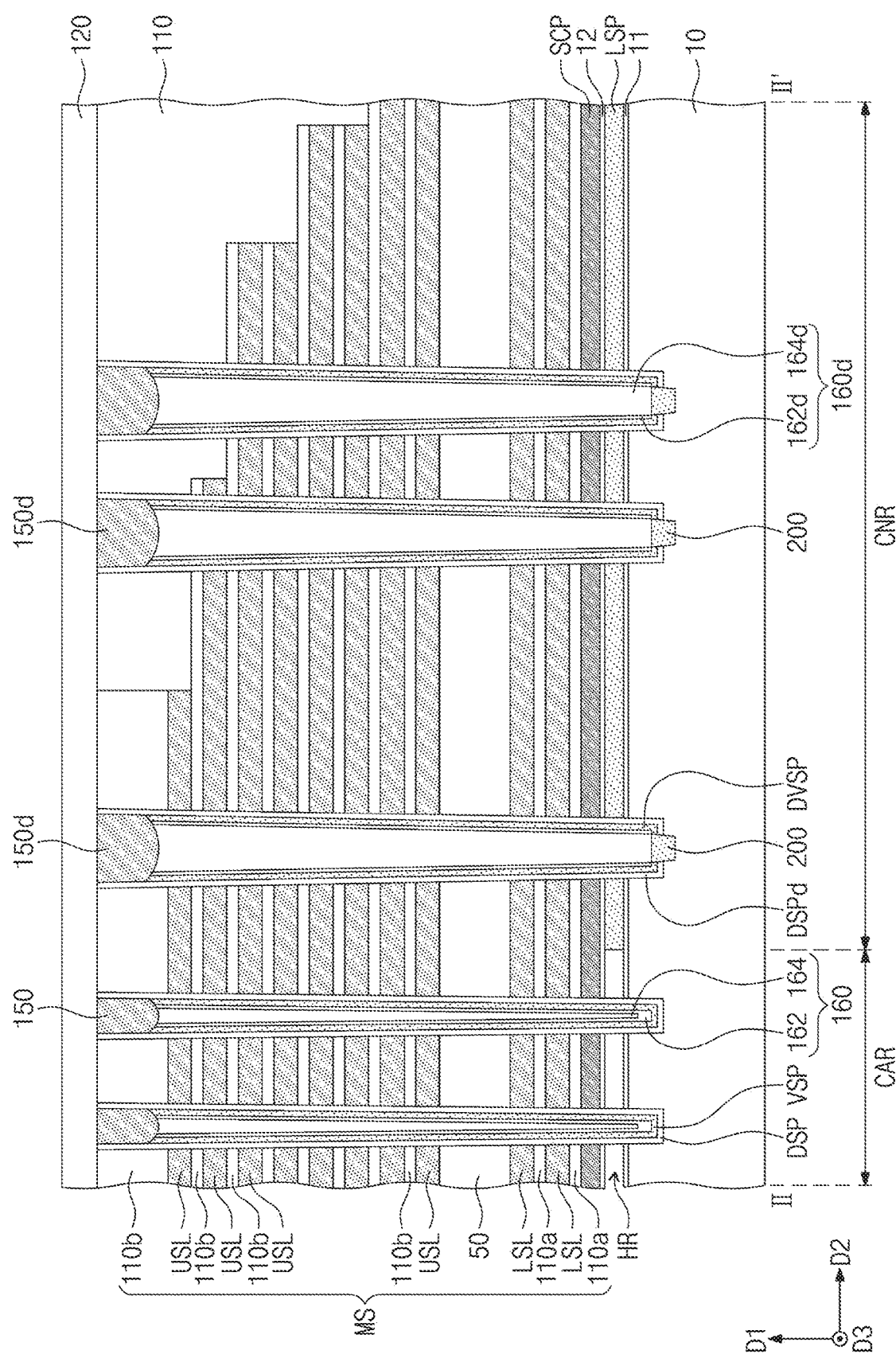

Referring to FIGS. 20A and 20B, the sacrificial spacer layer 170 may be anisotropically etched to form sacrificial spacers 171 on inner sidewalls of the trenches T. A portion of the source conductive layer SCP and a portion of the buffer insulating layer 12 under each of the trenches T may be etched during the anisotropic etching process of the sacrificial spacer layer 170, thereby forming a through-hole H exposing the lower sacrificial pattern LSP in each of the trenches T. The lower sacrificial pattern LSP exposed by the through-hole H may be removed by performing an isotropic etching process. In some embodiments, the lower sacrificial pattern LSP on the cell array region CAR may be removed to form a horizontal recess region HR exposing a portion of the data storage pattern DSP. The lower sacrificial pattern LSP on the connection region CNR may not be removed by the isotropic etching process. Thus, the dummy data storage pattern DSPd may be covered by the lower sacrificial pattern LSP, and the horizontal recess region HR may be locally formed on the cell array region CAR.

Figure 21A:
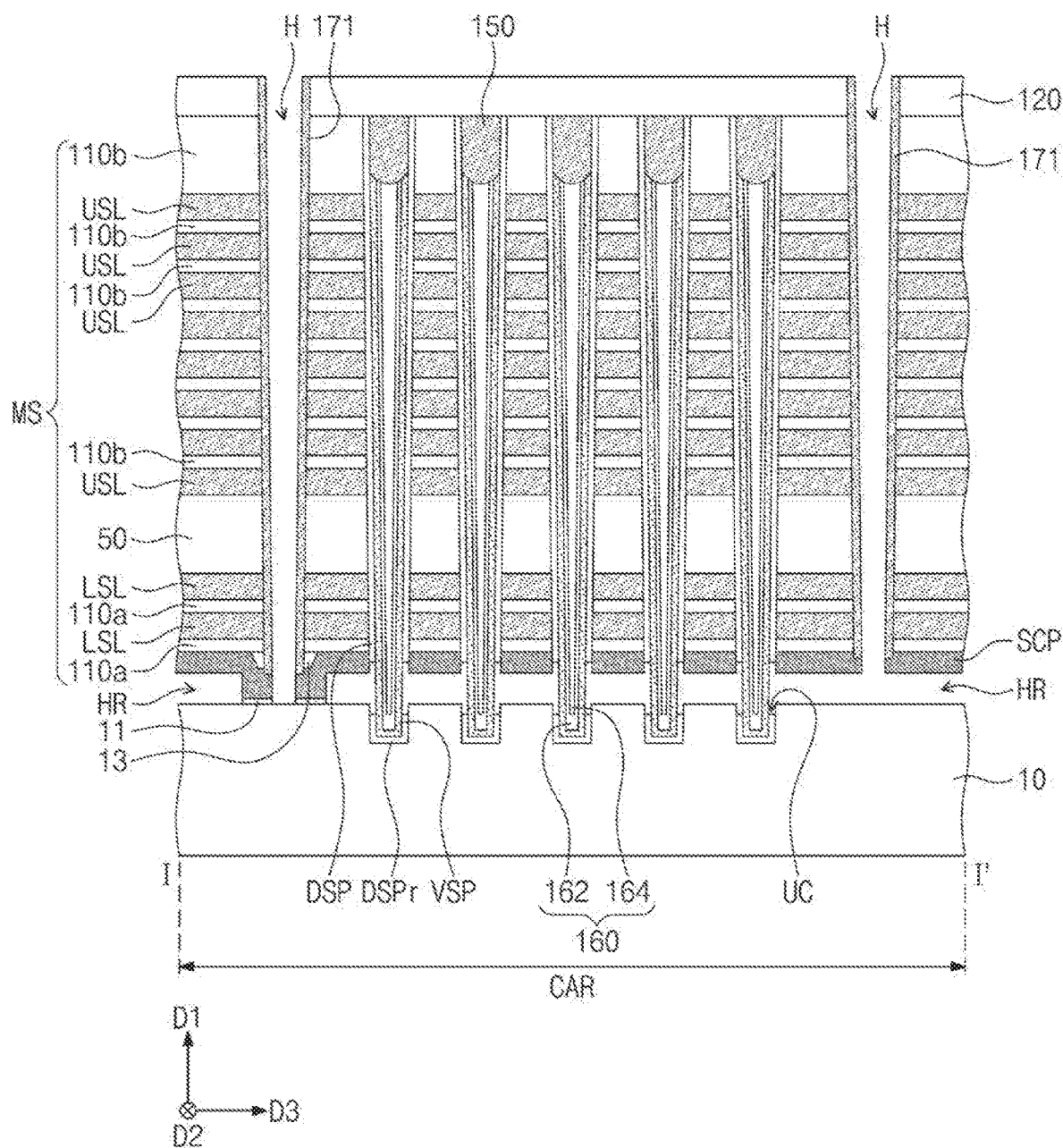
Figure 21B:
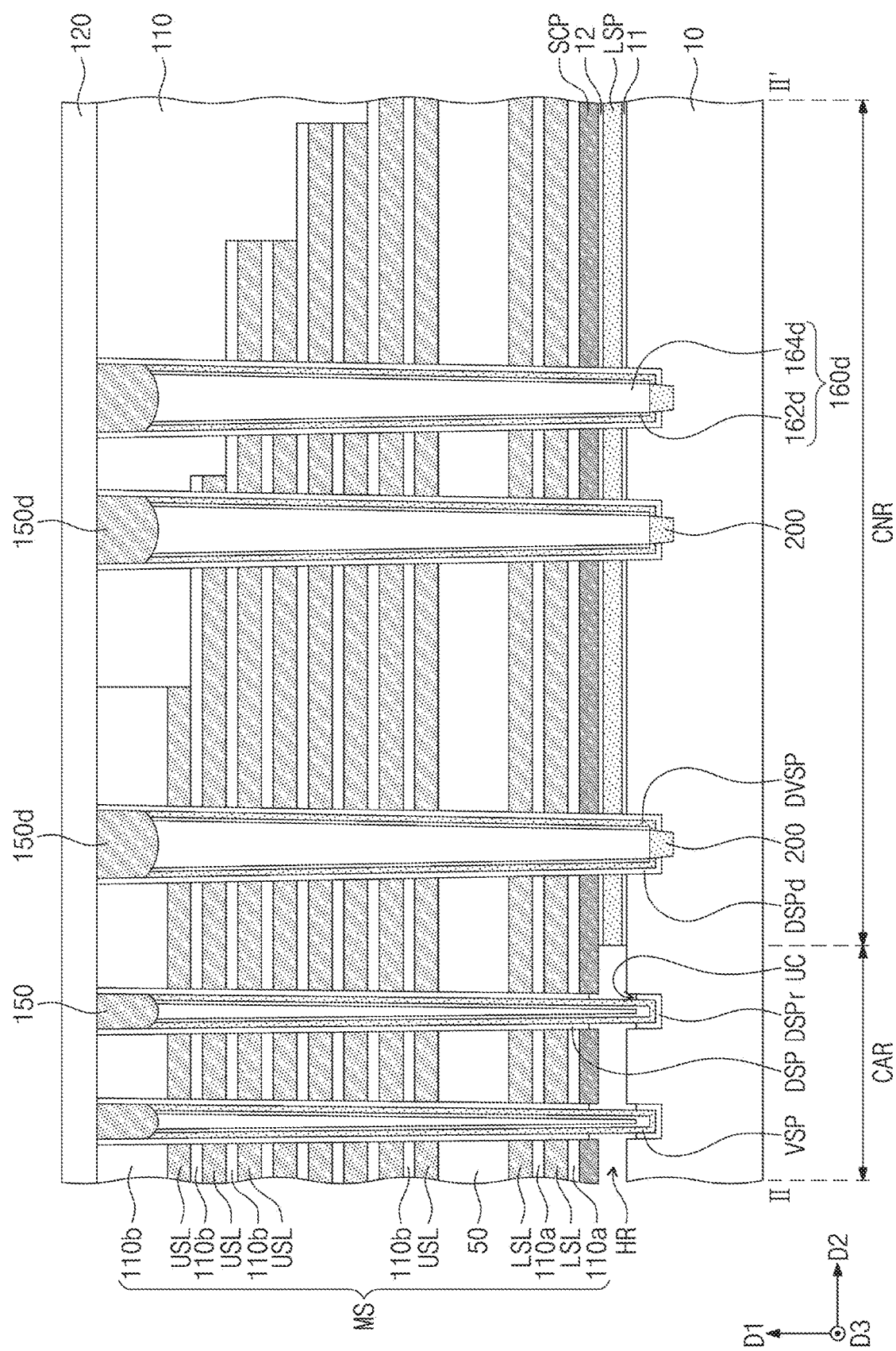

Referring to FIGS. 21A and 21B, a portion of the data storage pattern DSP which is exposed by the horizontal recess region HR may be removed to expose a portion of a sidewall of the vertical semiconductor pattern VSP. Since the portion of the data storage pattern DSP is removed, a residual data storage pattern DSPr may be formed in the substrate 10. The residual data storage pattern DSPr may be vertically spaced apart from the data storage pattern DSP. The removal of the portion of the data storage pattern DSP may include removing a portion of the insulating layer 11 and a portion of the buffer insulating layer 12. Thus, a bottom surface of the source conductive layer SCP and the top surface of the substrate 10 may be exposed by the horizontal recess region HR. An undercut region UC may be formed by the removal of the portion of the data storage pattern DSP. The undercut region UC may be an empty region vertically extending from the horizontal recess region HR (e.g., along the first direction D1). The undercut region UC may extend between the sidewall of the vertical semiconductor pattern VSP and a sidewall of the source conductive layer SCP and between the sidewall of the vertical semiconductor pattern VSP and a sidewall of the substrate 10. The undercut region UC may expose a bottom surface of the data storage pattern DSP and a topmost surface of the residual data storage pattern DSPr.

Figure 22A:
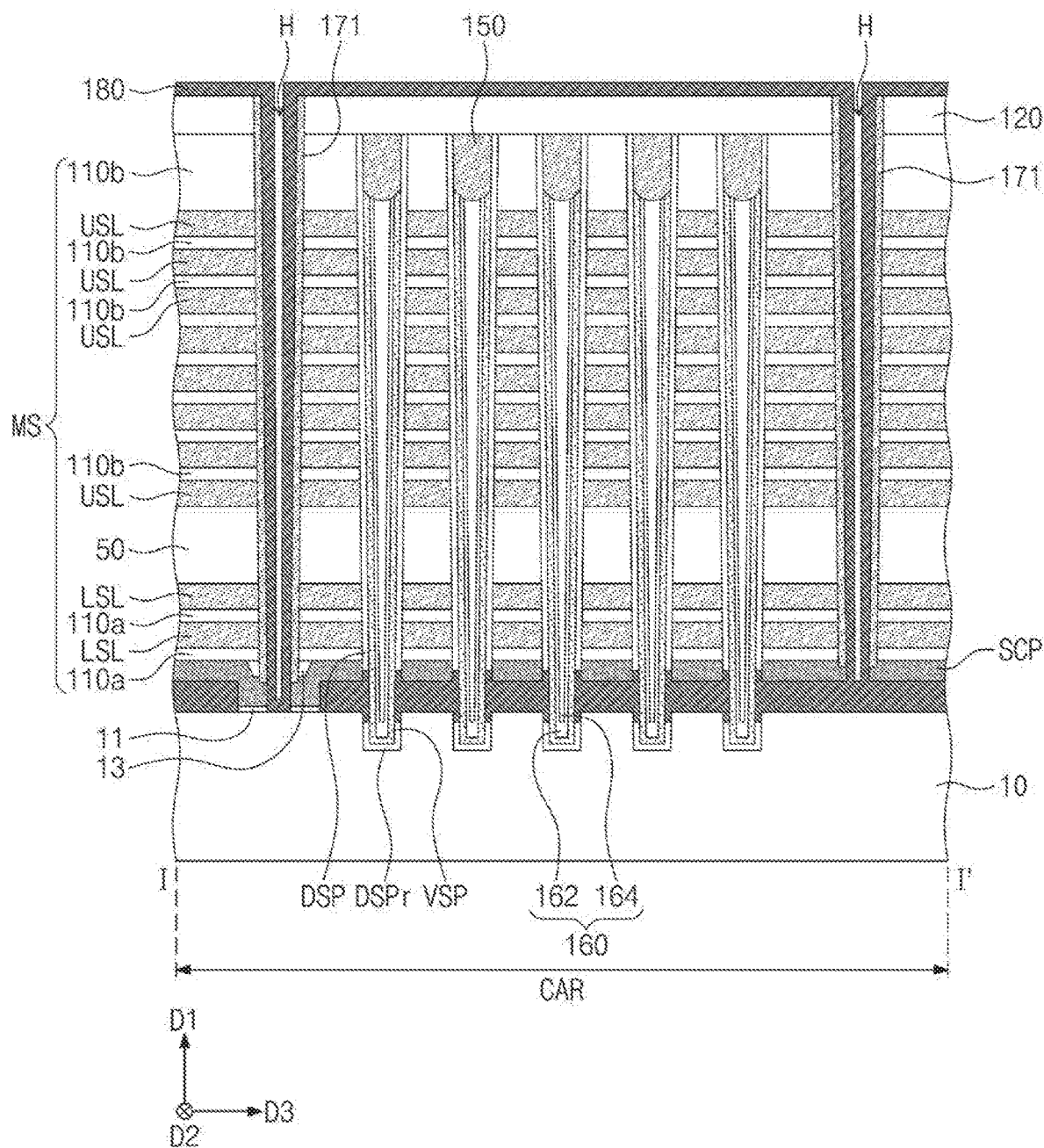
Figure 22B:
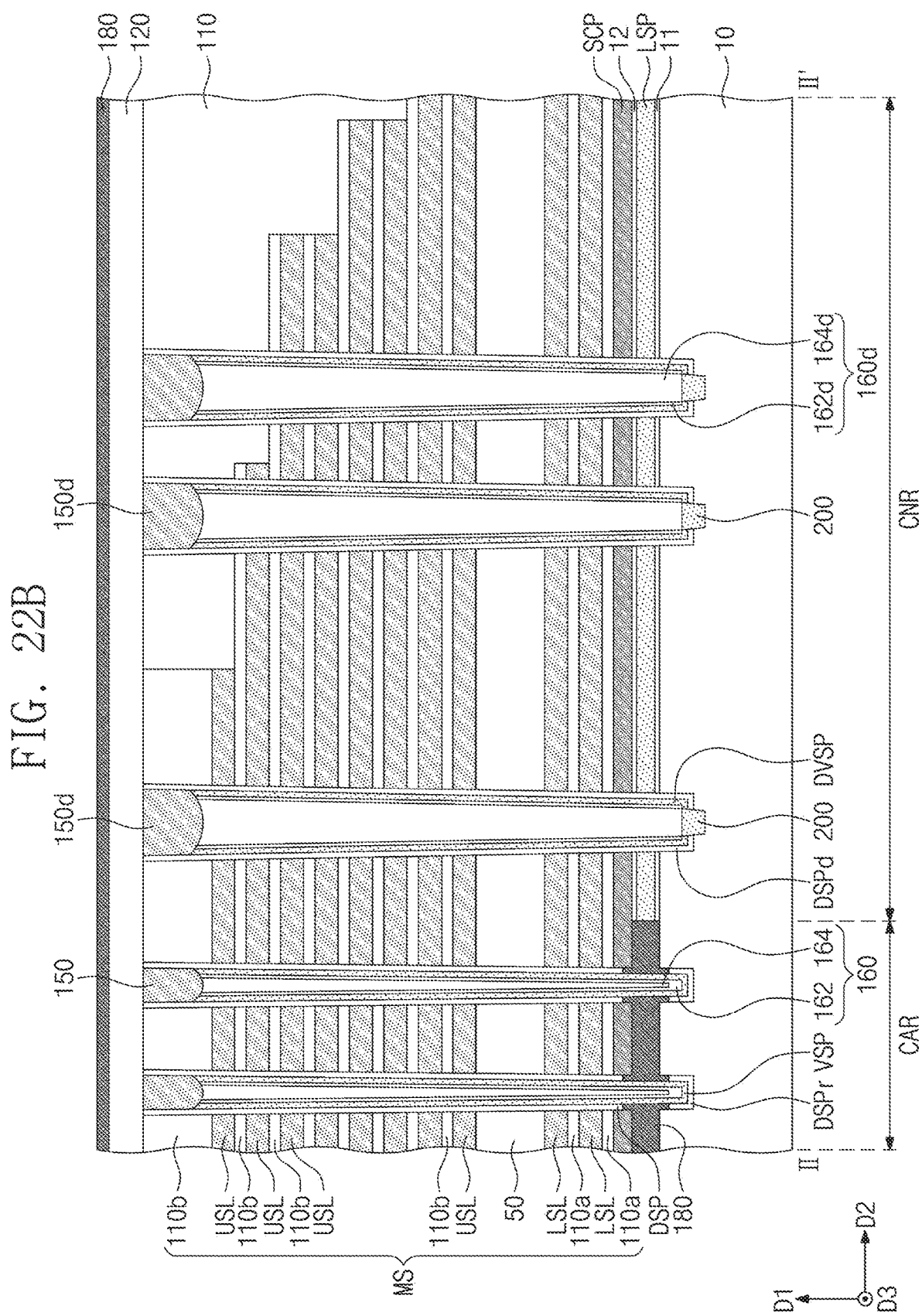

Referring to FIGS. 22A and 22B, a sidewall conductive layer 180 may be formed to fill the undercut region UC, the horizontal recess region HR, and a portion of the through-hole H. The sidewall conductive layer 180 may be a semiconductor layer doped with dopants, for example, a poly-silicon layer doped with N-type dopants. The sidewall conductive layer 180 may cover an inner surface of the through-hole H with a substantially uniform thickness and may not completely fill the through-hole H. The sidewall conductive layer 180 may be in direct contact with the sidewall of the vertical semiconductor pattern VSP and the top surface of the substrate 10.

Figure 23A:
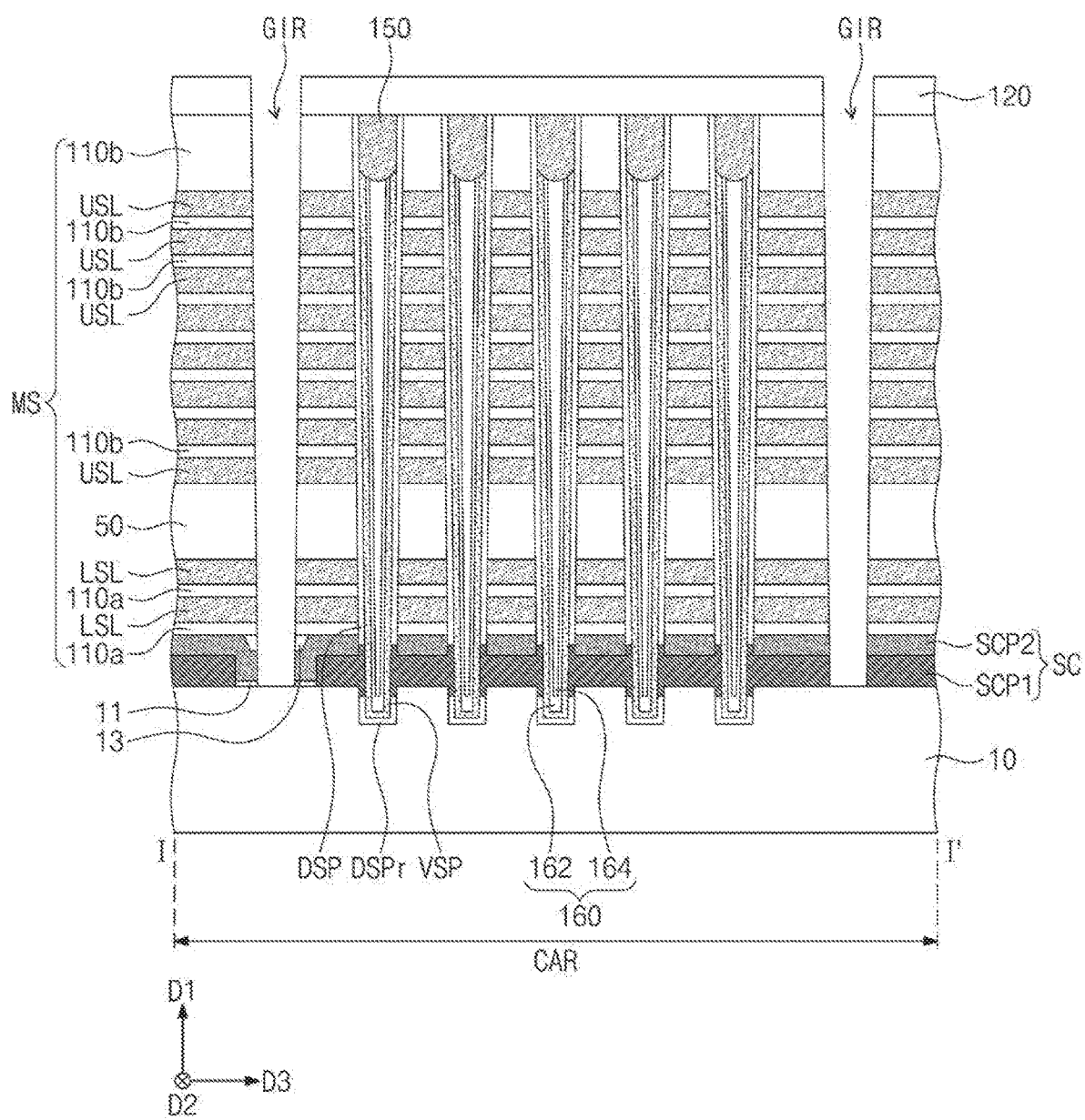

Referring to FIGS. 23A and 23B, an isotropic etching process may be performed on the sidewall conductive layer 180 to form a first source conductive pattern SCP1 in the undercut region UC and the horizontal recess region HR. The sacrificial spacer 171 may be etched in the isotropic etching process of the sidewall conductive layer 180, and thus gate isolation regions GIR exposing sidewalls of the mold structure MS may be formed. The source conductive layer SCP may be etched in the isotropic etching process of the sidewall conductive layer 180, and thus a second source conductive pattern SCP2 may be formed. The first source conductive pattern SCP1 and the second source conductive pattern SCP2 may be referred to as a source structure SC. The gate isolation regions GIR may expose the sidewalls of the mold structure MS, sidewalls of the source structure SC, and the top surface of the substrate 10. In some embodiments, the lower sacrificial pattern LSP, the insulating layer 11 and the buffer insulating layer 12 on the connection region CNR may be replaced with the first source conductive pattern SCP1, unlike FIG. 23B. In this case, the first source conductive pattern SCP1 may extend in the second direction D2 from the cell array region CAR into/onto the connection region CNR and may be disposed between the second source conductive pattern SCP2 and the substrate 10 on the connection region CNR of the substrate 10. In this case, a sidewall of a lower portion of the dummy vertical semiconductor pattern DVSP may be in contact with the first source conductive pattern SCP1, as described with reference to FIG. 9D.

Figure 24A:
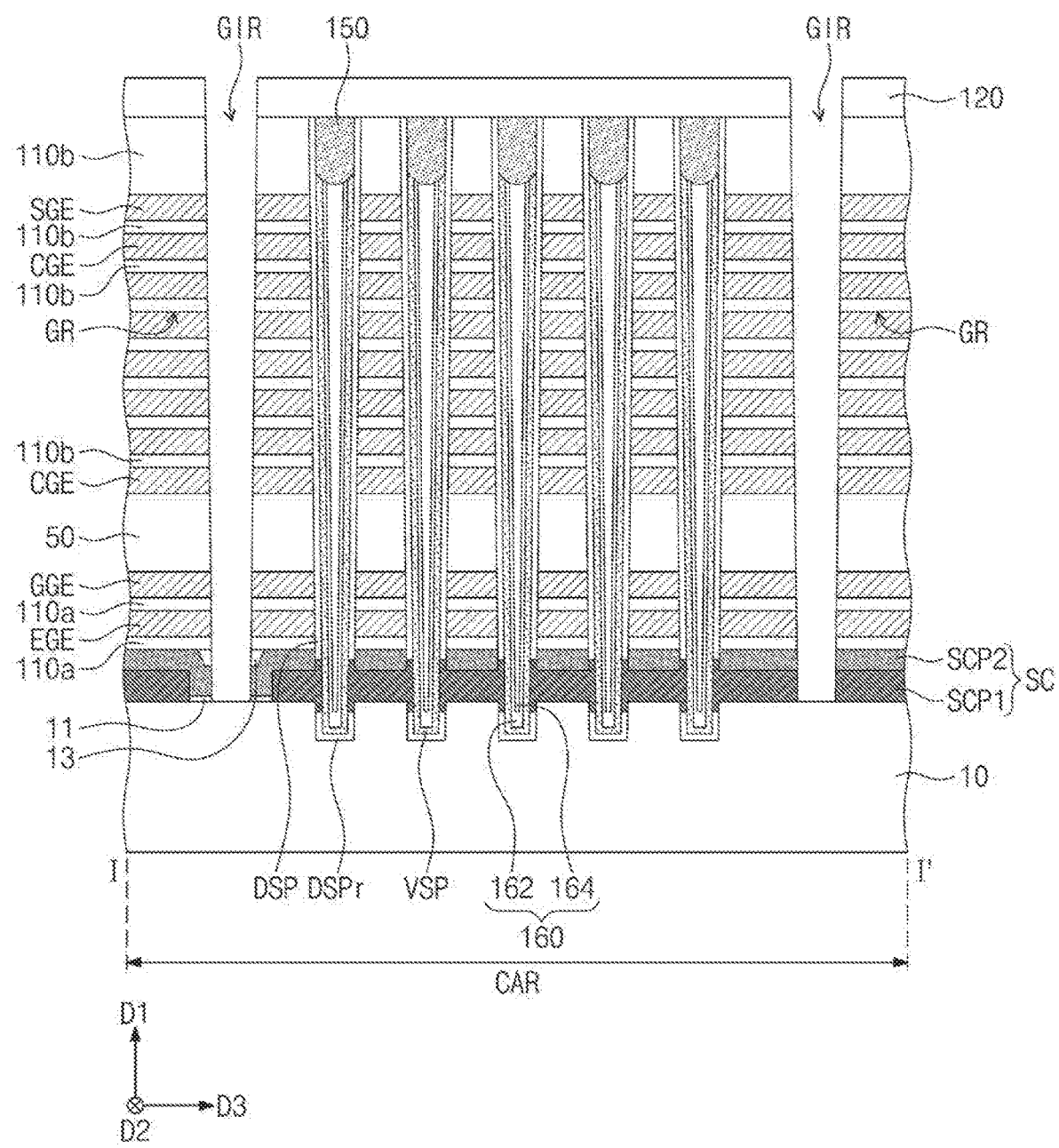
Figure 24B:
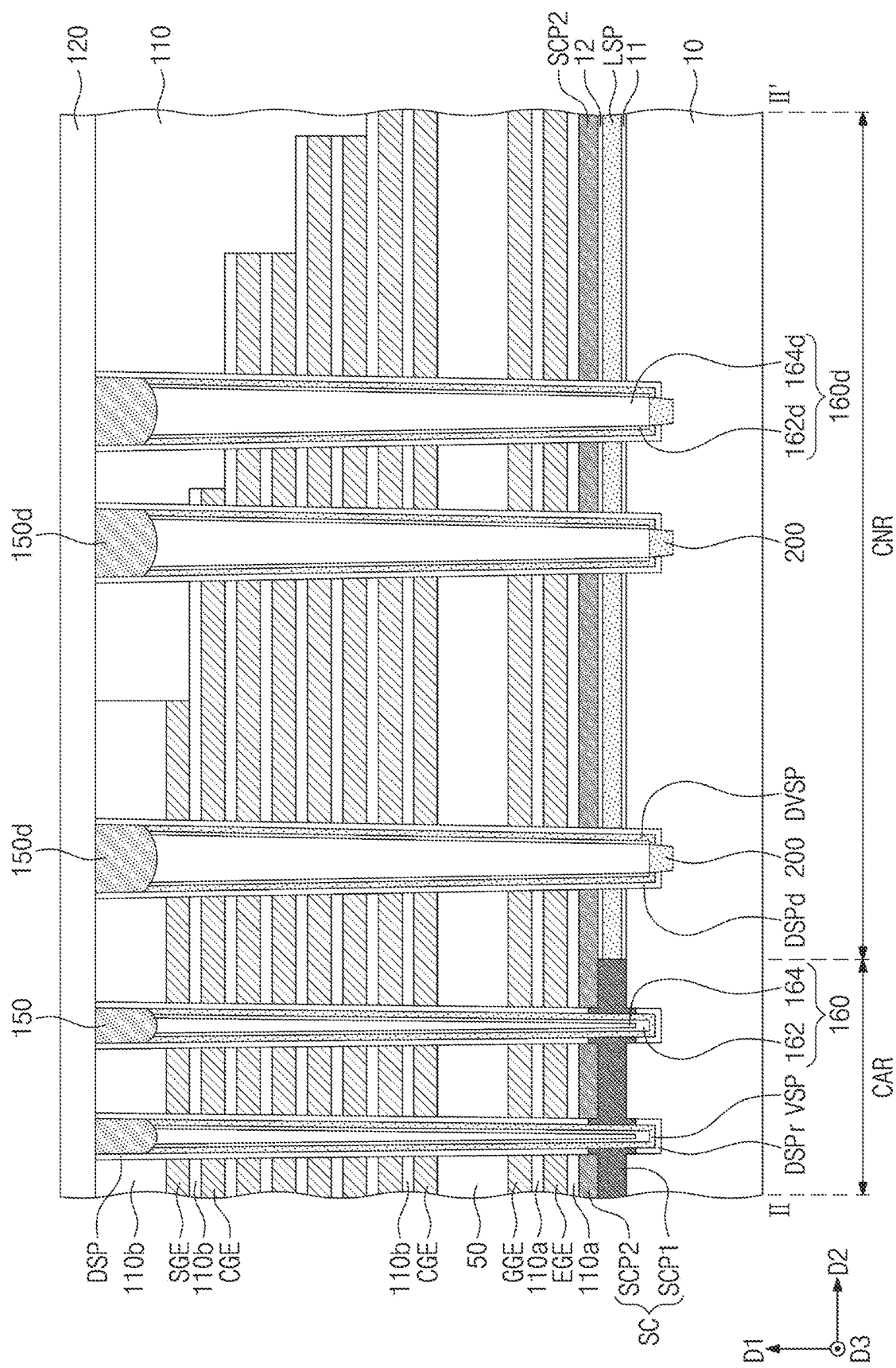

Referring to FIGS. 24A and 24B, the lower and upper sacrificial layers LSL and USL exposed by the gate isolation regions GIR may be removed. Thus, gate regions GR may be formed between the lower insulating layers 110a and between the upper insulating layers 110b. The formation of the gate regions GR may include isotropically etching the lower and upper sacrificial layers LSL and USL. Each of the gate regions GR may horizontally extend from a corresponding one of the gate isolation regions GIR and may expose a portion of a sidewall of each of the data storage pattern DSP and the dummy data storage pattern DSPd. Thereafter, gate electrodes EGE, GGE, CGE and SGE may be formed to fill the gate regions GR, respectively.

Referring again to FIGS. 3 and 4, common source plugs CSP may be formed in the gate isolation regions GIR, respectively, and sidewall insulating spacers SS may be formed in the gate isolation regions GIR. The common source plugs CSP and the sidewall insulating spacers SS may be locally formed in the gate isolation regions GIR. A first contact 125 may be formed in the second capping insulating layer 120 so as to be connected to the conductive pad 150. An interlayer insulating layer 130 may be formed on the second capping insulating layer 120 to cover top surfaces of the common source plugs CSP. A second contact 135 may be formed in the interlayer insulating layer 130 so as to be connected to the first contact 125. Bit lines BL may be formed on the interlayer insulating layer 130.

FIG. 25 is a cross-sectional view corresponding to the line II-II' of FIG. 2 to illustrate a method of manufacturing a 3D semiconductor memory device, according to some embodiments of the inventive concepts. Hereinafter, differences between FIG. 25 and the above embodiments described with reference to FIGS. 10A to 24B will be mainly mentioned for the purpose of ease and convenience in explanation.

Referring to FIGS. 18A and 25, a contact pattern 200 may be formed to fill the recess region RR. A second insulating pattern 164 may be formed to fill a remaining portion of each of the vertical holes VH, and a second dummy insulating pattern 164d may be formed to fill a remaining portion of each of the dummy vertical holes DVH. In some embodiments, the second dummy insulating pattern 164d and the contact pattern 200 may include the same material and may be in contact with each other to constitute a single unitary body, as described with reference to FIG. 9B. The formation of the contact pattern 200, the second insulating pattern 164 and the second dummy insulating pattern 164d may include forming an insulating layer filling the recess region RR and the remaining portions of the vertical holes VH and the dummy vertical holes DVH, and planarizing the insulating layer, the vertical semiconductor layer VSL, and the data storage layer DSL until a top surface of the mold structure MS is exposed.

Figure 26:
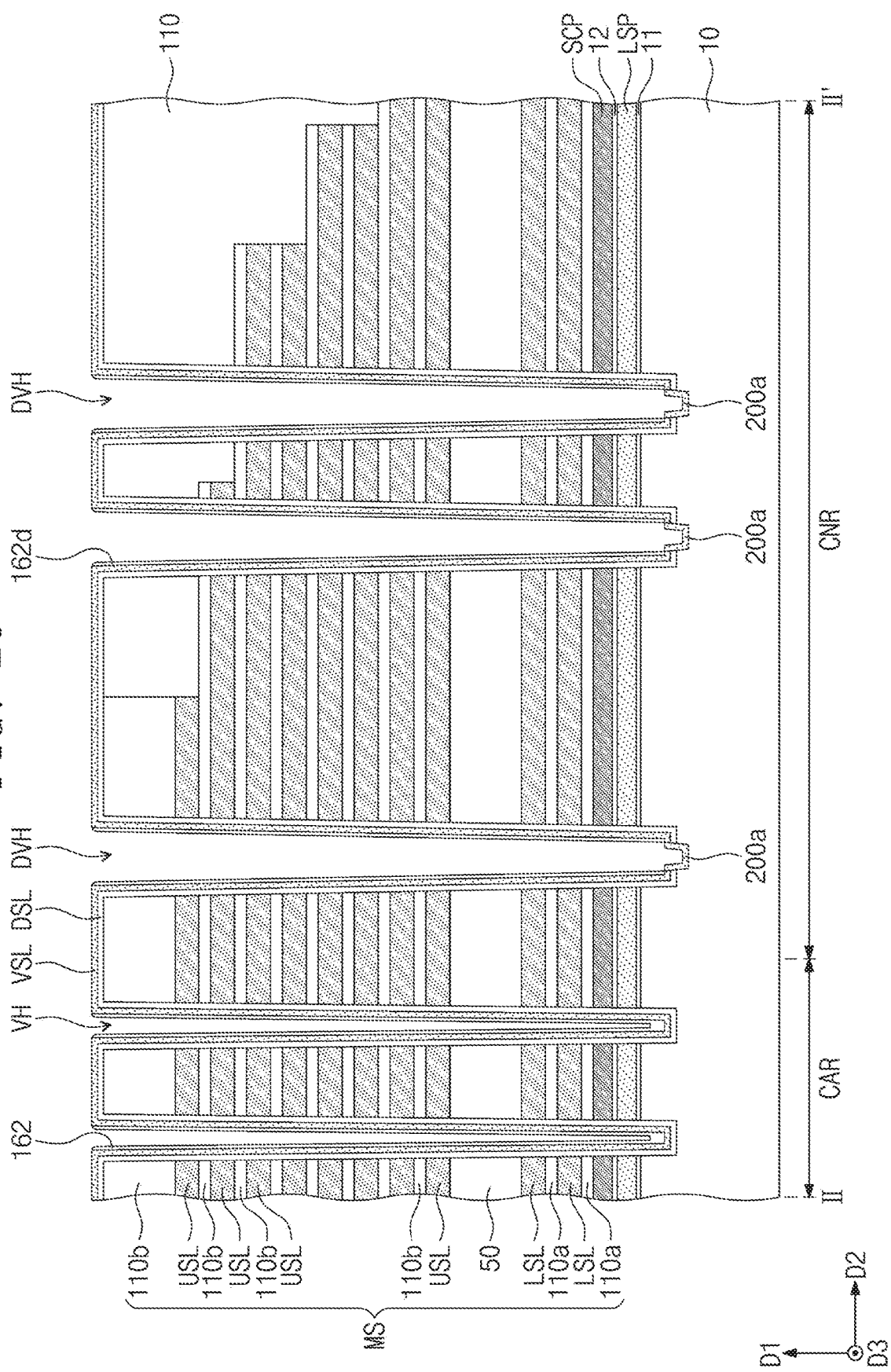
FIGS. 26 and 27 are cross-sectional views corresponding to the line II-II' of FIG. 2 to illustrate a method of manufacturing a 3D semiconductor memory device, according to some embodiments of the inventive concepts.
Figure 27:
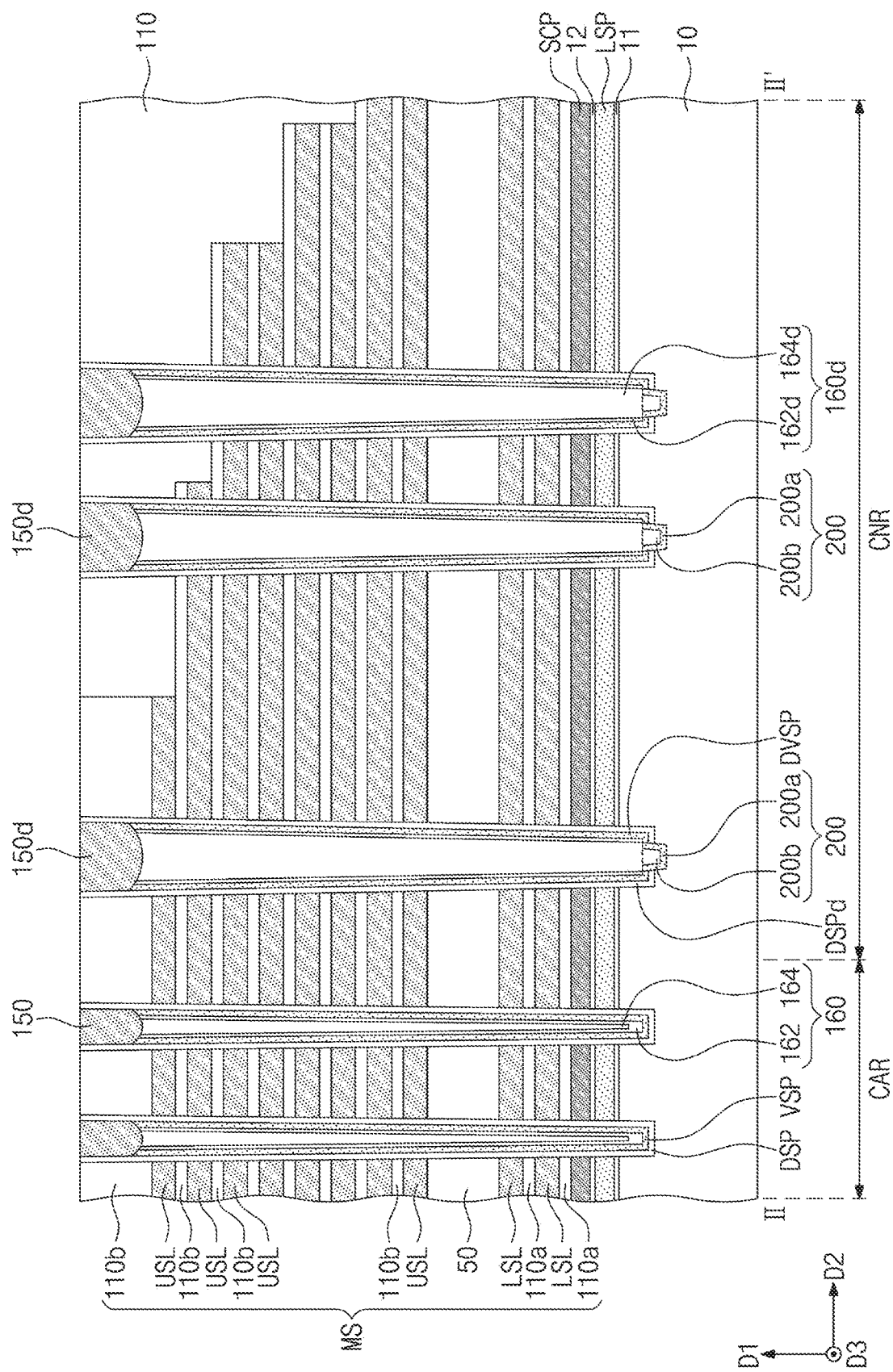

FIGS. 26 and 27 are cross-sectional views corresponding to the line II-II' of FIG. 2 to illustrate a method of manufacturing a 3D semiconductor memory device, according to some embodiments of the inventive concepts. Hereinafter, differences between FIGS. 26 and 27 and the above embodiments described with reference to FIGS. 10A to 24B will be mainly mentioned for the purpose of ease and convenience in explanation.

Referring to FIGS. 17A and 26, a first portion 200a of a contact pattern may be formed to partially fill the recess region RR. In some embodiments, the formation of the first portion 200a of the contact pattern may include forming a conductive layer filling a portion of each of the vertical holes VH and the dummy vertical holes DVH and covering an inner surface of the recess region RR with a substantially uniform thickness, and removing a portion of the conductive layer from each of the vertical holes VH and the dummy vertical holes DVH. The conductive layer may be removed by, for example, a wet etching process.

Referring to FIGS. 18A and 27, a second portion 200b of the contact pattern may be formed to fill a remaining portion of the recess region RR. The first portion 200a and the second portion 200b may constitute a contact pattern 200. A second insulating pattern 164 may be formed to fill a remaining portion of each of the vertical holes VH, and a second dummy insulating pattern 164d may be formed to fill a remaining portion of each of the dummy vertical holes DVH. In some embodiments, the second dummy insulating pattern 164d and the second portion 200b of the contact pattern 200 may include the same material and may be in contact with each other to constitute a single unitary body, as described with reference to FIG. 9C. The formation of the second portion 200b of the contact pattern 200, the second insulating pattern 164 and the second dummy insulating pattern 164d may include forming an insulating layer filling the remaining portions of the vertical holes VH, the dummy vertical holes DVH and the recess region RR, and planarizing the insulating layer, the vertical semiconductor layer VSL, and the data storage layer DSL until a top surface of the mold structure MS is exposed.

According to some embodiments of the inventive concepts, it is possible to minimize/reduce defects (e.g., a poor profile of an adjacent pattern) which may occur by charges in the dummy vertical semiconductor pattern. Thus, the 3D semiconductor memory device with excellent reliability may be provided or realized.

While the inventive concepts have been described with reference to example embodiments, it will be apparent to those skilled in the art that various changes and modifications may be made without departing from the scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
a substrate;
an electrode structure on the substrate, the electrode structure comprising gate electrodes stacked in a first direction vertical to a top surface of the substrate, and the gate electrodes including electrode pad regions; and
a dummy vertical structure penetrating one of the electrode pad regions,
wherein the dummy vertical structure comprises:
a dummy vertical semiconductor pattern extending substantially in the first direction to penetrate the one of the electrode pad regions and extending into the substrate;
a dummy data storage pattern between the dummy vertical semiconductor pattern and the substrate; and
a contact pattern extending from a bottom portion of the dummy vertical semiconductor pattern, penetrating a portion of the dummy data storage pattern, and extending into the substrate.

2. The 3D semiconductor memory device of claim 1, further comprising a source conductive pattern between the substrate and the electrode structure.

3. The 3D semiconductor memory device of claim 2,
wherein the one of the electrode pad regions comprises a first step of a stair structure that is provided by the gate electrodes,
wherein the dummy vertical semiconductor pattern penetrates the first step, penetrates the source conductive pattern under the first step, and extends into the substrate, and
wherein the 3D semiconductor memory device further comprises another dummy vertical structure that penetrates a second step of the stair structure.

4. The 3D semiconductor memory device of claim 3,
wherein the dummy vertical structure is wider, in a second direction parallel to the top surface of the substrate, than a vertical structure that penetrates a portion of the electrode structure that is spaced apart from the dummy vertical structure in the second direction.

5. The 3D semiconductor memory device of claim 4,
wherein the portion of the dummy data storage pattern is in contact with the contact pattern and is between a bottom surface of the dummy vertical semiconductor pattern and the substrate.

6. The 3D semiconductor memory device of claim 4,
wherein the dummy data storage pattern extends substantially in the first direction between the dummy vertical semiconductor pattern and the electrode structure and between the dummy vertical semiconductor pattern and the source conductive pattern.

7. The 3D semiconductor memory device of claim 1,
wherein the dummy vertical structure further comprises:
a dummy insulating pattern on an inner sidewall of the dummy vertical semiconductor pattern and in contact with a top surface of the contact pattern.

8. The 3D semiconductor memory device of claim 7,
wherein the contact pattern includes a different material from that of the dummy insulating pattern, and
wherein the dummy vertical semiconductor pattern is in contact with a sidewall of the contact pattern.

9. The 3D semiconductor memory device of claim 7,
wherein the contact pattern comprises: a first portion in contact with a bottom portion of the dummy vertical semiconductor pattern; and a second portion spaced apart from the dummy vertical semiconductor pattern with the first portion interposed therebetween,
wherein the first portion includes a different material from that of the dummy insulating pattern, and the second portion includes the same material as the dummy insulating pattern.

10. The 3D semiconductor memory device of claim 9,
wherein the dummy insulating pattern and the second portion of the contact pattern are in contact with each other to provide a single unitary body.

11. A three-dimensional (3D) semiconductor memory device comprising:
a substrate including a cell array region and a connection region;
an electrode structure on the substrate, the electrode structure comprising gate electrodes stacked in a first direction vertical to a top surface of the substrate, and the gate electrodes including electrode pad regions on the connection region;
a vertical semiconductor pattern penetrating the electrode structure on the cell array region;
a dummy vertical semiconductor pattern penetrating one of the electrode pad regions on the connection region and extending into the substrate;
a dummy data storage pattern between the dummy vertical semiconductor pattern and the substrate; and
a contact pattern extending from a bottom portion of the dummy vertical semiconductor pattern into the substrate and penetrating a portion of the dummy data storage pattern.

12. The 3D semiconductor memory device of claim 11, wherein the vertical semiconductor pattern extends into the substrate, the 3D semiconductor memory device further comprising:
a residual data storage pattern between the vertical semiconductor pattern and the substrate.

13. The 3D semiconductor memory device of claim 12,
wherein the vertical semiconductor pattern is electrically isolated from the substrate by the residual data storage pattern, and
wherein the dummy vertical semiconductor pattern is connected to the substrate through the contact pattern.

14. The 3D semiconductor memory device of claim 11, further comprising:
a source conductive pattern between the substrate and the electrode structure, and
wherein the dummy vertical semiconductor pattern is wider, in a second direction parallel to the top surface of the substrate, than the vertical semiconductor pattern.

15. The 3D semiconductor memory device of claim 14,
wherein the dummy data storage pattern extends between the dummy vertical semiconductor pattern and the source conductive pattern and between the dummy vertical semiconductor pattern and the electrode structure.

16. The 3D semiconductor memory device of claim 14, further comprising:
a dummy insulating pattern on the contact pattern and on an inner sidewall of the dummy vertical semiconductor pattern.

17. The 3D semiconductor memory device of claim 16, wherein at least a portion of the contact pattern includes a conductive material and is in contact with the dummy vertical semiconductor pattern.

18. A three-dimensional (3D) semiconductor memory device comprising:
   a substrate;
   an electrode structure on the substrate, the electrode structure comprising gate electrodes stacked in a first direction vertical to a top surface of the substrate, and the gate electrodes including electrode pad regions;
   a source conductive pattern between the substrate and the electrode structure;
   a dummy vertical semiconductor pattern that penetrates one of the electrode pad regions, penetrates the source conductive pattern under the one of the electrode pad regions, and extends into the substrate;
   a dummy data storage pattern between the dummy vertical semiconductor pattern and the substrate; and
   a contact pattern extending from a bottom portion of the dummy vertical semiconductor pattern and penetrating a portion of the dummy data storage pattern to electrically connect to the substrate.

19. The 3D semiconductor memory device of claim 18, wherein the contact pattern is in contact with the bottom portion of the dummy vertical semiconductor pattern.

20. The 3D semiconductor memory device of claim 18, further comprising:
   a dummy insulating pattern on the contact pattern and on an inner sidewall of the dummy vertical semiconductor pattern.

* * * * *